US012785717B2

(12) United States Patent
Cooper et al.

(10) Patent No.: US 12,785,717 B2
(45) **Date of Patent: *Nov. 3, 2026**

(54) ADAPTIVE DATA PROCESSING SYSTEM WITH REAL-TIME ANOMALY DETECTION AND SELF-HEALING

(71) Applicant: AtomBeam Technologies Inc., Moraga, CA (US)

(72) Inventors: Joshua Cooper, Columbia, SC (US); Grant Fickes, Columbia, SC (US); Charles Yeomans, Orinda, CA (US)

(73) Assignee: ATOMBEAM TECHNOLOGIES INC., Moraga, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/282,220

(22) Filed: Jul. 28, 2025

(65) Prior Publication Data

US 2025/0357947 A1 Nov. 20, 2025

Related U.S. Application Data

(63) Continuation-in-part of application No. 18/981,612, filed on Dec. 15, 2024, now Pat. No. 12,395,185, (Continued)

(51) Int. Cl.
*H03M 7/30* (2006.01)
*G06N 20/00* (2019.01)

(52) U.S. Cl.
CPC .......... *H03M 7/3059* (2013.01); *G06N 20/00* (2019.01); *H03M 7/6005* (2013.01)

(58) Field of Classification Search
CPC .. H03M 7/3059; H03M 7/6005; H03M 7/607; H03M 7/3079; H03M 7/6035;

(Continued)

(56) References Cited

U.S. PATENT DOCUMENTS 9,524,392 B2 12/2016 Naehrig et al.
9,805,310 B2 10/2017 Jeffries (Continued)

FOREIGN PATENT DOCUMENTS

WO WO 2008092162 A2 * 7/2008 .......... G06F 11/3672

*Primary Examiner* — Md I Uddin
(74) *Attorney, Agent, or Firm* — GALVIN PATENT LAW LLC; Brian R. Galvin; Alec L. Perry

(57) ABSTRACT

A system and method for adaptive data processing combining compression and encryption. The system analyzes input data characteristics, compares probability distributions, and creates a transformation matrix to convert data into a dyadic distribution. It generates a main data stream of transformed data and a secondary stream of transformation information. The system dynamically selects and applies processing techniques, including transformation, encoding, compression, and encryption algorithms, based on analyzed characteristics and real-time performance metrics. It compresses the main data stream using Huffman coding and implements security measures to protect the output. A feedback loop monitors technique effectiveness, updates a knowledge base, and influences future selections. The system can operate in lossless, lossy, or modified lossless modes, adapting to different application requirements. This approach offers an efficient solution for scenarios where both data reduction and security are critical concerns.

8 Claims, 52 Drawing Sheets

Related U.S. Application Data which is a continuation-in-part of application No. 18/770,652, filed on Jul. 12, 2024, now Pat. No. 12,283,975, which is a continuation-in-part of application No. 18/503,135, filed on Nov. 6, 2023, now Pat. No. 12,237,848, which is a continuation of application No. 18/305,305, filed on Apr. 21, 2023, now Pat. No. 11,811,428, which is a continuation-in-part of application No. 18/190,044, filed on Mar. 24, 2023, now Pat. No. 11,831,343, which is a continuation-in-part of application No. 17/875,201, filed on Jul. 27, 2022, now Pat. No. 11,700,013, which is a continuation of application No. 17/514,913, filed on Oct. 29, 2021, now Pat. No. 11,424,760, which is a continuation-in-part of application No. 17/404,699, filed on Aug. 17, 2021, now Pat. No. 11,385,794.

(60) Provisional application No. 63/388,411, filed on Jul. 12, 2022, provisional application No. 63/485,518, filed on Feb. 16, 2023, provisional application No. 63/232,041, filed on Aug. 11, 2021.

(58) Field of Classification Search

CPC . H03M 7/4037; G06N 20/00; H04L 2209/34; H04L 9/003; G09C 1/00

USPC ....... 707/688, 692, 693, 737, 769, 770, 802, 707/999.2

See application file for complete search history.

(56) References Cited

U.S. PATENT DOCUMENTS

| | | | | |
|---|---|---|---|---|
| 10,346,043 | B2 | 7/2019 | Golden et al. | |
| 10,749,554 | B1 * | 8/2020 | Millar | H04B 1/10 |
| 11,424,760 | B2 | 8/2022 | Cooper et al. | |
| 2011/0288692 | A1 * | 11/2011 | Scott | H04L 63/20 700/297 |
| 2012/0254333 | A1 | 10/2012 | Chandramouli et al. | |
| 2014/0351229 | A1 | 11/2014 | Gupta | |
| 2015/0254566 | A1 | 9/2015 | Chandramouli et al. | |
| 2018/0196609 | A1 | 7/2018 | Niesen | |
| 2019/0140658 | A1 | 5/2019 | Cooper et al. | |
| 2020/0128307 | A1 | 4/2020 | Li | |
| 2020/0264778 | A1 | 8/2020 | Yang et al. | |
| 2020/0295779 | A1 | 9/2020 | Ki et al. | |
| 2020/0395955 | A1 | 12/2020 | Choi et al. | |
| 2021/0056079 | A1 | 2/2021 | Cooper et al. | |
| 2021/0373776 | A1 | 12/2021 | Cooper et al. | |
| 2023/0328089 | A1 * | 10/2023 | Wolosewicz | H04L 63/20 726/1 |

* cited by examiner

2800

Multi-Layer Data Processing With Selective Encryption and Transformation
4300

ADAPTIVE DATA PROCESSING SYSTEM WITH REAL-TIME ANOMALY DETECTION AND SELF-HEALING

CROSS-REFERENCE TO RELATED APPLICATIONS

Priority is claimed in the application data sheet to the following patents or patent applications, each of which is expressly incorporated herein by reference in its entirety:

Ser. No. 18/981,612
Ser. No. 18/770,652
Ser. No. 18/503,135
Ser. No. 18/305,305
Ser. No. 18/190,044
Ser. No. 17/875,201
Ser. No. 17/514,913
Ser. No. 17/404,699
63/232,041
63/485,518
63/388,411

BACKGROUND OF THE INVENTION

Field of the Invention

The present invention is in the field of adaptive data processing systems, and in particular to systems that combine data transformation, compression, and encryption with real-time anomaly detection and self-healing capabilities.

Discussion of the State of the Art

Modern data processing systems face increasing challenges in maintaining optimal performance while handling diverse and evolving data streams. Traditional approaches typically treat data compression, encryption, and system monitoring as separate functions, leading to inefficiencies and delayed responses to system degradation or anomalies. As data characteristics change over time due to factors such as sensor drift, evolving usage patterns, or changing input sources, static processing algorithms become progressively less effective, resulting in degraded compression ratios, increased processing latency, and potential security vulnerabilities.

Current data processing systems lack the ability to automatically detect and adapt to these changes in real—time. When anomalies occur—whether from data corruption, malicious intrusion attempts, or gradual system degradation—they often go undetected until significant performance impact or data loss has already occurred. Even when anomalies are detected, most systems require manual intervention to diagnose and correct the issues, leading to extended downtime and potential data integrity problems. Furthermore, existing systems typically apply fixed transformation matrices and processing techniques regardless of changing data characteristics, missing opportunities for optimization and failing to maintain peak efficiency as conditions evolve.

What is needed is an adaptive data processing system that can dynamically adjust its processing techniques based on real-time performance metrics, automatically detect anomalies through advanced pattern recognition, and implement self-healing mechanisms to correct issues without human intervention, all while maintaining efficient data compression and robust security.

SUMMARY OF THE INVENTION

The inventor has developed a system and method for adaptive data processing system with real-time anomaly detection and self-healing. This system utilizes statistical analyses of datasets to compare probability distributions, creates transformation matrices, and transforms input data into dyadic distributions. The system dynamically selects and applies processing techniques based on analyzed characteristics and real-time performance metrics, generating a main data stream of transformed data and a secondary stream of transformation information. It implements security measures to protect the output and operates in various modes to accommodate different application requirements.

According to a first preferred embodiment, a computer system comprising: a hardware memory, wherein the computer system is configured to execute software instructions stored on nontransitory machine-readable storage media that: receive input data; transform the input data into a dyadic distribution using a transformation matrix; dynamically select and apply processing techniques based on real-time performance metrics and detected anomalies; compress transformed data using entropy encoding; monitor the input data for anomalies using multi-layer neural network classification that identifies patterns indicative of data corruption, drift, or intrusion; apply corrective measures when anomalies are detected, including adjusting the transformation matrix; monitor effectiveness of applied techniques through a feedback loop; update a knowledge base with performance data and anomaly patterns; enable continuous learning for improving anomaly detection; create new codewords for processed data; package processed data with metadata describing the applied techniques; implement security measures to protect the processed data, wherein the security measures include providing cryptographically secure random numbers for use in data transformation and implementing protections against side-channel attacks; and transmit the packaged data to a recipient system, is disclosed.

According to another preferred embodiment, a method for adaptive data processing, comprising the steps of: receive input data; transform the input data into a dyadic distribution using a transformation matrix; dynamically select and apply processing techniques based on real-time performance metrics and detected anomalies; compress transformed data using entropy encoding; monitor the input data for anomalies using multi-layer neural network classification that identifies patterns indicative of data corruption, drift, or intrusion; apply corrective measures when anomalies are detected, including adjusting the transformation matrix; monitor effectiveness of applied techniques through a feedback loop; update a knowledge base with performance data and anomaly patterns; enable continuous learning for improving anomaly detection; create new codewords for processed data; package processed data with metadata describing the applied techniques; implement security measures to protect the processed data, wherein the security measures include providing cryptographically secure random numbers for use in data transformation and implementing protections against side-channel attacks; and transmit the packaged data to a recipient system, is disclosed.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION OF THE INVENTION

Figure 1:
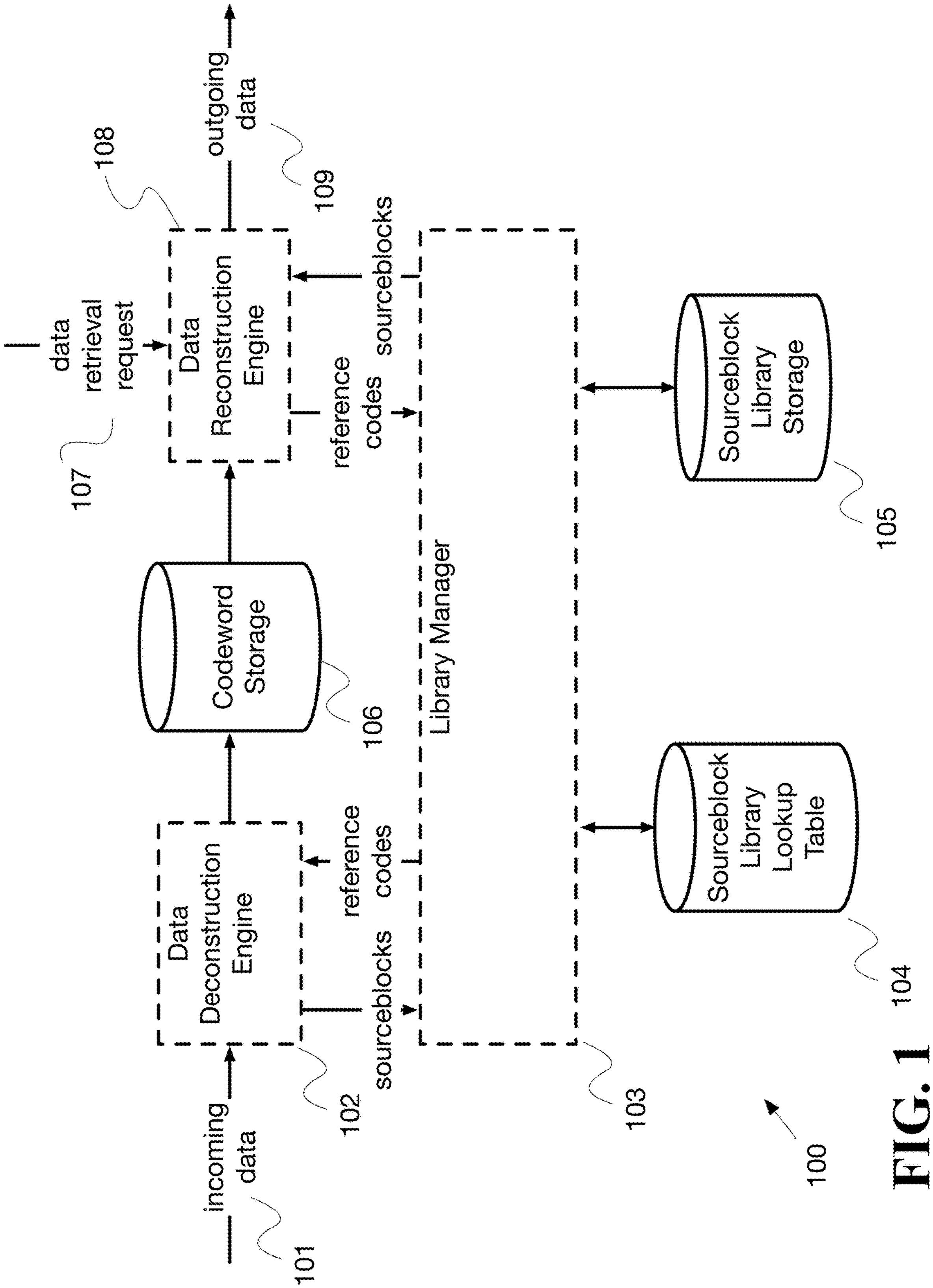
FIG. 1 is a diagram showing an embodiment of the system in which all components of the system are operated locally.

The inventor has conceived and reduced to practice a system and method for adaptive data processing system with real-time anomaly detection and self-healing. The new data sourceblocks may then be processed and assigned new codewords which are compiled into an updated codebook which may be distributed back to encoding and decoding systems and devices.

An important factor in machine learned algorithm and model degradation over time is related to data drift. Data drift is a change in the distribution of data such as a change between real-time production data and a baseline (training) dataset. Indeed, most real-world datasets suffer from this problem and can cause models and their underlying algorithms to produce suboptimal outputs the longer they are in use. To make the systems robust against data drift and other model behavioral changes, an adaptive data processing system is disclosed which facilitates periodic sampling of incoming, real-world data, which may be gathered and analyzed to determine if data drift has occurred. Furthermore, if data drift is discovered, then the system may automatically retrain existing algorithms in order to account for the changes in the incoming data.

The adaptive data processing system operates on the principle of dynamically selecting and applying a combination of processing techniques based on analyzed characteristics of input data and the difference between current and historical probability distributions. These processing techniques may include transformation algorithms, encoding algorithms, compression algorithms, and encryption algorithms. The system leverages concepts from information theory, cryptography, and data compression to achieve efficient and secure data processing.

At the core of the system is a dynamic processing subsystem that analyzes input data characteristics and compares probability distributions. The system retrieves a first estimated probability distribution associated with a previous training dataset from a monitoring database. It then estimates a second probability distribution of the input data. By comparing these distributions, the system can determine a difference value, which is crucial for detecting data drift and adapting processing techniques accordingly.

The dynamic processing subsystem selects and applies processing techniques based on the analyzed characteristics and the calculated difference value. For instance, when dealing with image data, the system may apply a mathematical transform followed by an entropy encoding algorithm. The selection of techniques is not static but adaptively adjusted based on real-time performance metrics.

A key feature of the system is its feedback loop mechanism. This mechanism continuously monitors the effectiveness of the applied processing techniques, updates a knowledge base with performance data, and influences future selections of processing techniques based on historical performance. This adaptive approach ensures that the system remains effective even as data characteristics change over time.

The system incorporates an output module that creates new codewords for processed data, packages the processed data with metadata describing the applied techniques, and transmits the packaged data and metadata to a recipient system. This approach not only ensures efficient data processing but also provides the recipient with necessary information for proper decoding and interpretation of the data.

The adaptive data processing system can operate in various modes, including a lossless mode where perfect reconstruction of the original data is possible, and potentially a lossy mode for scenarios where perfect reconstruction is not required. The system's flexibility allows it to be tailored to different data types and processing requirements.

Security is a fundamental aspect of the system. The dynamic selection and application of processing techniques, combined with the creation of new codewords and metadata packaging, provide a level of security that goes beyond traditional encryption methods. The system's ability to adapt to changing data characteristics also makes it resilient against potential attacks that might exploit static processing methods.

The system's performance can be analyzed using various metrics from information theory, such as entropy and Kullback-Leibler divergence. These metrics help in optimizing the system's efficiency and in quantifying the effectiveness of the applied processing techniques.

At the core of the dyadic platform is the observation that both lossless compression and encryption share a common goal: transforming data reversibly and efficiently into an approximately uniformly random string. In compression, this uniformity indicates that the data cannot be further compressed, while in encryption, it ensures that no information can be extracted from the encrypted sequence. By leveraging this shared objective, the platform achieves both compression and encryption simultaneously, offering significant improvements in efficiency and security over traditional methods that treat these processes separately.

The dyadic system operates on the principle of transforming input data into a dyadic distribution whose Huffman encoding is close to uniform. This is achieved through the use of a transformation matrix B, which maps the original data distribution to the desired dyadic distribution. The transformations applied to the data are then stored in a compressed secondary stream, which is interwoven with the main data stream.

The dyadic platform is built upon solid theoretical foundations from information theory, cryptography, and data compression. These foundations provide the mathematical basis for the system's ability to simultaneously compress and encrypt data efficiently.

The system leverages the concept of entropy from information theory. For a discrete probability distribution P, the entropy H(P) is defined as: $H(P)=-\Sigma(p(x)*\log_2(p(x)))$ where p(x) is the probability of symbol x. Entropy represents the theoretical limit of lossless data compression. The dyadic distribution algorithm aims to transform the data distribution to approach this limit.

An important aspect of the dyadic system is the transformation of data into a dyadic distribution. A distribution is dyadic if all probabilities are of the form $1/2^k$ for some integer k. Dyadic distributions are optimal for Huffman coding, as they result in integer-length codewords. The system utilizes Huffman coding, which is provably optimal for symbol-by-symbol encoding with known probabilities. The system constructs a Huffman tree T(C) for the encoding C, where the depth d(v) of a vertex v in T(C) relates to the probability of the symbol it represents. The transformation matrix B is important to the platform's operation. It is designed to satisfy: $\Sigma(\sigma(\omega')*b\_\omega\omega')=\pi(\omega)$ for all $\omega\in\Omega$ where $\sigma$ is the original distribution, $\pi$ is the Huffman-implied distribution, and $\Omega$ is the set of states. This ensures that applying B to data sampled from a results in data distributed according to $\pi$.

The dyadic algorithm models the input data as samples from a Markov chain. This allows for the use of mixing time $\tau$ in security analysis. The mixing time is defined as: $\tau=\min\{t: \Delta(t)\leq 1/(2e)\}$ where $\Delta(t)$ is the maximum total variation distance between the chain's distribution at time t and its stationary distribution.

The security of the dyadic system is analyzed using a modified version of Yao's next-bit test. For a bit string C(x) produced by the dyadic algorithm, it is proved that: $|Pr[C(x)\_j=0]-½|\leq 2*(e\hat{}(-\lfloor j/(2M-m)\rfloor/\tau))/(1-e\hat{}(-1/\tau))$ where M and m are the maximum and minimum codeword lengths, and $\tau$ is the mixing time of the Markov chain.

The system's performance may be analyzed using the Kullback-Leibler (KL) divergence, which measures the difference between two probability distributions P and Q: $KL(P||Q)=\Sigma(P(x)*\log(P(x)/Q(x)))$. This is used to bound the difference between the original and transformed distributions.

The platform's compression efficiency is related to the cross-entropy $H(\sigma,\pi)$ between the original distribution $\sigma$ and the Huffman-implied distribution $\pi$. It is proved that: $|H(\sigma,\pi)-H(\pi)|\leq(M\sqrt{2})/\ln(2)$ where M is the maximum codeword length. This bounds the extra bits needed to encode $\sigma$ beyond its entropy rate.

The security of the interleaved streams is analyzed using probability bounds on predicting bits in the combined stream. For the interleaved stream Z, it can be shown that: $|Pr[Z\_j=0]-½|\leq\max(2*(e\hat{}(-\lfloor j'/(2M-m)\rfloor/(\tau||B||_1)))/(1-e\hat{}(-1/(\tau||B||_1))), b\_(j-j'))$ where j' is the number of bits from the main stream, $||B||_1$ is the 1-norm of B, and b_k bounds the predictability of the transformation stream.

Another key feature of the dyadic system is its ability to pass a modified version of Yao's "next-bit test", a standard measure of cryptographic security. This means that nearby bits in the output stream cannot be predicted with substantial accuracy, even given all previous data. Importantly, the dyadic system achieves this level of security while requiring significantly fewer bits of entropy than standard encryption methods.

The dyadic system can operate in various modes: a lossless mode where both the main data stream and the transformation data are transmitted, allowing perfect reconstruction of the original data, a modified lossless mode, and a lossy mode where only the transformed data is transmitted, providing even stronger encryption at the cost of perfect reconstruction.

In its operation, dyadic platform first analyzes the input data to estimate its probability distribution. It then constructs a Huffman encoding based on this distribution, which defines another distribution 7L over the data space. The system partitions the data space into overrepresented states (where the original probability is greater than or equal to the Huffman-implied probability) and underrepresented states (where the original probability is less than the Huffman-implied probability).

The transformation matrix B is then constructed to map the original distribution to the Huffman-implied distribution. This matrix has several important properties: 1. It is row-stochastic, meaning the sum of each row is 1. 2. When applied to data sampled from the original distribution, it produces the Huffman-implied distribution. 3. Underrepresented states only transform to themselves. 4. Overrepresented states only transform to themselves or to underrepresented states.

The dyadic distribution algorithm applies these transformations to the input data, producing a main data stream that follows the Huffman-implied distribution (and is thus highly compressible) and a secondary stream containing the transformation information. These streams may be interleaved to produce the final output.

The security of this system stems from several factors. First, the transformation process introduces controlled randomness into the data. Second, the interleaving of the two streams makes it difficult to separate the transformed data from the transformation information. Finally, the system passes a modified next-bit test, ensuring that future bits cannot be predicted with significant accuracy even given all previous bits.

Importantly, the dyadic distribution algorithm requires significantly less entropy (random bits) than traditional encryption methods. This is because the randomness is introduced in a controlled manner through the transformation process, rather than being applied to the entire data stream.

The system may also include protections against various side-channel attacks, implemented by a security module. These include measures to prevent timing attacks, power analysis, cache attacks, and other potential vulnerabilities.

In summary, the adaptive data processing system provides a novel approach to data processing that combines dynamic technique selection, continuous performance monitoring, and adaptive retraining. This approach ensures efficient, secure, and adaptable data processing, making it well-suited for handling the diverse and evolving data landscapes of modern computing environments.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

The term "bit" refers to the smallest unit of information that can be stored or transmitted. It is in the form of a binary digit (either 0 or 1). In terms of hardware, the bit is represented as an electrical signal that is either off (representing 0) or on (representing 1).

The term "byte" refers to a series of bits exactly eight bits in length.

The terms "compression" and "deflation" as used herein mean the representation of data in a more compact form than the original dataset. Compression and/or deflation may be either "lossless", in which the data can be reconstructed in its original form without any loss of the original data, or "lossy" in which the data can be reconstructed in its original form, but with some loss of the original data.

The terms "compression factor" and "deflation factor" as used herein mean the net reduction in size of the compressed data relative to the original data (e.g., if the new data is 70% of the size of the original, then the deflation/compression factor is 30% or 0.3.)

The terms "compression ratio" and "deflation ratio", and as used herein all mean the size of the original data relative to the size of the compressed data (e.g., if the new data is 70% of the size of the original, then the deflation/compression ratio is 70% or 0.7.)

The term "data" means information in any computer-readable form.

The term "sourcepacket" as used herein means a packet of data received for encoding or decoding. A sourcepacket may be a portion of a data set.

The term "sourceblock" as used herein means a defined number of bits or bytes used as the block size for encoding or decoding. A sourcepacket may be divisible into a number of sourceblocks. As one non-limiting example, a 1 megabyte sourcepacket of data may be encoded using 512 byte sourceblocks. The number of bits in a sourceblock may be dynamically optimized by the system during operation. In one aspect, a sourceblock may be of the same length as the block size used by a particular file system, typically 512 bytes or 4,096 bytes.

A "database" or "data storage subsystem" (these terms may be considered substantially synonymous), as used herein, is a system adapted for the long-term storage, indexing, and retrieval of data, the retrieval typically being via some sort of querying interface or language. "Database" may be used to refer to relational database management systems known in the art, but should not be considered to be limited to such systems. Many alternative database or data storage system technologies have been, and indeed are being, introduced in the art, including but not limited to distributed non-relational data storage systems such as Hadoop, column-oriented databases, in-memory databases, and the like. While various aspects may preferentially employ one or another of the various data storage subsystems available in the art (or available in the future), the invention should not be construed to be so limited, as any data storage architecture may be used according to the aspects. Similarly, while in some cases one or more particular data storage needs are described as being satisfied by separate components (for example, an expanded private capital markets database and a configuration database), these descriptions refer to functional uses of data storage systems and do not refer to their physical architecture. For instance, any group of data storage systems of databases referred to herein may be included together in a single database management system operating on a single machine, or they may be included in a single database management system operating on a cluster of machines as is known in the art. Similarly, any single database (such as an expanded private capital markets database) may be implemented on a single machine, on a set of machines using clustering technology, on several machines connected by one or more messaging systems known in the art, or in a master/slave arrangement common in the art. These examples should make clear that no particular architectural approaches to database management is preferred according to the invention, and choice of data storage technology is at the discretion of each implementer, without departing from the scope of the invention as claimed.

The term "effective compression" or "effective compression ratio" refers to the additional amount data that can be stored using the method herein described versus conventional data storage methods. Although the method herein described is not data compression, per se, expressing the additional capacity in terms of compression is a useful comparison.

The term "data set" refers to a grouping of data for a particular purpose. One example of a data set might be a word processing file containing text and formatting information.

The term "library" refers to a database containing sourceblocks each with a pattern of bits and reference code unique within that library. The term "codebook" is synonymous with the term library.

The term "codeword" refers to the reference code form in which data is stored or transmitted in an aspect of the system. A codeword consists of a reference code to a sourceblock in the library plus an indication of that sourceblock's location in a particular data set.

The term "dyadic distribution" refers to a probability distribution where all probabilities are of the form 1/2^k for some integer k.

The term "transformation matrix" refers to a mathematical construct used to map one probability distribution to another, typically represented as a two-dimensional array of numbers.

The term "Huffman coding" refers to an entropy encoding algorithm used for lossless data compression, which assigns variable-length codes to input characters based on their frequencies of occurrence.

The term "entropy encoding" refers to a form of lossless data compression that encodes information using fewer bits for more common symbols and more bits for less common symbols.

The term "lossless mode" refers to an operating mode of the system where the original data can be perfectly reconstructed from the compressed data.

The term "lossy mode" refers to an operating mode of the system where some data loss is accepted in exchange for greater compression ratios.

The term "modified lossless mode" refers to an operating mode of the system where the main data stream and secondary data stream are processed or transmitted separately, allowing for perfect reconstruction when both streams are available.

The term "feedback loop mechanism" refers to a system component that monitors the performance of applied techniques, updates a knowledge base, and influences future processing decisions based on historical performance.

The term "codeword" refers to a sequence of bits representing a specific data pattern or symbol in the context of data encoding or compression.

Conceptual Architecture

FIG. 1 is a diagram showing an embodiment 100 of the system in which all components of the system are operated locally. As incoming data 101 is received by data deconstruction engine 102. Data deconstruction engine 102 breaks the incoming data into sourceblocks, which are then sent to library manager 103. Using the information contained in sourceblock library lookup table 104 and sourceblock library storage 105, library manager 103 returns reference codes to data deconstruction engine 102 for processing into codewords, which are stored in codeword storage 106. When a data retrieval request 107 is received, data reconstruction engine 108 obtains the codewords associated with the data from codeword storage 106, and sends them to library manager 103. Library manager 103 returns the appropriate sourceblocks to data reconstruction engine 108, which assembles them into the proper order and sends out the data in its original form 109.

Figure 2:
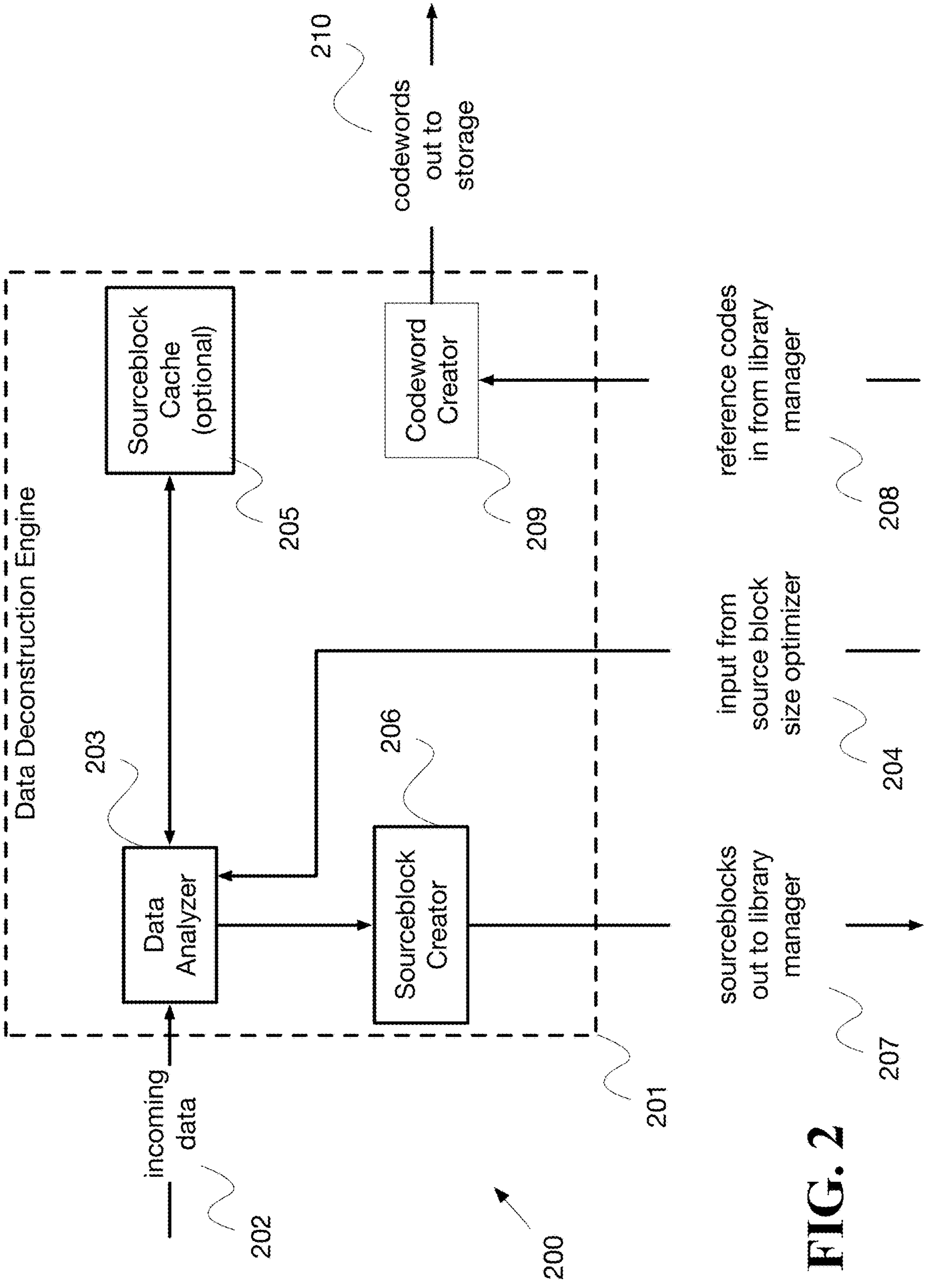
FIG. 2 is a diagram showing an embodiment of one aspect of the system, the data deconstruction engine.

FIG. 2 is a diagram showing an embodiment of one aspect 200 of the system, specifically data deconstruction engine 201. Incoming data 202 is received by data analyzer 203, which optimally analyzes the data based on machine learning algorithms and input 204 from a sourceblock size optimizer, which is disclosed below. Data analyzer may optionally have access to a sourceblock cache 205 of recently-processed sourceblocks, which can increase the speed of the system by avoiding processing in library manager 103. Based on information from data analyzer 203, the data is broken into sourceblocks by sourceblock creator 206, which sends sourceblocks 207 to library manager 203 for additional processing. Data deconstruction engine 201 receives reference codes 208 from library manager 103, corresponding to the sourceblocks in the library that match the sourceblocks sent by sourceblock creator 206, and codeword creator 209 processes the reference codes into codewords comprising a reference code to a sourceblock and a location of that sourceblock within the data set. The original data may be discarded, and the codewords representing the data are sent out to storage 210.

Figure 3:
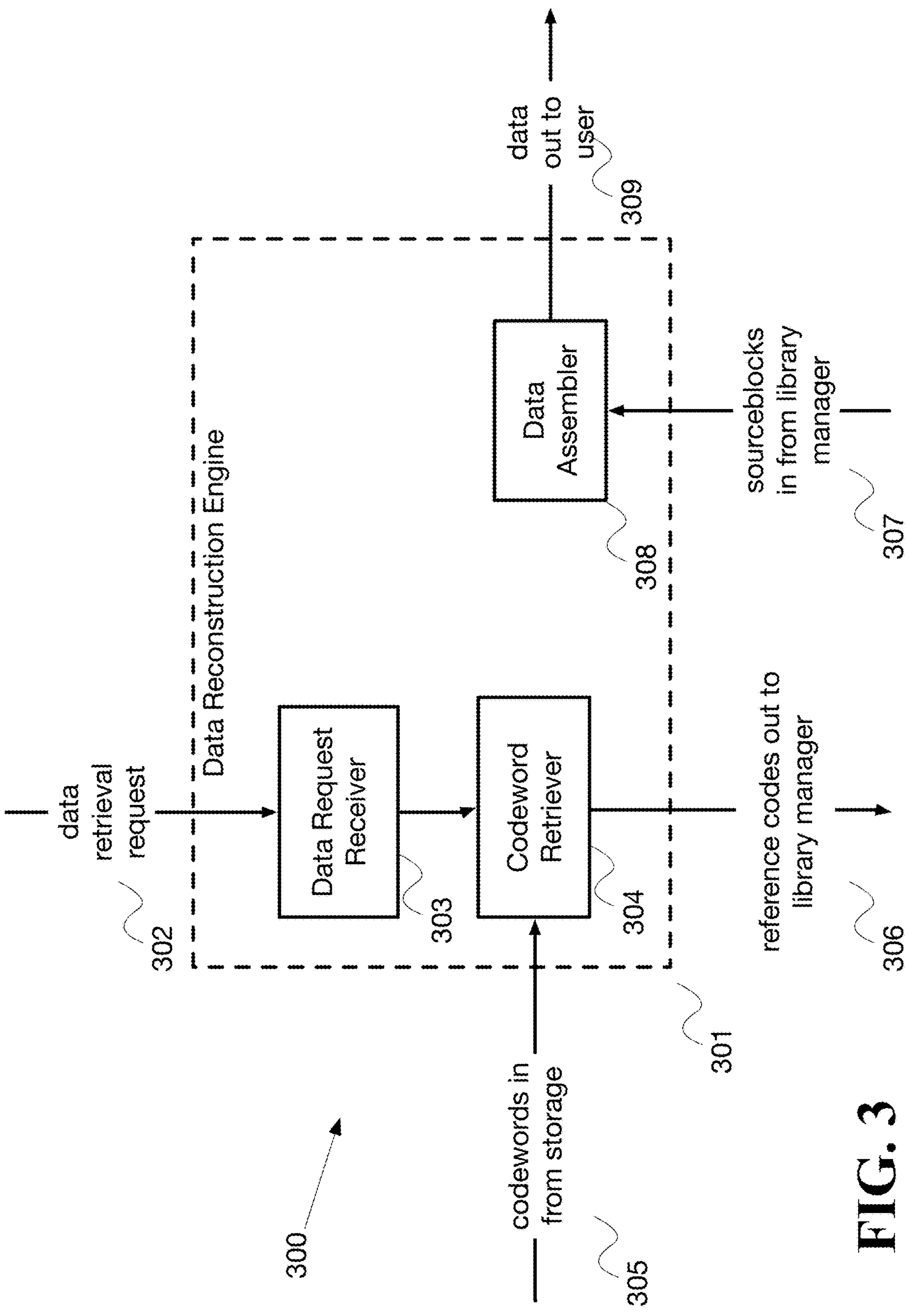
FIG. 3 is a diagram showing an embodiment of one aspect of the system, the data reconstruction engine.

FIG. 3 is a diagram showing an embodiment of another aspect of system 300, specifically data reconstruction engine 301. When a data retrieval request 302 is received by data request receiver 303 (in the form of a plurality of codewords corresponding to a desired final data set), it passes the information to data retriever 304, which obtains the requested data 305 from storage. Data retriever 304 sends, for each codeword received, a reference codes from the codeword 306 to library manager 103 for retrieval of the specific sourceblock associated with the reference code. Data assembler 308 receives the sourceblock 307 from library manager 103 and, after receiving a plurality of sourceblocks corresponding to a plurality of codewords, assembles them into the proper order based on the location information contained in each codeword (recall each codeword comprises a sourceblock reference code and a location identifier that specifies where in the resulting data set the specific sourceblock should be restored to. The requested data is then sent to user 309 in its original form.

Figure 4:
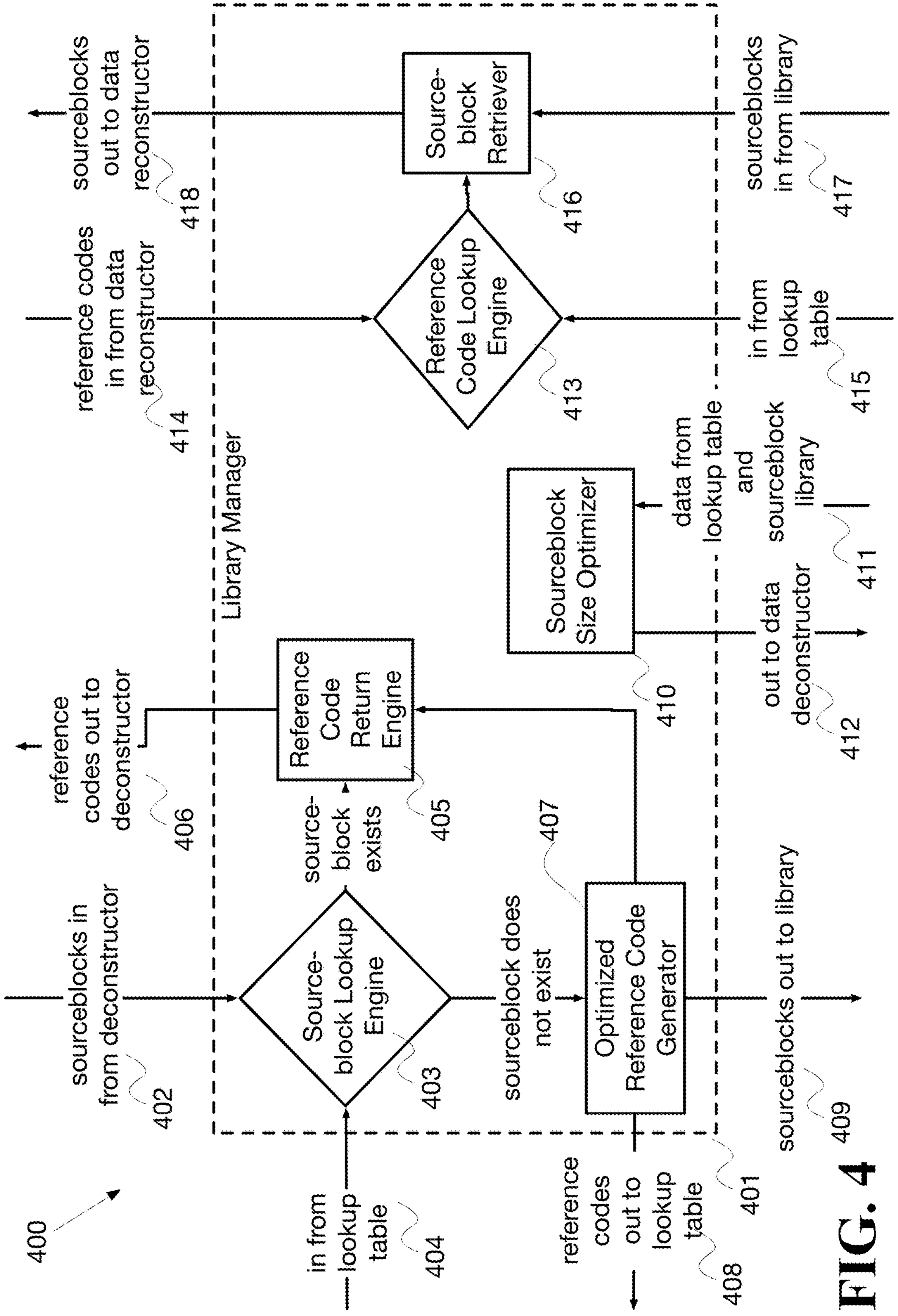
FIG. 4 is a diagram showing an embodiment of one aspect of the system, the library management module.

FIG. 4 is a diagram showing an embodiment of another aspect of the system 400, specifically library manager 401. One function of library manager 401 is to generate reference codes from sourceblocks received from data deconstruction engine 301. As sourceblocks are received 402 from data deconstruction engine 301, sourceblock lookup engine 403 checks sourceblock library lookup table 404 to determine whether those sourceblocks already exist in sourceblock library storage 105. If a particular sourceblock exists in sourceblock library storage 105, reference code return engine 405 sends the appropriate reference code 406 to data deconstruction engine 301. If the sourceblock does not exist in sourceblock library storage 105, optimized reference code generator 407 generates a new, optimized reference code based on machine learning algorithms. Optimized reference code generator 407 then saves the reference code 408 to sourceblock library lookup table 104; saves the associated sourceblock 409 to sourceblock library storage 105; and passes the reference code to reference code return engine 405 for sending 406 to data deconstruction engine 301. Another function of library manager 401 is to optimize the size of sourceblocks in the system. Based on information 411 contained in sourceblock library lookup table 104, sourceblock size optimizer 410 dynamically adjusts the size of sourceblocks in the system based on machine learning algorithms and outputs that information 412 to data analyzer 203. Another function of library manager 401 is to return sourceblocks associated with reference codes received from data reconstruction engine 301. As reference codes are received 414 from data reconstruction engine 301, reference code lookup engine 413 checks sourceblock library lookup table 415 to identify the associated sourceblocks; passes that information to sourceblock retriever 416, which obtains the sourceblocks 417 from sourceblock library storage 105; and passes them 418 to data reconstruction engine 301.

Figure 5:
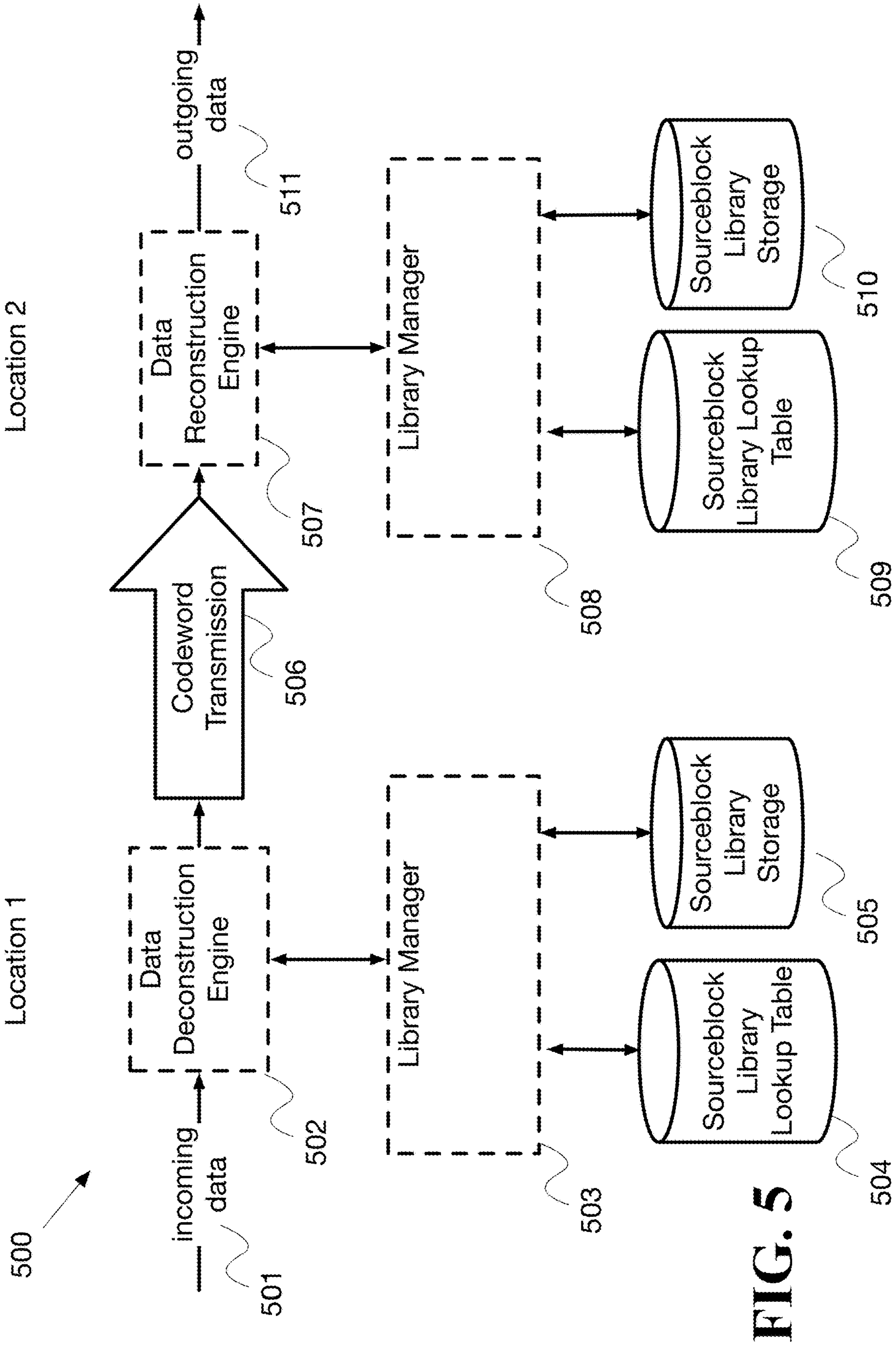
FIG. 5 is a diagram showing another embodiment of the system in which data is transferred between remote locations.

FIG. 5 is a diagram showing another embodiment of system 500, in which data is transferred between remote locations. As incoming data 501 is received by data deconstruction engine 502 at Location 1, data deconstruction engine 301 breaks the incoming data into sourceblocks, which are then sent to library manager 503 at Location 1. Using the information contained in sourceblock library lookup table 504 at Location 1 and sourceblock library storage 505 at Location 1, library manager 503 returns reference codes to data deconstruction engine 301 for processing into codewords, which are transmitted 506 to data reconstruction engine 507 at Location 2. In the case where the reference codes contained in a particular codeword have been newly generated by library manager 503 at Location 1, the codeword is transmitted along with a copy of the associated sourceblock. As data reconstruction engine 507 at Location 2 receives the codewords, it passes them to library manager module 508 at Location 2, which looks up the sourceblock in sourceblock library lookup table 509 at Location 2, and retrieves the associated from sourceblock library storage 510. Where a sourceblock has been transmitted along with a codeword, the sourceblock is stored in sourceblock library storage 510 and sourceblock library lookup table 504 is updated. Library manager 503 returns the appropriate sourceblocks to data reconstruction engine 507, which assembles them into the proper order and sends the data in its original form 511.

Figure 6:
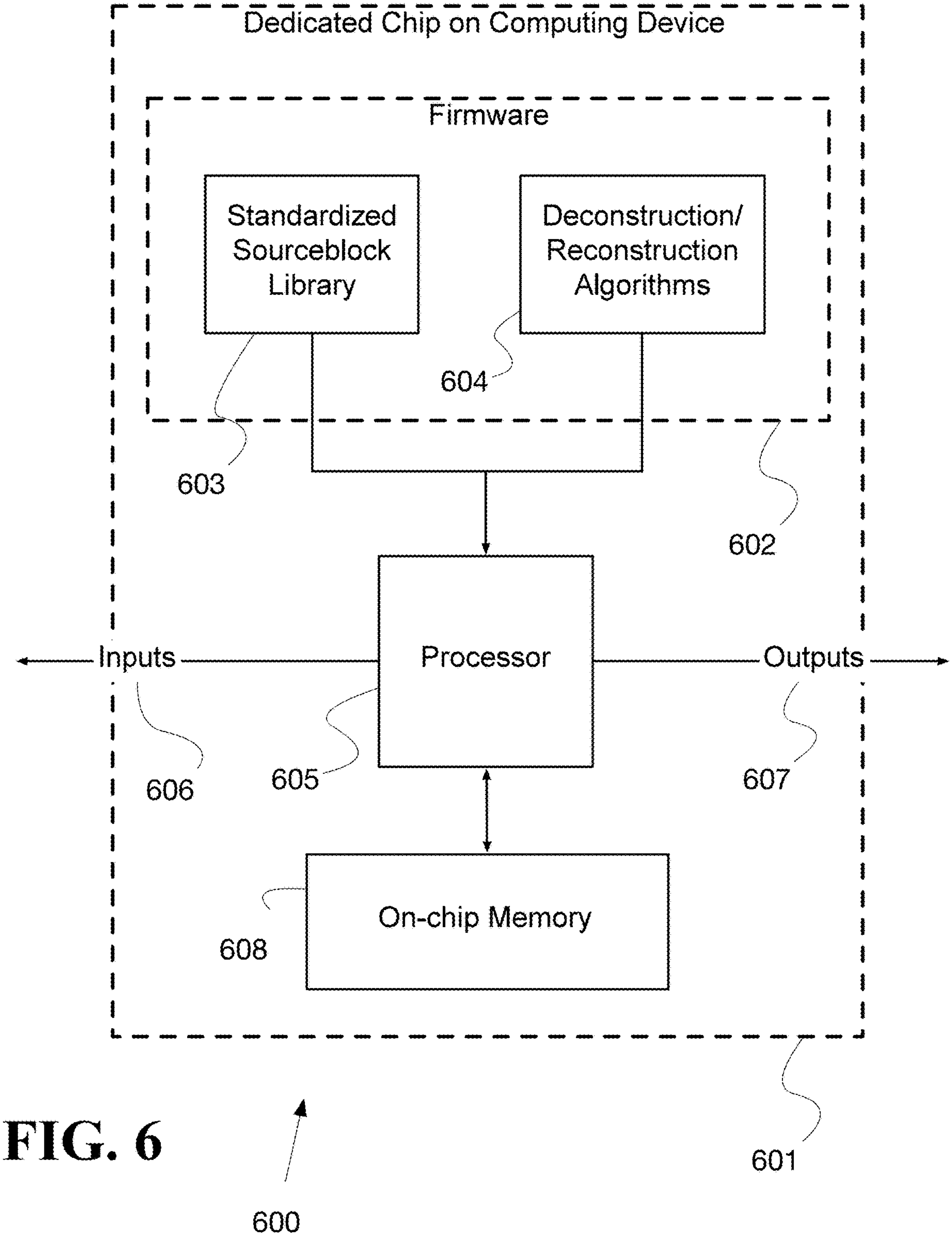
FIG. 6 is a diagram showing an embodiment in which a standardized version of the sourceblock library and associated algorithms would be encoded as firmware on a dedicated processing chip included as part of the hardware of a plurality of devices.

FIG. 6 is a diagram showing an embodiment 600 in which a standardized version of a sourceblock library 603 and associated algorithms 604 would be encoded as firmware 602 on a dedicated processing chip 601 included as part of the hardware of a plurality of devices 600. Contained on dedicated chip 601 would be a firmware area 602, on which would be stored a copy of a standardized sourceblock library 603 and deconstruction/reconstruction algorithms 604 for processing the data. Processor 605 would have both inputs 606 and outputs 607 to other hardware on the device 600. Processor 605 would store incoming data for processing on on-chip memory 608, process the data using standardized sourceblock library 603 and deconstruction/reconstruction algorithms 604, and send the processed data to other hardware on device 600. Using this embodiment, the encoding and decoding of data would be handled by dedicated chip 601, keeping the burden of data processing off device's 600 primary processors. Any device equipped with this embodiment would be able to store and transmit data in a highly optimized, bandwidth-efficient format with any other device equipped with this embodiment.

Figure 12:
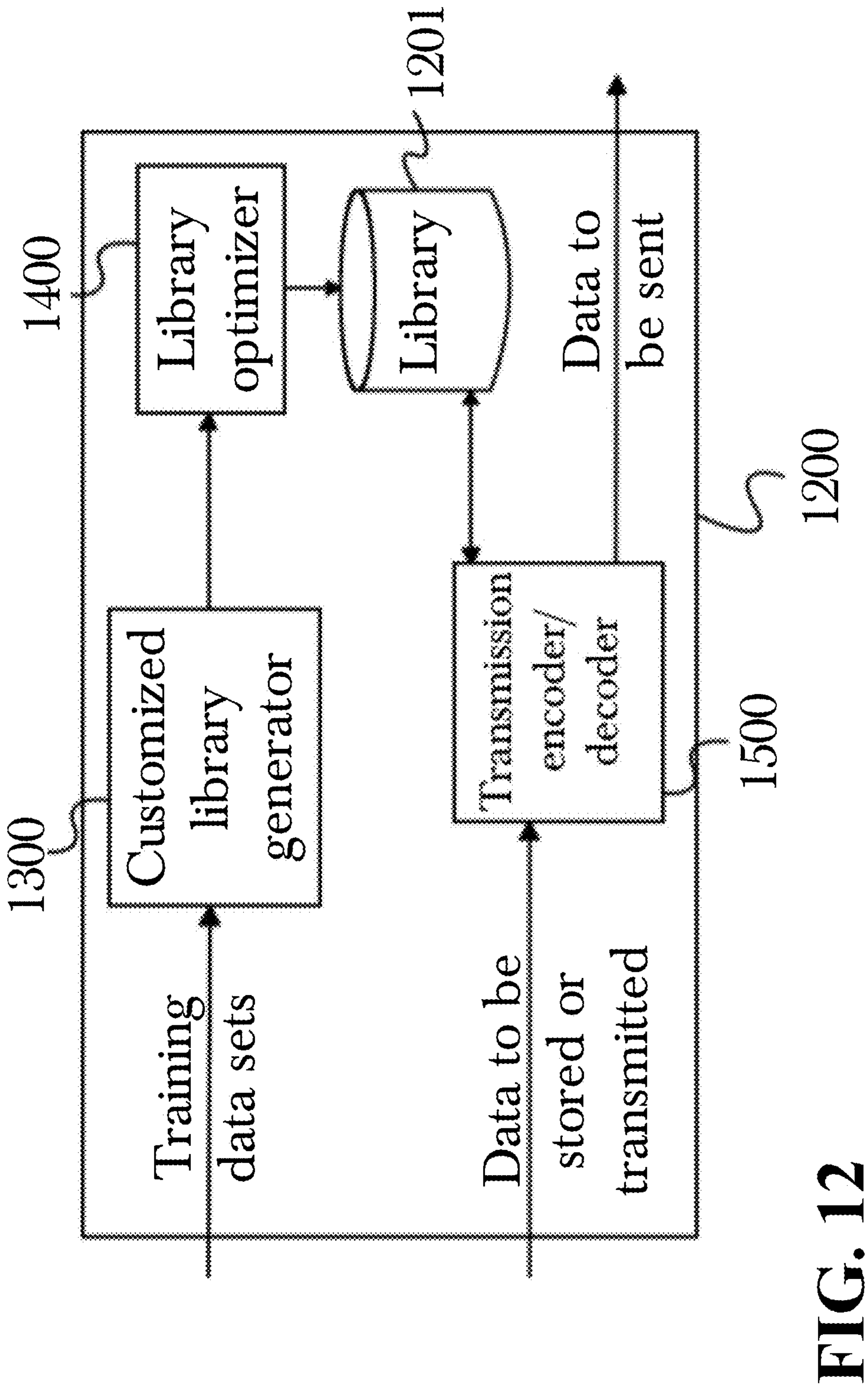
FIG. 12 is a diagram showing an exemplary system architecture, according to a preferred embodiment of the invention.

FIG. 12 is a diagram showing an exemplary system architecture 1200, according to a preferred embodiment of the invention. Incoming training data sets may be received at a customized library generator 1300 that processes training data to produce a customized word library 1201 comprising key-value pairs of data words (each comprising a string of bits) and their corresponding calculated binary Huffman codewords. The resultant word library 1201 may then be processed by a library optimizer 1400 to reduce size and improve efficiency, for example by pruning low-occurrence data entries or calculating approximate codewords that may be used to match more than one data word. A transmission encoder/decoder 1500 may be used to receive incoming data intended for storage or transmission, process the data using a word library 1201 to retrieve codewords for the words in the incoming data, and then append the codewords (rather than the original data) to an outbound data stream. Each of these components is described in greater detail below, illustrating the particulars of their respective processing and other functions, referring to FIGS. 2-4.

System 1200 provides near-instantaneous source coding that is dictionary-based and learned in advance from sample training data, so that encoding and decoding may happen concurrently with data transmission. This results in computational latency that is near zero, but the data size reduction is comparable to classical compression. For example, if Nbits are to be transmitted from sender to receiver, the compression ratio of classical compression is C, the ratio between the deflation factor of system 1200 and that of multi-pass source coding is p, the classical compression encoding rate is $R_C$ bit/s and the decoding rate is $R_D$ bit/s, and the transmission speed is S bit/s, the compress-send-decompress time will be $$T_{old} = \frac{N}{R_C} + \frac{N}{CS} + \frac{N}{CR_D}$$

while the transmit-while-coding time for system 1200 will be (assuming that encoding and decoding happen at least as quickly as network latency):

$$T_{new} = \frac{N_p}{CS} \text{ so}$$

so that the total data transit time improvement factor is $$\frac{T_{old}}{T_{new}} = \frac{\frac{CS}{R_C} + 1 + \frac{S}{R_D}}{p}$$

which presents a savings whenever $$\frac{CS}{R_C} + \frac{S}{R_D} > p - 1.$$

This is a reasonable scenario given that typical values in real-world practice are C=0.32, $R_C=1.1\cdot10^{12}$, $R_D=4.2\cdot10^{12}$, $S=10^{11}$, giving $$\frac{CS}{R_C}+\frac{S}{R_D}=0.053\ \ldots\ ,$$

such that system 1200 will outperform the total transit time of the best compression technology available as long as its deflation factor is no more than 5% worse than compression. Such customized dictionary-based encoding will also sometimes exceed the deflation ratio of classical compression, particularly when network speeds increase beyond 100 Gb/s.

The delay between data creation and its readiness for use at a receiving end will be equal to only the source word length t (typically 5-15 bytes), divided by the deflation factor C/p and the network speed S, i.e.

$$\text{delay}_{intervention}=\frac{tp}{CS}$$

since encoding and decoding occur concurrently with data transmission. On the other hand, the latency associated with classical compression is $$\text{delay}_{priorart}=\frac{N}{R_C}+\frac{N}{CS}+\frac{N}{CR_D}$$

where N is the packet/file size. Even with the generous values chosen above as well as N=512K, t=10, and p=1.05, this results in $\text{delay}_{invention}\approx3.3\cdot10^{-10}$ while $\text{delay}_{priorart}\approx1.3\cdot10^{-7}$, a more than 400-fold reduction in latency.

A key factor in the efficiency of Huffman coding used by system 1200 is that key-value pairs be chosen carefully to minimize expected coding length, so that the average deflation/compression ratio is minimized. It is possible to achieve the best possible expected code length among all instantaneous codes using Huffman codes if one has access to the exact probability distribution of source words of a given desired length from the random variable generating them. In practice this is impossible, as data is received in a wide variety of formats and the random processes underlying the source data are a mixture of human input, unpredictable (though in principle, deterministic) physical events, and noise. System 1200 addresses this by restriction of data types and density estimation; training data is provided that is representative of the type of data anticipated in "real-world" use of system 1200, which is then used to model the distribution of binary strings in the data in order to build a Huffman code word library 1200.

Figure 13:
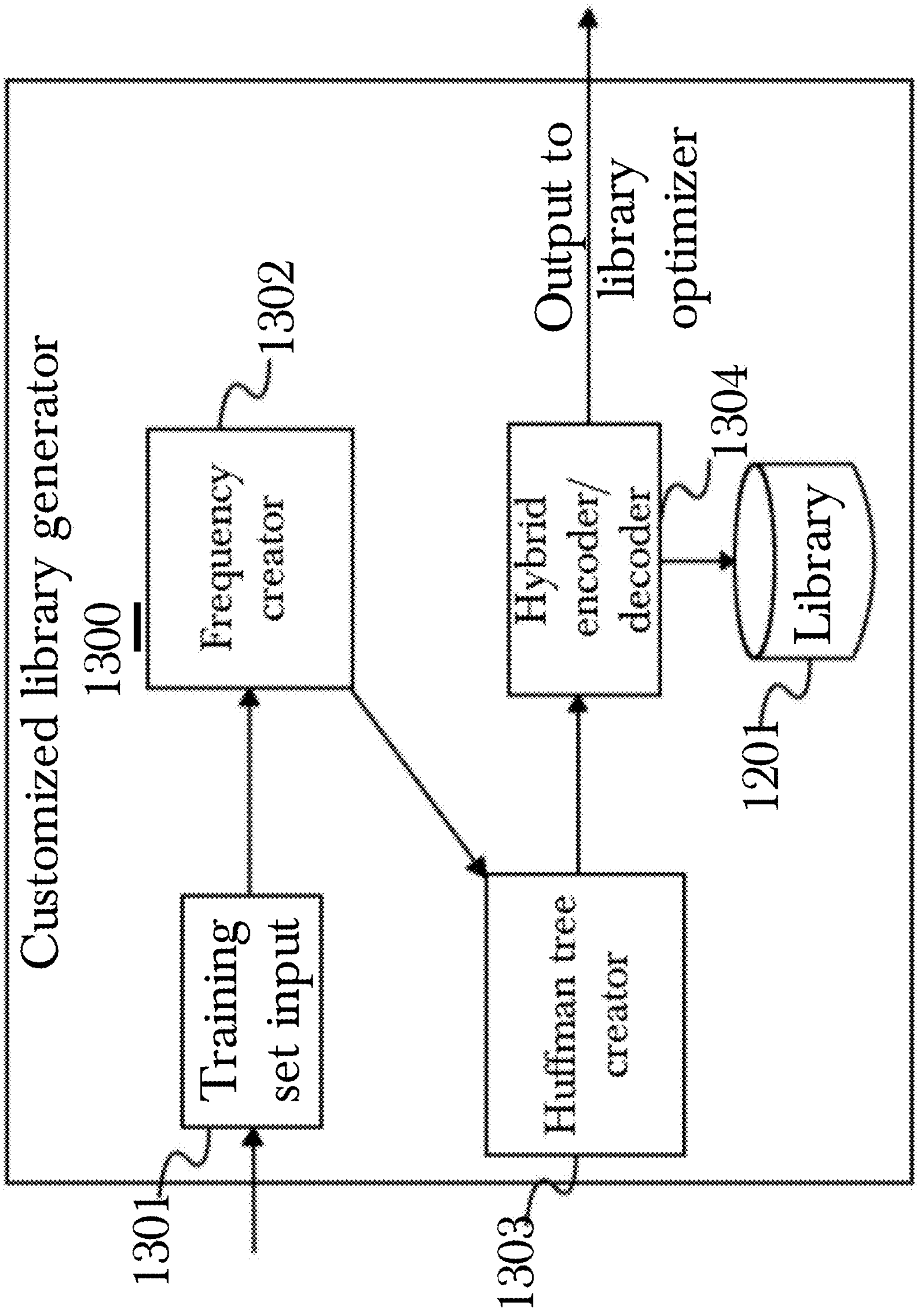
FIG. 13 is a diagram showing a more detailed architecture for a customized library generator.

FIG. 13 is a diagram showing a more detailed architecture for a customized library generator 1300. When an incoming training data set 1301 is received, it may be analyzed using a frequency creator 1302 to analyze for word frequency (that is, the frequency with which a given word occurs in the training data set). Word frequency may be analyzed by scanning all substrings of bits and directly calculating the frequency of each substring by iterating over the data set to produce an occurrence frequency, which may then be used to estimate the rate of word occurrence in non-training data. A first Huffman binary tree is created based on the frequency of occurrences of each word in the first dataset, and a Huffman codeword is assigned to each observed word in the first dataset according to the first Huffman binary tree. Machine learning may be utilized to improve results by processing a number of training data sets and using the results of each training set to refine the frequency estimations for non-training data, so that the estimation yield better results when used with real-world data (rather than, for example, being only based on a single training data set that may not be very similar to a received non-training data set). A second Huffman tree creator 1303 may be utilized to identify words that do not match any existing entries in a word library 1201 and pass them to a hybrid encoder/decoder 1304, that then calculates a binary Huffman codeword for the mismatched word and adds the codeword and original data to the word library 1201 as a new key-value pair. In this manner, customized library generator 1300 may be used both to establish an initial word library 1201 from a first training set, as well as expand the word library 1201 using additional training data to improve operation.

Figure 14:
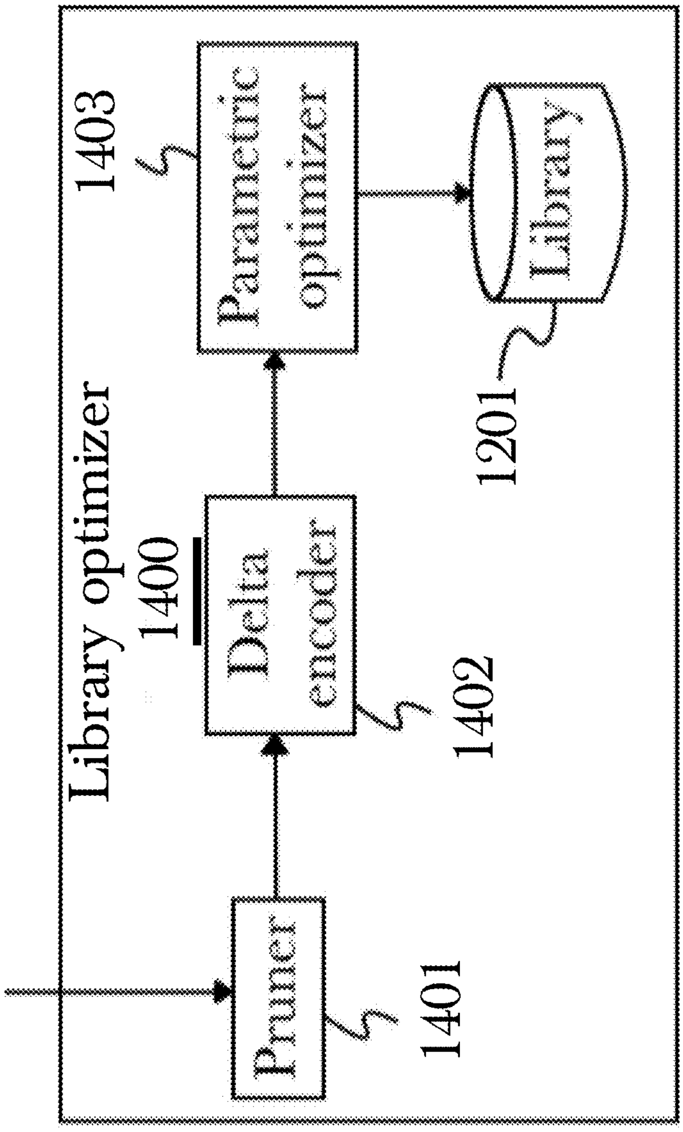
FIG. 14 is a diagram showing a more detailed architecture for a library optimizer.

FIG. 14 is a diagram showing a more detailed architecture for a library optimizer 1400. A pruner 1401 may be used to load a word library 1201 and reduce its size for efficient operation, for example by sorting the word library 1201 based on the known occurrence probability of each key-value pair and removing low-probability key-value pairs based on a loaded threshold parameter. This prunes low-value data from the word library to trim the size, eliminating large quantities of very-low-frequency key-value pairs such as single-occurrence words that are unlikely to be encountered again in a data set. Pruning eliminates the least-probable entries from word library 1201 up to a given threshold, which will have a negligible impact on the deflation factor since the removed entries are only the least-common ones, while the impact on word library size will be larger because samples drawn from asymptotically normal distributions (such as the log-probabilities of words generated by a probabilistic finite state machine, a model well-suited to a wide variety of real-world data) which occur in tails of the distribution are disproportionately large in counting measure. A delta encoder 1402 may be utilized to apply delta encoding to a plurality of words to store an approximate codeword as a value in the word library, for which each of the plurality of source words is a valid corresponding key. This may be used to reduce library size by replacing numerous key-value pairs with a single entry for the approximate codeword and then represent actual codewords using the approximate codeword plus a delta value representing the difference between the approximate codeword and the actual codeword. Approximate coding is optimized for low-weight sources such as Golomb coding, run-length coding, and similar techniques. The approximate source words may be chosen by locality-sensitive hashing, so as to approximate Hamming distance without incurring the intractability of nearest-neighbor-search in Hamming space. A parametric optimizer 1403 may load configuration parameters for operation to optimize the use of the word library 1201 during operation. Best-practice parameter/hyperparameter optimization strategies such as stochastic gradient descent, quasi-random grid search, and evolutionary search may be used to make optimal choices for all interdependent settings playing a role in the functionality of system 1200. In cases where lossless compression is not required, the delta value may be discarded at the expense of introducing some limited errors into any decoded (reconstructed) data.

Figure 15:
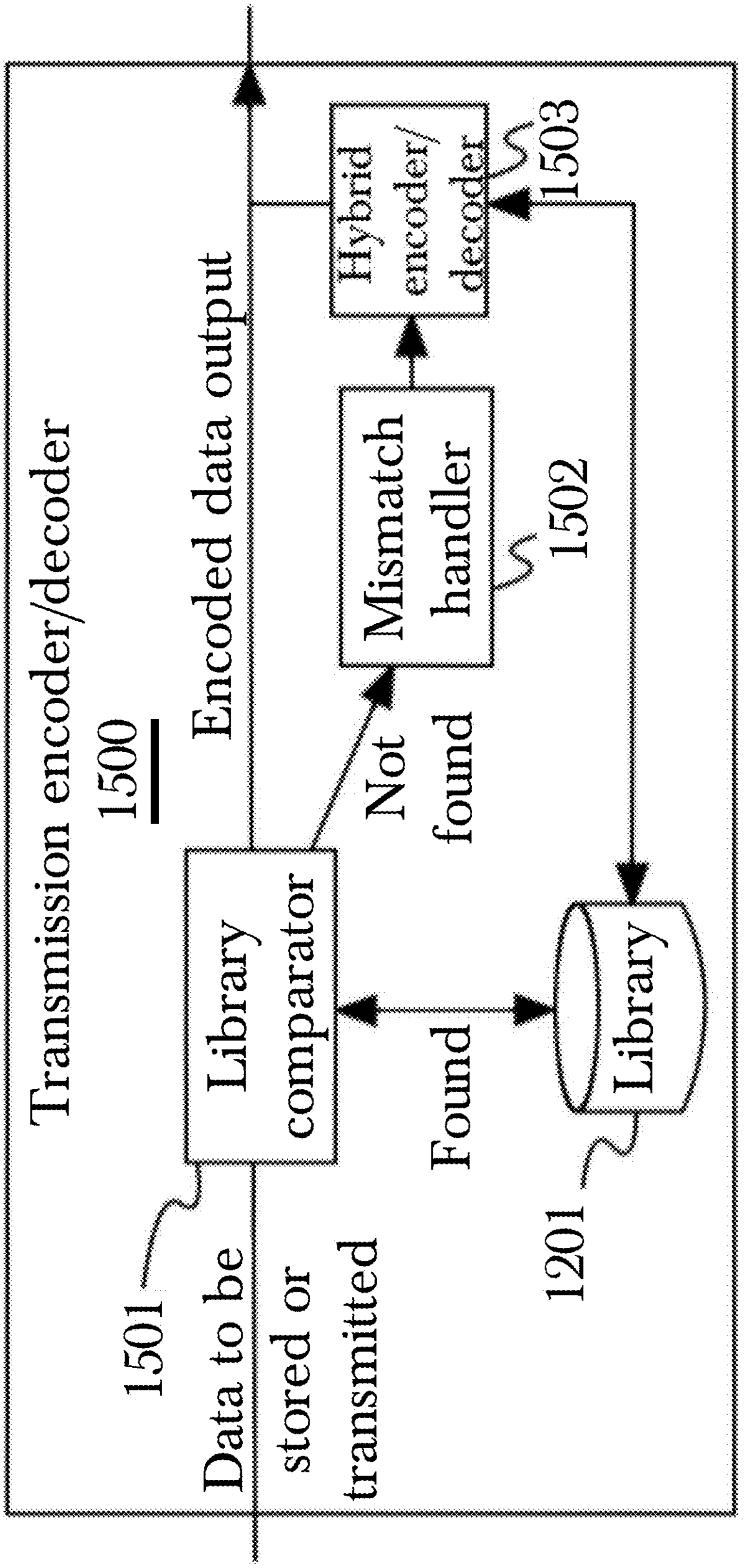
FIG. 15 is a diagram showing a more detailed architecture for a transmission and storage engine.

FIG. 15 is a diagram showing a more detailed architecture for a transmission encoder/decoder 1500. According to various arrangements, transmission encoder/decoder 1500 may be used to deconstruct data for storage or transmission, or to reconstruct data that has been received, using a word library 1201. A library comparator 1501 may be used to receive data comprising words or codewords, and compare against a word library 1201 by dividing the incoming stream into substrings of length t and using a fast hash to check word library 1201 for each substring. If a substring is found in word library 1201, the corresponding key/value (that is, the corresponding source word or codeword, according to whether the substring used in comparison was itself a word or codeword) is returned and appended to an output stream. If a given substring is not found in word library 1201, a mismatch handler 1502 and hybrid encoder/decoder 1503 may be used to handle the mismatch similarly to operation during the construction or expansion of word library 1201. A mismatch handler 1502 may be utilized to identify words that do not match any existing entries in a word library 1201 and pass them to a hybrid encoder/decoder 1503, that then calculates a binary Huffman codeword for the mismatched word and adds the codeword and original data to the word library 1201 as a new key-value pair. The newly-produced codeword may then be appended to the output stream. In arrangements where a mismatch indicator is included in a received data stream, this may be used to preemptively identify a substring that is not in word library 1201 (for example, if it was identified as a mismatch on the transmission end), and handled accordingly without the need for a library lookup.

Figure 19:
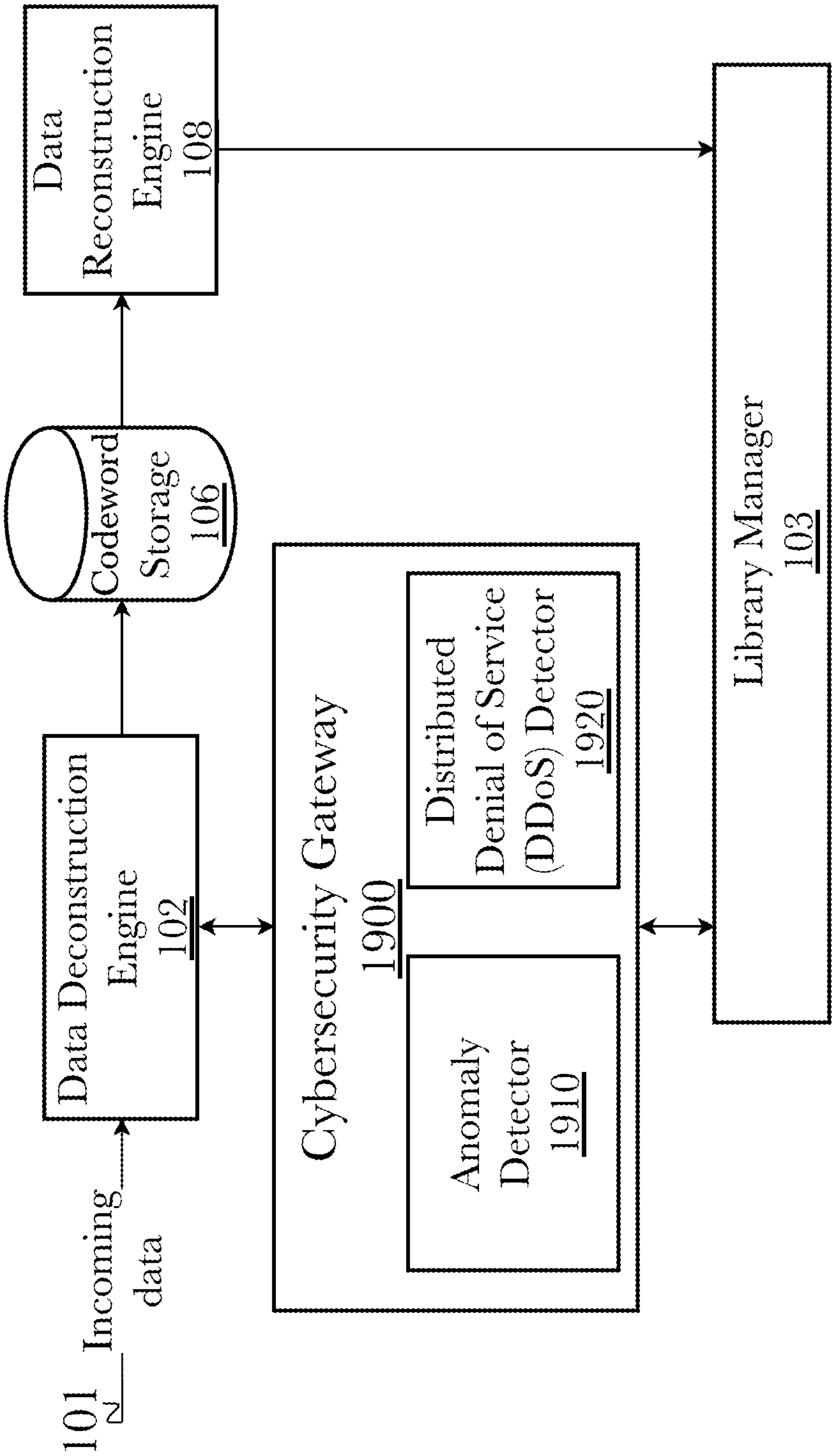
FIG. 19 is an exemplary system architecture of a data encoding system used for cyber security purposes.

FIG. 19 is an exemplary system architecture of a data encoding system used for cyber security purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process, and may be queried by a data reconstruction engine 108 which may reconstruct the original data from the codewords, using a library manager 103. However, a cybersecurity gateway 1900 is present, communicating in-between a library manager 103 and a deconstruction engine 102, and containing an anomaly detector 1910 and distributed denial of service (DDoS) detector 1920. The anomaly detector examines incoming data to determine whether there is a disproportionate number of incoming reference codes that do not match reference codes in the existing library. A disproportionate number of non-matching reference codes may indicate that data is being received from an unknown source, of an unknown type, or contains unexpected (possibly malicious) data. If the disproportionate number of non-matching reference codes exceeds an established threshold or persists for a certain length of time, the anomaly detector 1910 raises a warning to a system administrator. Likewise, the DDoS detector 1920 examines incoming data to determine whether there is a disproportionate amount of repetitive data. A disproportionate amount of repetitive data may indicate that a DDoS attack is in progress. If the disproportionate amount of repetitive data exceeds an established threshold or persists for a certain length of time, the DDoS detector 1910 raises a warning to a system administrator. In this way, a data encoding system may detect and warn users of, or help mitigate, common cyber-attacks that result from a flow of unexpected and potentially harmful data, or attacks that result from a flow of too much irrelevant data meant to slow down a network or system, as in the case of a DDoS attack.

Figure 22:
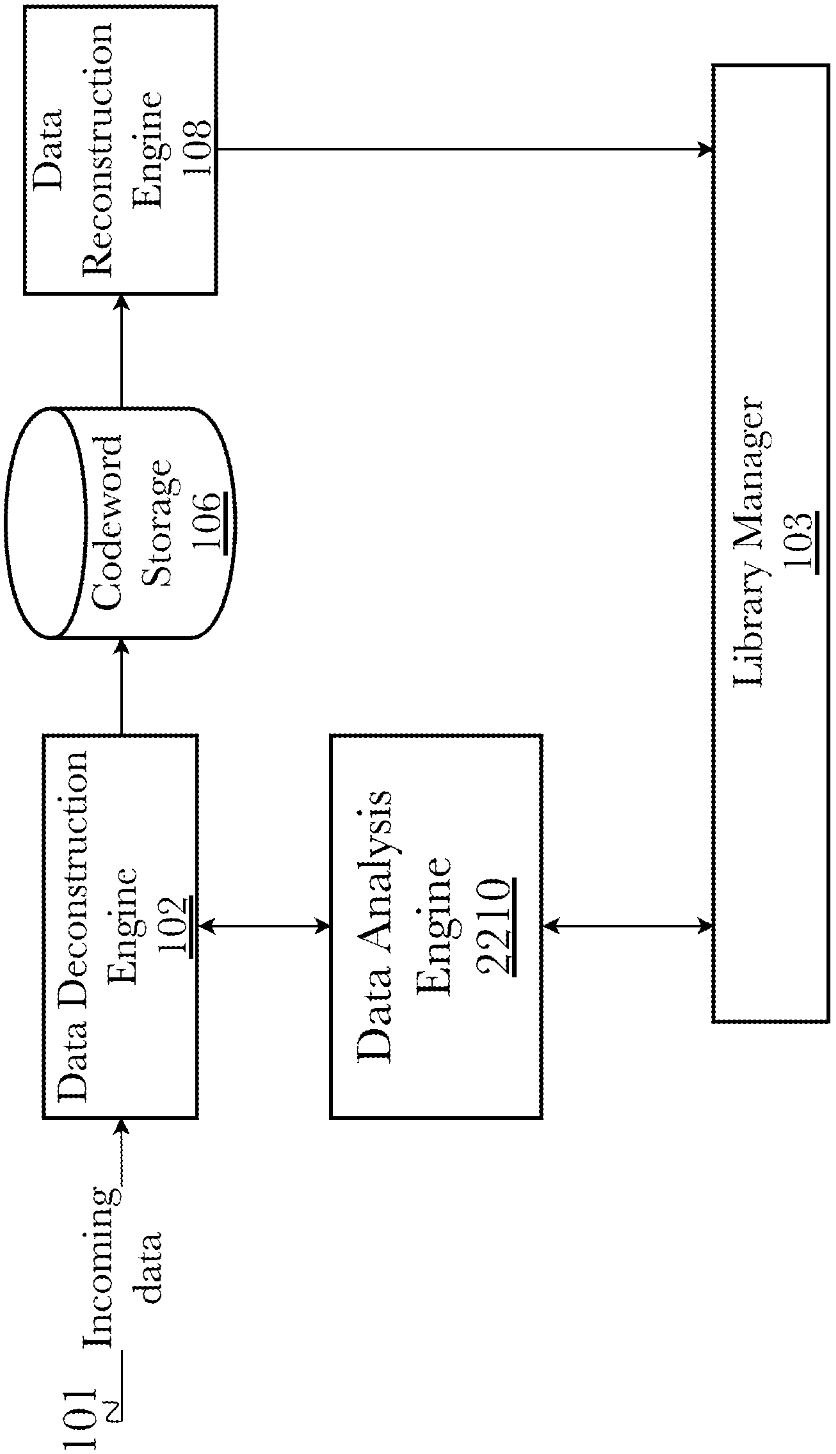
FIG. 22 is an exemplary system architecture of a data encoding system used for data mining and analysis purposes.

FIG. 22 is an exemplary system architecture of a data encoding system used for data mining and analysis purposes. Much like in FIG. 1, incoming data 101 to be deconstructed is sent to a data deconstruction engine 102, which may attempt to deconstruct the data and turn it into a collection of codewords using a library manager 103. Codeword storage 106 serves to store unique codewords from this process, and may be queried by a data reconstruction engine 108 which may reconstruct the original data from the codewords, using a library manager 103. A data analysis engine 2210, typically operating while the system is otherwise idle, sends requests for data to the data reconstruction engine 108, which retrieves the codewords representing the requested data from codeword storage 106, reconstructs them into the data represented by the codewords, and send the reconstructed data to the data analysis engine 2210 for analysis and extraction of useful data (i.e., data mining). Because the speed of reconstruction is significantly faster than decompression using traditional compression technologies (i.e., significantly less decompression latency), this approach makes data mining feasible. Very often, data stored using traditional compression is not mined precisely because decompression lag makes it unfeasible, especially during shorter periods of system idleness. Increasing the speed of data reconstruction broadens the circumstances under which data mining of stored data is feasible.

Figure 24:
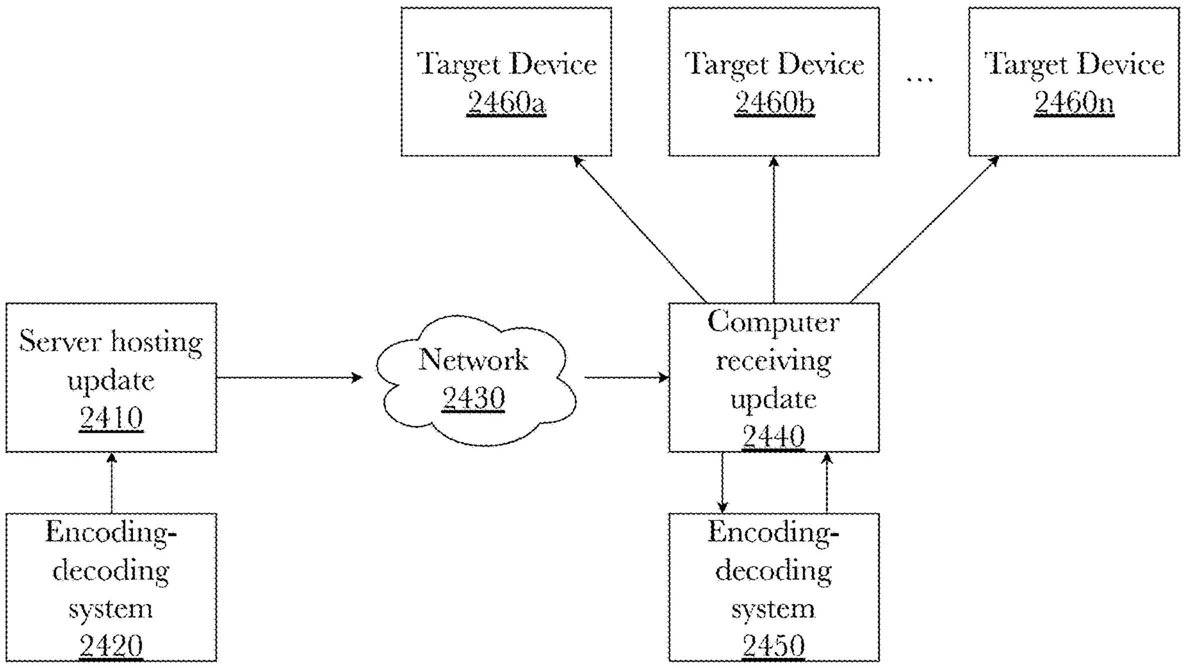
FIG. 24 is an exemplary system architecture of a data encoding system used for remote software and firmware updates.

FIG. 24 is an exemplary system architecture of a data encoding system used for remote software and firmware updates. Software and firmware updates typically require smaller, but more frequent, file transfers. A server which hosts a software or firmware update 2410 may host an encoding-decoding system 2420, allowing for data to be encoded into, and decoded from, sourceblocks or codewords, as disclosed in previous figures. Such a server may possess a software update, operating system update, firmware update, device driver update, or any other form of software update, which in some cases may be minor changes to a file, but nevertheless necessitate sending the new, completed file to the recipient. Such a server is connected over a network 2430, which is further connected to a recipient computer 2440, which may be connected to a server 2410 for receiving such an update to its system. In this instance, the recipient device 2440 also hosts the encoding and decoding system 2450, along with a codebook or library of reference codes that the hosting server 2410 also shares. The updates are retrieved from storage at the hosting server 2410 in the form of codewords, transferred over the network 2430 in the form of codewords, and reconstructed on the receiving computer 2440. In this way, a far smaller file size, and smaller total update size, may be sent over a network. The receiving computer 2440 may then install the updates on any number of target computing devices 2460*a-n*, using a local network or other high-bandwidth connection.

Figure 26:
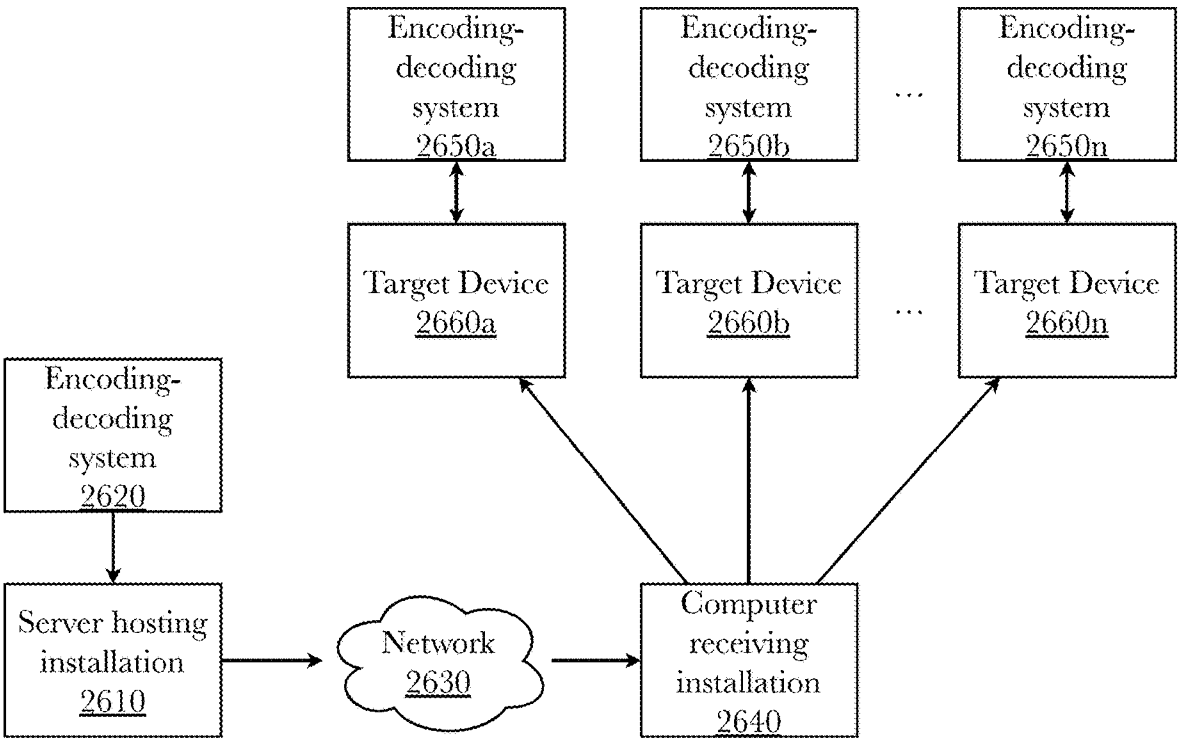
FIG. 26 is an exemplary system architecture of a data encoding system used for large-scale software installation such as operating systems.

FIG. 26 is an exemplary system architecture of a data encoding system used for large-scale software installation such as operating systems. Large-scale software installations typically require very large, but infrequent, file transfers. A server which hosts an installable software 2610 may host an encoding-decoding system 2620, allowing for data to be encoded into, and decoded from, sourceblocks or codewords, as disclosed in previous figures. The files for the large scale software installation are hosted on the server 2610, which is connected over a network 2630 to a recipient computer 2640. In this instance, the encoding and decoding system 2650*a-n* is stored on or connected to one or more target devices 2660*a-n*, along with a codebook or library of reference codes that the hosting server 2610 shares. The software is retrieved from storage at the hosting server 2610 in the form of codewords, and transferred over the network 2630 in the form of codewords to the receiving computer 2640. However, instead of being reconstructed at the receiving computer 2640, the codewords are transmitted to one or more target computing devices, and reconstructed and installed directly on the target devices 2660*a-n*. In this way, a far smaller file size, and smaller total update size, may be sent over a network or transferred between computing devices, even where the network 2630 between the receiving computer 2640 and target devices 2660*a-n* is low bandwidth, or where there are many target devices 2660*a-n*.

Figure 28:
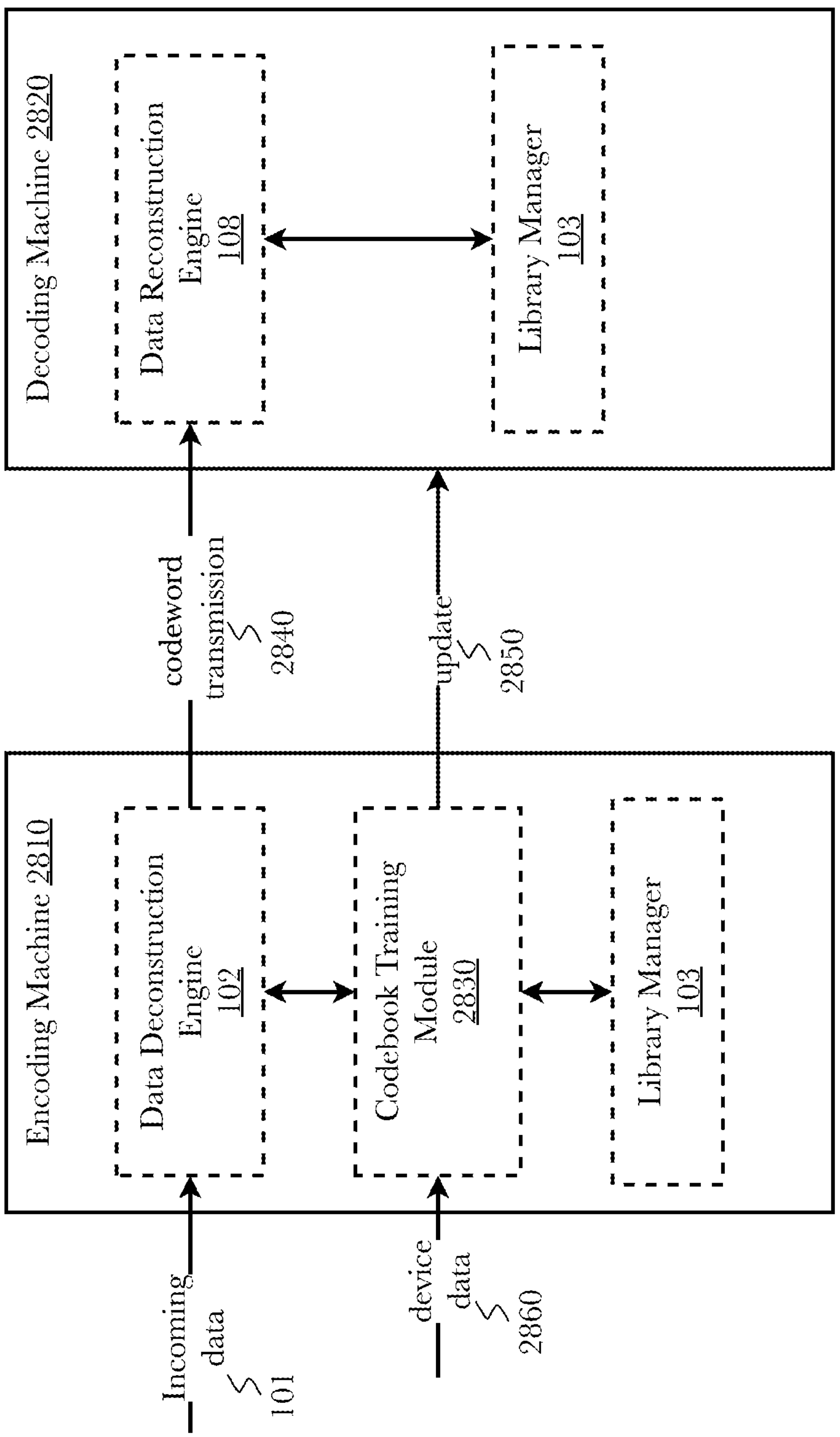
FIG. 28 is a block diagram of an exemplary system architecture of a codebook training system for a data encoding system, according to an embodiment.

FIG. 28 is a block diagram of an exemplary system architecture 2800 of a codebook training system for a data encoding system, according to an embodiment. According to this embodiment, two separate machines may be used for encoding 2810 and decoding 2820. Much like in FIG. 1, incoming data 101 to be deconstructed is sent to a data deconstruction engine 102 residing on encoding machine 2810, which may attempt to deconstruct the data and turn it into a collection of codewords using a library manager 103. Codewords may be transmitted 2840 to a data reconstruction engine 108 residing on decoding machine 2820, which may reconstruct the original data from the codewords, using a library manager 103. However, according to this embodiment, a codebook training module 2830 is present on the decoding machine 2810, communicating in-between a library manager 103 and a deconstruction engine 102. According to other embodiments, codebook training module 2830 may reside instead on decoding machine 2820 if the machine has enough computing resources available; which machine the module 2830 is located on may depend on the system user's architecture and network structure. Codebook training module 2830 may send requests for data to the data reconstruction engine 2810, which routes incoming data 101 to codebook training module 2830. Codebook training module 2830 may perform analyses on the requested data in order to gather information about the distribution of incoming data 101 as well as monitor the encoding/decoding model performance. Additionally, codebook training module 2830 may also request and receive device data 2860 to supervise network connected devices and their processes and, according to some embodiments, to allocate training resources when requested by devices running the encoding system. Devices may include, but are not limited to, encoding and decoding machines, training machines, sensors, mobile compute devices, and Internet-of-things ("IoT") devices. Based on the results of the analyses, the codebook training module 2830 may create a new training dataset from a subset of the requested data in order to counteract the effects of data drift on the encoding/decoding models, and then publish updated 2850 codebooks to both the encoding machine 2810 and decoding machine 2820.

Figure 29:
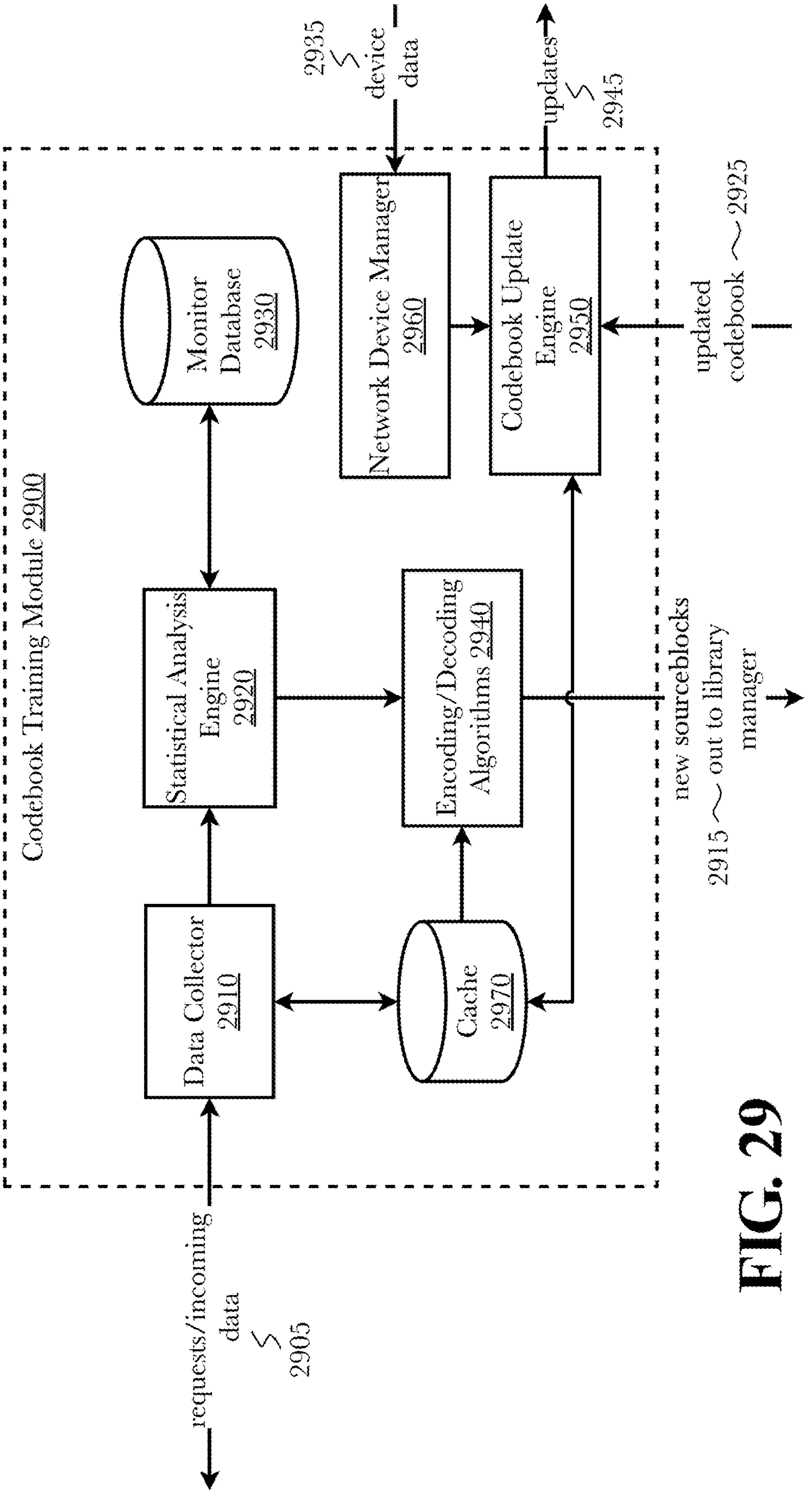
FIG. 29 is a block diagram of an exemplary architecture for a codebook training module, according to an embodiment.

FIG. 29 is a block diagram of an exemplary architecture for a codebook training module 2900, according to an embodiment. According to the embodiment, a data collector 2910 is present which may send requests for incoming data 2905 to a data deconstruction engine 102 which may receive the request and route incoming data to codebook training module 2900 where it may be received by data collector 2910. Data collector 2910 may be configured to request data periodically such as at schedule time intervals, or for example, it may be configured to request data after a certain amount of data has been processed through the encoding machine 2810 or decoding machine 2820. The received data may be a plurality of sourceblocks, which are a series of binary digits, originating from a source packet otherwise referred to as a datagram. The received data may be compiled into a test dataset and temporarily stored in a cache 2970. Once stored, the test dataset may be forwarded to a statistical analysis engine 2920 which may utilize one or more algorithms to determine the probability distribution of the test dataset. Best-practice probability distribution metrics such as Kullback-Leibler divergence, adaptive windowing, and Jensen-Shannon divergence may be used to compute and/or estimate the probability distribution of training and test datasets. These metrics may also be used to estimate the probability distribution from the current run-time data. In some implementations, the estimate of the training data may be compared against the estimate of the run-time data to verify if the difference in calculated distributions exceeds a predetermined difference threshold. If the difference in distributions does not exceed the difference threshold, that indicates the test dataset, and therefore the incoming data, has not experienced enough data drift to cause the encoding/decoding system performance to degrade significantly, which indicates that no updates are necessary to the existing codebooks. However, if the difference threshold has been surpassed, then the data drift is significant enough to cause the encoding/decoding system performance to degrade to the point where the existing models and accompanying codebooks need to be updated. A monitoring database 2930 may be used to store a variety of statistical data related to training datasets and model performance metrics in one place to facilitate quick and accurate system monitoring capabilities as well as assist in system debugging functions. For example, the original or current training dataset and the calculated probability distribution of this training dataset used to develop the current encoding and decoding algorithms may be stored in monitor database 2930.

Since data drifts involve statistical change in the data, the best approach to detect drift is by monitoring the incoming data's statistical properties, the model's predictions, and their correlation with other factors. After statistical analysis engine 2920 calculates the probability distribution of the test dataset it may retrieve from monitor database 2930 the calculated and stored probability distribution of the current training dataset. It may then compare the two probability distributions of the two different datasets in order to verify if the difference in calculated distributions exceeds a predetermined difference threshold. If the difference in distributions does not exceed the difference threshold, that indicates the test dataset, and therefore the incoming data, has not experienced enough data drift to cause the encoding/decoding system performance to degrade significantly, which indicates that no updates are necessary to the existing codebooks. However, if the difference threshold has been surpassed, then the data drift is significant enough to cause the encoding/decoding system performance to degrade to the point where the existing models and accompanying codebooks need to be updated. According to an embodiment, an alert may be generated by statistical analysis engine 2920 if the difference threshold is surpassed or if otherwise unexpected behavior arises.

In the event that an update is required, the test dataset stored in the cache 2970 and its associated calculated probability distribution may be sent to monitor database 2930 for long term storage. This test dataset may be used as a new training dataset to retrain the encoding and decoding algorithms 2940 used to create new sourceblocks based upon the changed probability distribution. The new sourceblocks may be sent out to a library manager 2915 where the sourceblocks can be assigned new codewords. Each new sourceblock and its associated codeword may then be added to a new codebook and stored in a storage device. The new and updated codebook may then be sent back 2925 to codebook training module 2900 and received by a codebook update engine 2950. Codebook update engine 2950 may temporarily store the received updated codebook in the cache 2970 until other network devices and machines are ready, at which point codebook update engine 2950 will publish the updated codebooks 2945 to the necessary network devices.

A network device manager 2960 may also be present which may request and receive network device data 2935 from a plurality of network connected devices and machines. When the disclosed encoding system and codebook training system 2800 are deployed in a production environment, upstream process changes may lead to data drift, or other unexpected behavior. For example, a sensor being replaced that changes the units of measurement from inches to centimeters, data quality issues such as a broken sensor always reading 0, and covariate shift which occurs when there is a change in the distribution of input variables from the training set. These sorts of behavior and issues may be determined from the received device data 2935 in order to identify potential causes of system error that is not related to data drift and therefore does not require an updated codebook. This can save network resources from being unnecessarily used on training new algorithms as well as alert system users to malfunctions and unexpected behavior devices connected to their networks. Network device manager 2960 may also utilize device data 2935 to determine available network resources and device downtime or periods of time when device usage is at its lowest. Codebook update engine 2950 may request network and device availability data from network device manager 2960 in order to determine the most optimal time to transmit updated codebooks (i.e., trained libraries) to encoder and decoder devices and machines.

Figure 30:
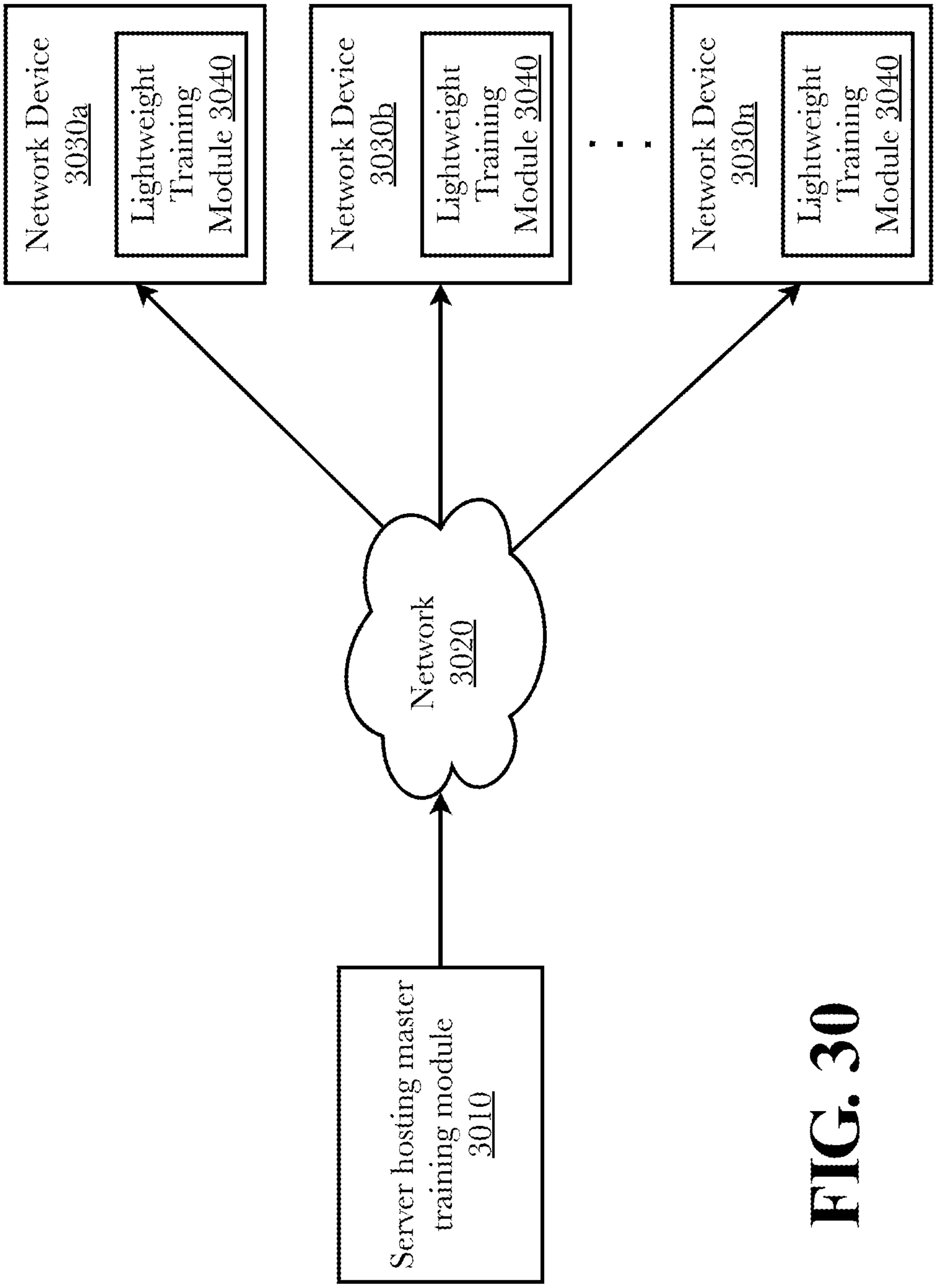
FIG. 30 is a block diagram of another embodiment of the codebook training system using a distributed architecture and a modified training module.

FIG. 30 is a block diagram of another embodiment of the codebook training system using a distributed architecture and a modified training module. According to an embodiment, there may be a server which maintains a master supervisory process over remote training devices hosting a master training module 3010 which communicates via a network 3020 to a plurality of connected network devices 3030*a-n*. The server may be located at the remote training end such as, but not limited to, cloud-based resources, a user-owned data center, etc. The master training module located on the server operates similarly to the codebook training module disclosed in FIG. 29 above, however, the server 3010 utilizes the master training module via the network device manager 2960 to farm out training resources to network devices 3030*a-n*. The server 3010 may allocate resources in a variety of ways, for example, round-robin, priority-based, or other manner, depending on the user needs, costs, and number of devices running the encoding/decoding system. Server 3010 may identify elastic resources which can be employed if available to scale up training when the load becomes too burdensome. On the network devices 3030*a-n* may be present a lightweight version of the training module 3040 that trades a little suboptimality in the codebook for training on limited machinery and/or makes training happen in low-priority threads to take advantage of idle time. In this way the training of new encoding/decoding algorithms may take place in a distributed manner which allows data gathering or generating devices to process and train on data gathered locally, which may improve system latency and optimize available network resources.

Figure 36:
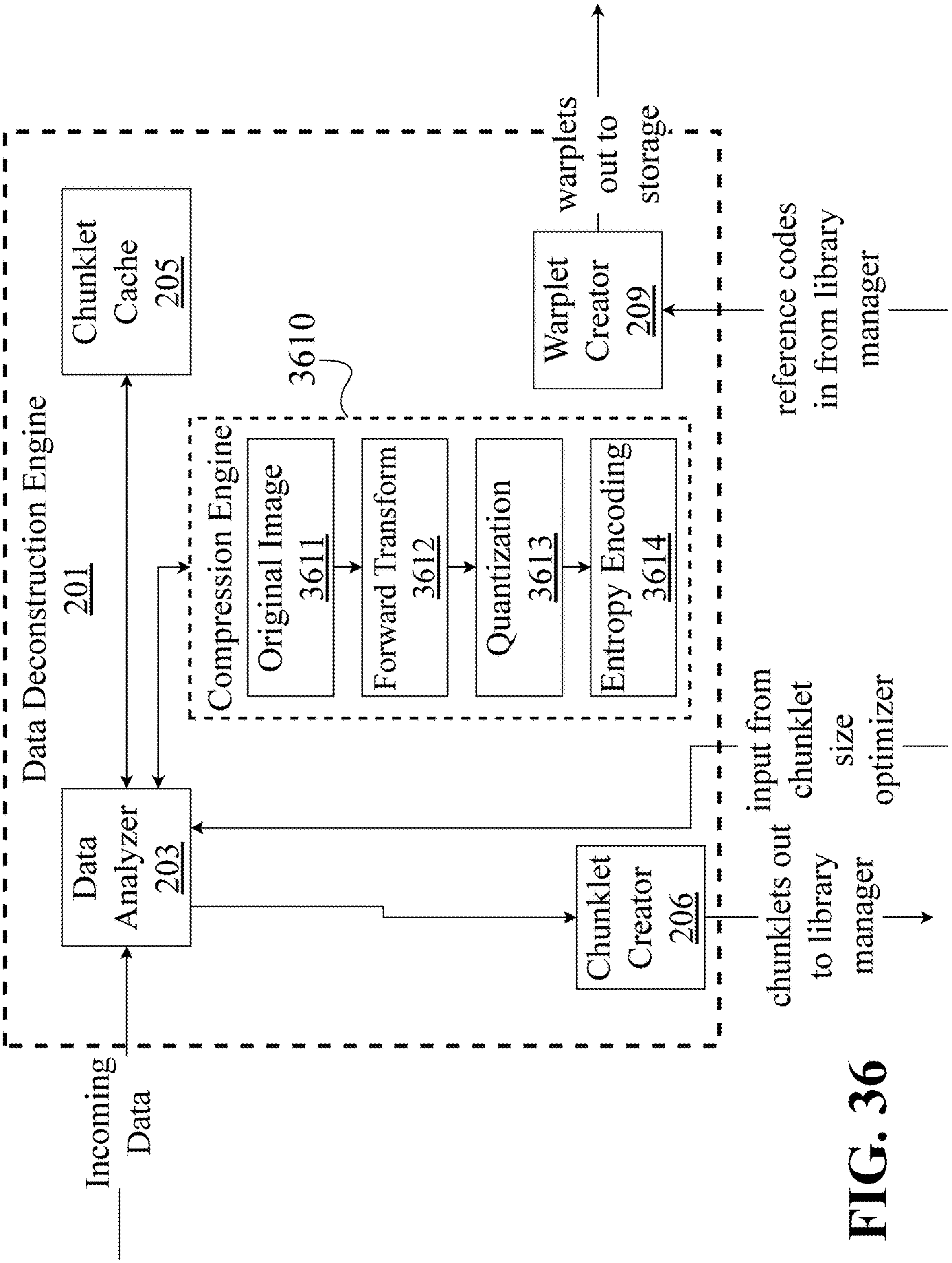
FIG. 36 is a system diagram illustrating a data deconstruction engine containing a compression engine that may be used for pre-compression of high-entropy data streams before being compacted using codebook techniques, according to an embodiment.

FIG. 36 is a system diagram illustrating a data deconstruction engine 201 containing a compression engine that may be used for pre-compression of high-entropy data streams before being compacted using codebook techniques, according to an embodiment. Incoming data 202 is received by data analyzer 203, which optimally analyzes the data based on machine learning algorithms and input 204 from a sourceblock size optimizer, which is disclosed below. Data analyzer may optionally have access to a sourceblock cache 205 of recently-processed sourceblocks, which can increase the speed of the system by avoiding processing in library manager 103. Based on information from data analyzer 203, the data is broken into sourceblocks by sourceblock creator 206, which sends sourceblocks 207 to library manager 203 for additional processing. Data deconstruction engine 201 receives reference codes 208 from library manager 103, corresponding to the sourceblocks in the library that match the sourceblocks sent by sourceblock creator 206, and codeword creator 209 processes the reference codes into codewords comprising a reference code to a sourceblock and a location of that sourceblock within the data set. The original data may be discarded, and the codewords representing the data are sent out to storage 210.

Before sending codewords to storage, a compression engine 3610 exists which may be forwarded image data, or other high-entropy data, from a data analyzer 203, for pre-compression of the data before it is turned into sourceblocks by a sourceblock creator 206. When fed in an image, the original image 3611 has a forward transform 3612 or other mathematical transform such as Discrete Cosine Transforms ("DCT"), which include the Fast Fourier Transform ("FFT"), applied to it, to transform the image into numeric data suitable for compression. Upon having a DCT applied to the image 3611, 3612, it is quantized 3613, a process common in compression technologies in which integers in the numeric data of an image are divided by a quantization matrix, then rounded to the nearest integer, reducing their precision and subsequently the number of bits needed to store the integers. In this manner, this compression is considered lossy, as there is irreversible data loss due to the loss in precision of these integers. The selection of quantization matrix values may be undertaken with numerous methods, commonly including those that use machine learning to find a set of values that provide for suitable compression without an unacceptable amount of loss of data, or manually specifying DCT coefficients and generating the matrix from those values. Upon quantization 3613 application within a compression engine 3610, an algorithm for entropy encoding 3614 may be selected and applied, such as Huffman encoding, Shannon encoding, or other encoding methods. It should be readily apparent that any high entropy signal data such as audio or video may also be compressed in this manner.

Figure 37:
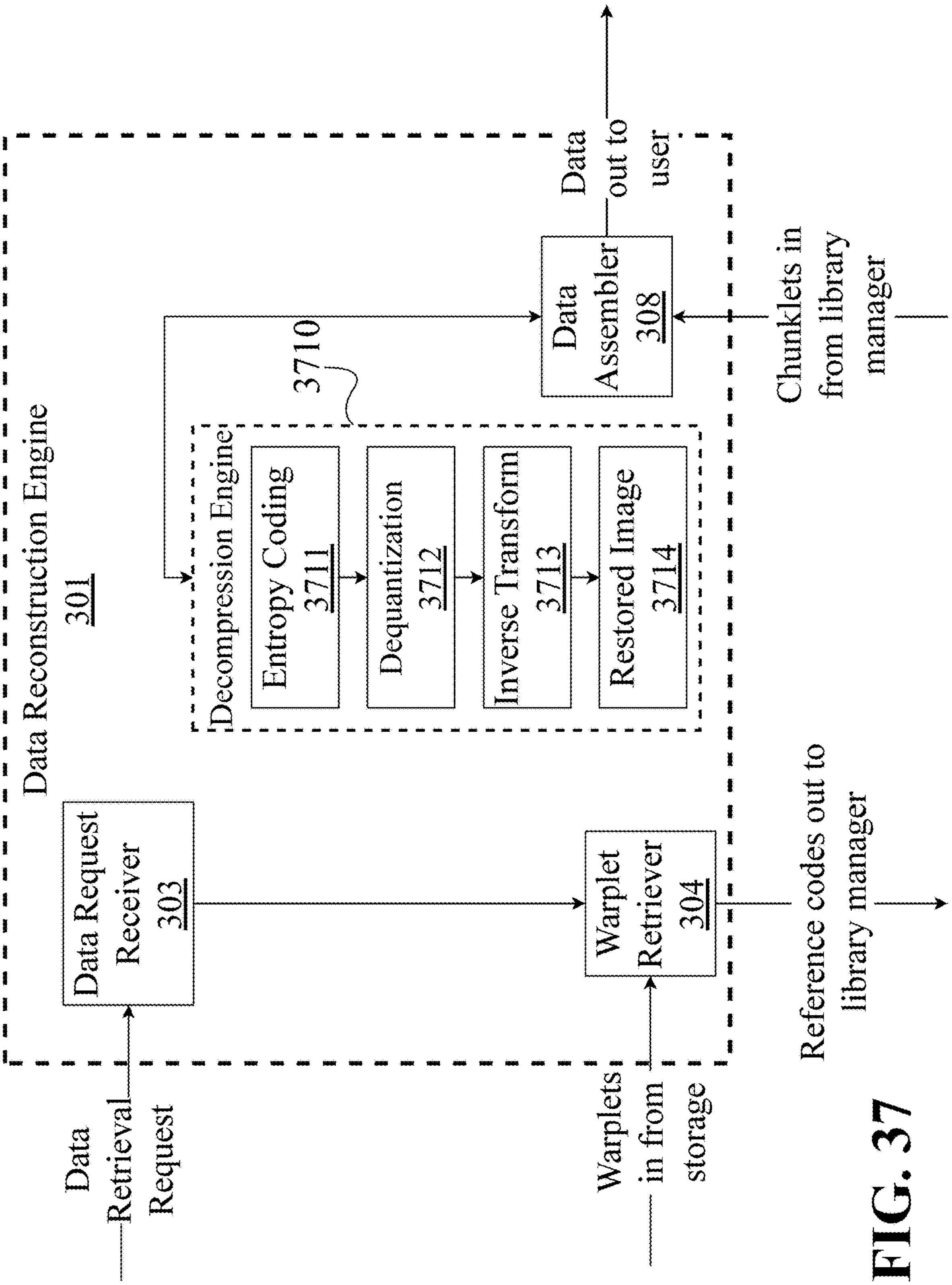
FIG. 37 is a system diagram illustrating a data reconstruction engine containing a decompression engine that may be used for decompressing high-entropy data streams after they have been de-compacted from their codebook-translated format, according to an embodiment.

FIG. 37 is a system diagram illustrating a data reconstruction engine 301 containing a decompression engine that may be used for decompressing high-entropy data streams after they have been de-compacted from their codebook-translated format, according to an embodiment. When a data retrieval request 302 is received by data request receiver 303 (in the form of a plurality of codewords corresponding to a desired final data set), it passes the information to data retriever 304, which obtains the requested data 305 from storage. Data retriever 304 sends, for each codeword received, a reference codes from the codeword 306 to library manager 103 for retrieval of the specific sourceblock associated with the reference code. Data assembler 308 receives the sourceblock 307 from library manager 103 and, after receiving a plurality of sourceblocks corresponding to a plurality of codewords, assembles them into the proper order based on the location information contained in each codeword (recall each codeword comprises a sourceblock reference code and a location identifier that specifies where in the resulting data set the specific sourceblock should be restored to. The requested data is then sent to user 309 in its original form.

Before sending the data to a user in its current form, a decompression engine 3710 exists as a way to decompress data that, after having been reassembled from sourceblocks by a data assembler 308, is still in a recognized compressed format, rather than a raw or original form. First, any entropy encoding 3711 such as Huffman encoding or Shannon encoding, is reversed, which are typically lossless compression methods and do not result in data degradation. Dequantization 3712 may then be performed by the engine, whereby the integers making up the data are multiplied by a DCT matrix, with precision loss due to rounding in a quantization step during compression. If dequantization is needed for decompression, this would result in lossy compression/decompression. An inverse transform 3713 may be applied to reverse the transformation from signal data to numeric data, restoring the existing signal data that may not be represented by numeric data, resulting in a restored image 3714 or other high entropy data. It should be readily apparent that any high entropy signal data such as audio or video may also be decompressed in this manner.

Figure 38:
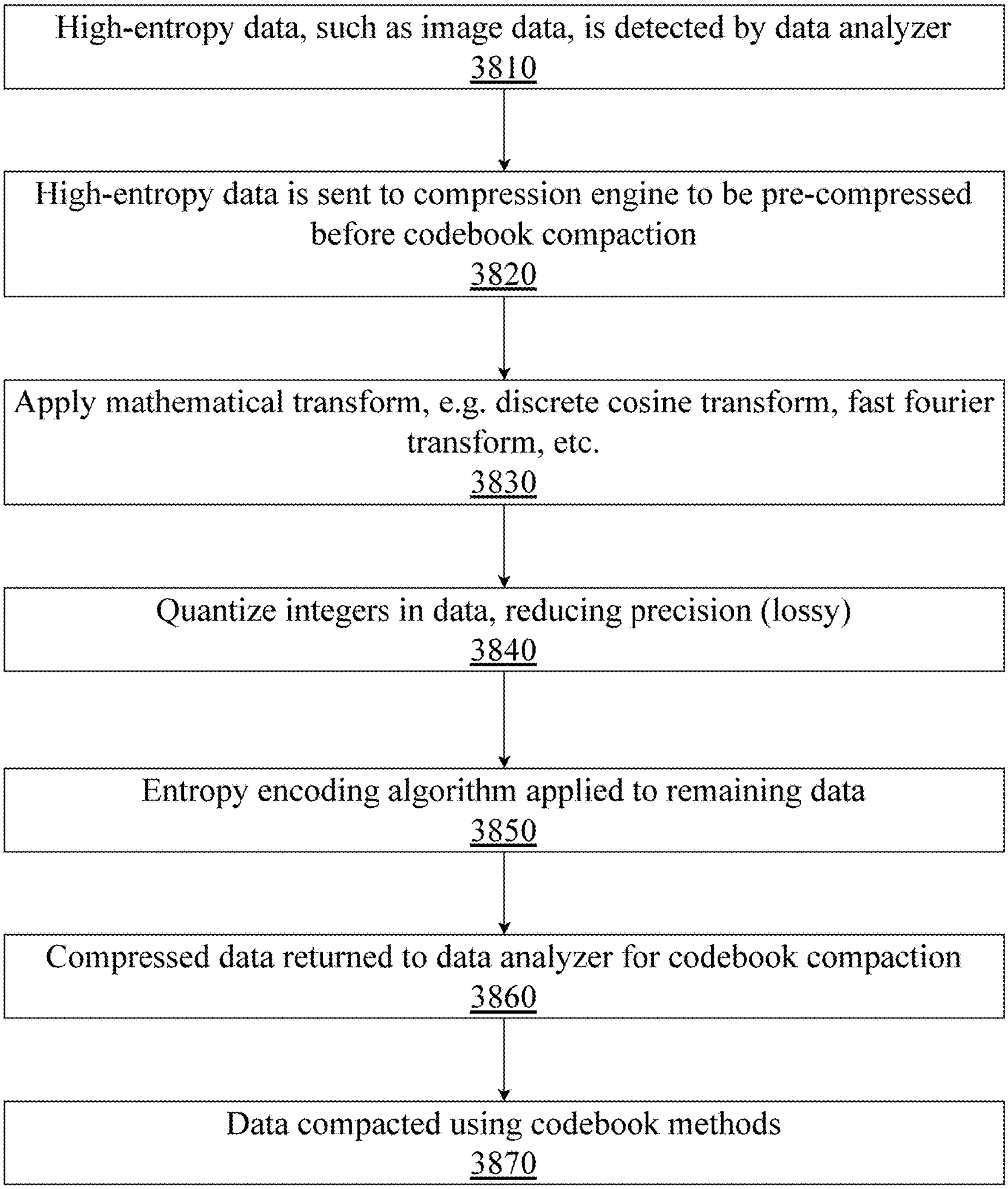
FIG. 38 is a method diagram illustrating the operation of a compression engine within a data deconstruction engine, according to an embodiment.

FIG. 38 is a method diagram illustrating the operation of a compression engine within a data deconstruction engine, according to an embodiment. Data analysis of an incoming data stream may be used to detect high-entropy data, such as image data 3810, but also potentially audio or video data, indicating data that may benefit from lossy pre-compression before codebook compaction 3820, thereby reducing its data size even further and enabling more technologies such as progressive image loading to take place. In order to compress the data, a DCT may be applied 3830, converting signal data of some sort into numeric data. In this way, raw signal data such as that received from physical sensors may be converted into numeric data ready for processing and further compression. The numeric data may be quantized, a process in which the integers representing the data are divided by a quantization matrix and then rounded down, reducing precision of the integers and essentially resulting in the loss of "noise" data, but also the compaction of the data by reducing the actual number of bits needed to store the data 3840. In addition to quantization, an entropy encoding algorithm may be applied to the data 3850, such as Huffman, Shannon, or arithmetic coding. When these steps, together or in some limited combination, are completed, the compressed data may be returned to a data analyzer that may then direct the newly compressed data for codebook compaction 3860, which is a lossless process by comparison. The data may then be compacted using codebook methods 3870 described elsewhere.

Figure 39:
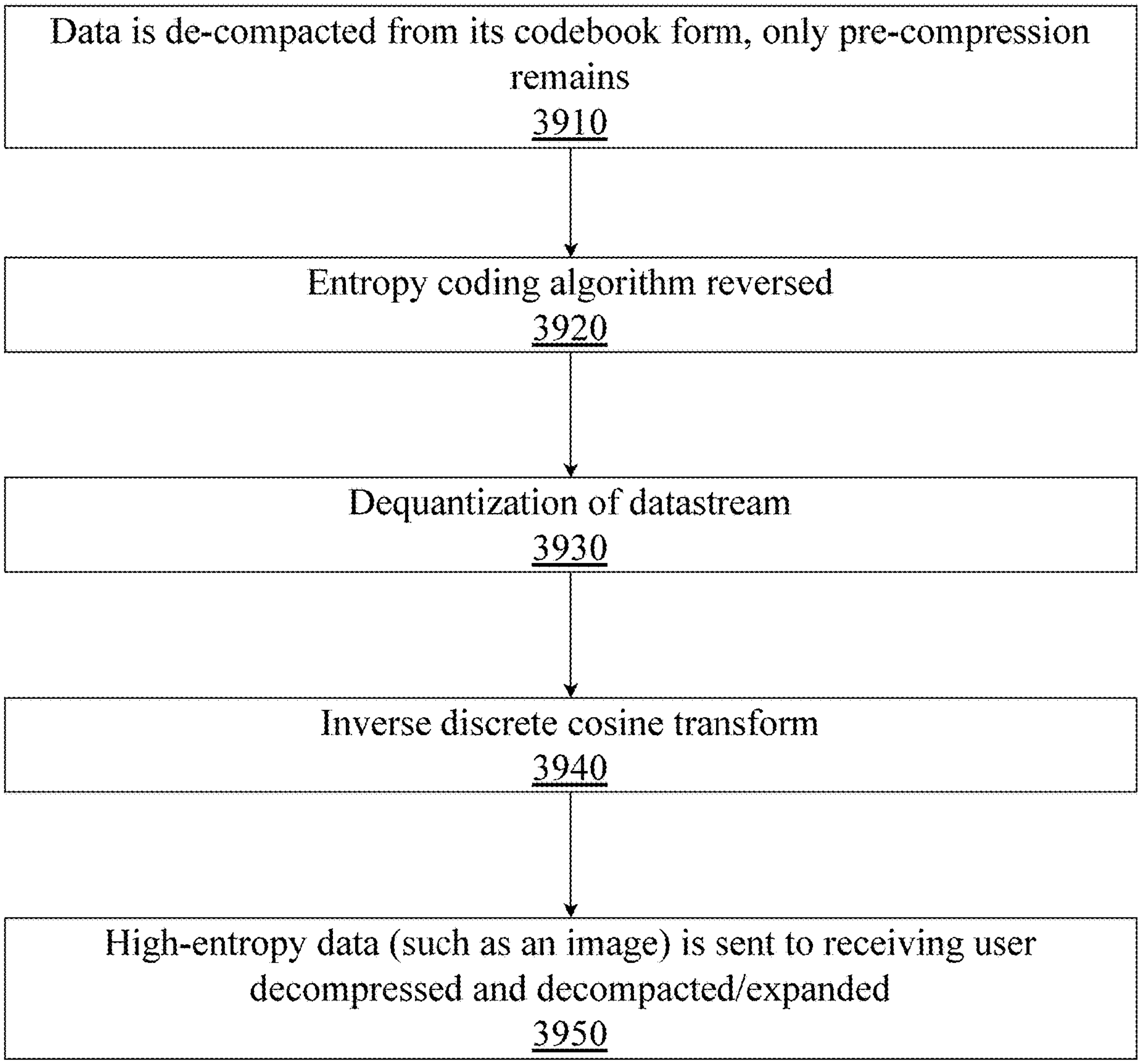
FIG. 39 is a method diagram illustrating the operation of a decompression engine within a data reconstruction engine, according to an embodiment.

FIG. 39 is a method diagram illustrating the operation of a decompression engine within a data reconstruction engine, according to an embodiment. To reverse a lossy compression attained by a compression engine, a data reconstruction engine must operate in reverse order from a data deconstruction engine, first un-compacting the data from its codebook representation 3910 as described elsewhere, before proceeding with decompressing the potentially lossy pre-compression that was performed on the data prior to codebook compaction. For decompression of the remaining data, the decompression engine first reversing the entropy coding algorithm applied 3920, before dequantization of the data if it was quantized 3930, and reversing the DCT previously applied 3940 to transform the compressed data back into its original form, such as image, audio, video, or other signal data. The now decompressed high-entropy data is then able to be sent to a receiving user or system, decompressed and expanded from its pre-compressed and codebook format 3950.

Figure 40:
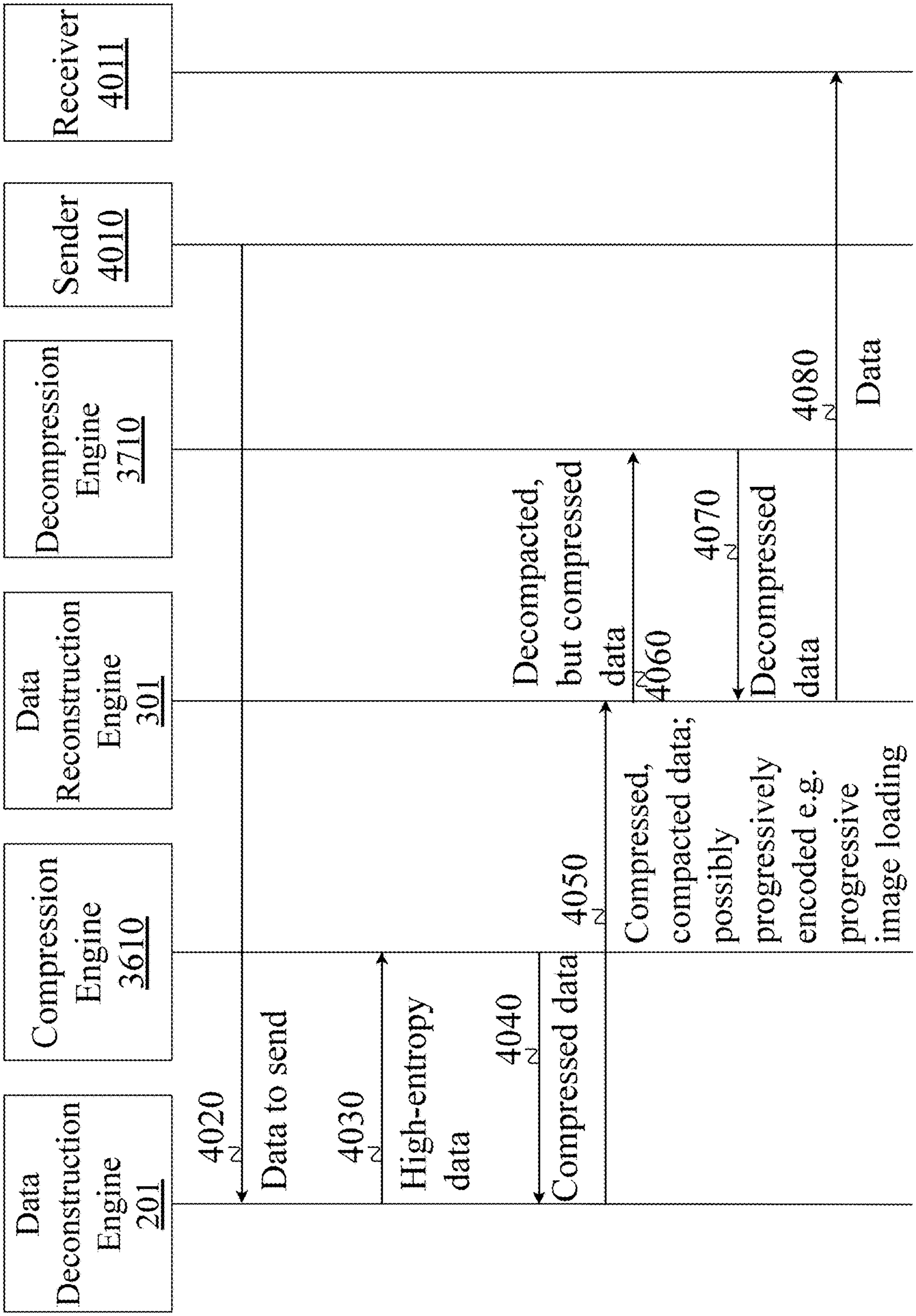
FIG. 40 is a message flow diagram illustrating the use of pre-compression of high-entropy data streams before being compacted using codebook techniques, transmitted to a data reconstruction engine, expanded from their codebook format, and decompressed, before being transmitted to a receiver or end-user, according to an embodiment.

FIG. 40 is a message flow diagram illustrating the use of pre-compression of high-entropy data streams before being compacted using codebook techniques, transmitted to a data reconstruction engine, expanded from their codebook format, and decompressed, before being transmitted to a receiver or end-user, according to an embodiment. Components that are transmitting or receiving data, or otherwise communicating with each other, include a data deconstruction engine 201, a compression engine 3610, a data reconstruction engine 301, a decompression engine 3710, a sender 4010 (such as a user trying to compact and compress data they wish to send), and a receiver 4011 (such as the destination for the data that the sender 4010 is attempting to send). A data sender 4010 first begins the process of preparing their data for transmission, with a data deconstruction engine 201, 4020. This may be done with minimal user interaction, for example a physical sensor system may already be configured to operate a data deconstruction engine 201 as part of its normal operations, and from a sender's 4010 perspective, all they are doing is turning on or otherwise using the device normally, without knowledge or configuration of the data compression or compaction techniques therein. When the data deconstruction engine 201 detects high-entropy data such as image, audio, video, or similar data, it may use a compression engine 3610 to process that data 4030, before receiving it back in a compressed state 4040. That data, newly compressed by the compression engine 3610 and then otherwise compacted by the data deconstruction engine 201 into compact codebook translations that will be understood by a receiver 4011, may then be sent to a data reconstruction engine 301 operated by a receiver 4011, 4050, and this data transmission may take the form of progressive resolution, progressive compression, or more commonly known progressive image loading, techniques. For instance the data stream may contain a highly compressed resolution of the original data, with a high degree of signal loss due to lossy compression, within or while also transmitting a more complete or losslessly compressed or compacted data stream.

The data, when received by a data reconstruction engine 301, is first decompacted and translated from its codebook form, before it can then be sent to a decompression engine 3710, 4060 to be decompressed from its still compressed form. This is due to the fact that the original data was first pre-compressed before being codebook compacted, therefore the decompression must take place after the codebook compaction has been reversed. This decompressed data is forwarded back to the data reconstruction engine 301, 4070 to finalize reconstructing and assembling the data, that is then sent or presented to the data receiver 4011, 4080. In this way, highly compacted and compressed data transmission may take place, including with the use of progressive image loading or similar techniques, depending on how the data is encoded in a particular implementation of data encoding.

Description of Method Aspects

Since the library consists of re-usable building sourceblocks, and the actual data is represented by reference codes to the library, the total storage space of a single set of data would be much smaller than conventional methods, wherein the data is stored in its entirety. The more data sets that are stored, the larger the library becomes, and the more data can be stored in reference code form.

As an analogy, imagine each data set as a collection of printed books that are only occasionally accessed. The amount of physical shelf space required to store many collections would be quite large, and is analogous to conventional methods of storing every single bit of data in every data set. Consider, however, storing all common elements within and across books in a single library, and storing the books as references codes to those common elements in that library. As a single book is added to the library, it will contain many repetitions of words and phrases. Instead of storing the whole words and phrases, they are added to a library, and given a reference code, and stored as reference codes. At this scale, some space savings may be achieved, but the reference codes will be on the order of the same size as the words themselves. As more books are added to the library, larger phrases, quotations, and other words patterns will become common among the books. The larger the word patterns, the smaller the reference codes will be in relation to them as not all possible word patterns will be used. As entire collections of books are added to the library, sentences, paragraphs, pages, or even whole books will become repetitive. There may be many duplicates of books within a collection and across multiple collections, many references and quotations from one book to another, and much common phraseology within books on particular subjects. If each unique page of a book is stored only once in a common library and given a reference code, then a book of 1,000 pages or more could be stored on a few printed pages as a string of codes referencing the proper full-sized pages in the common library. The physical space taken up by the books would be dramatically reduced. The more collections that are added, the greater the likelihood that phrases, paragraphs, pages, or entire books will already be in the library, and the more information in each collection of books can be stored in reference form. Accessing entire collections of books is then limited not by physical shelf space, but by the ability to reprint and recycle the books as needed for use.

The projected increase in storage capacity using the method herein described is primarily dependent on two factors: 1) the ratio of the number of bits in a block to the number of bits in the reference code, and 2) the amount of repetition in data being stored by the system.

With respect to the first factor, the number of bits used in the reference codes to the sourceblocks must be smaller than the number of bits in the sourceblocks themselves in order for any additional data storage capacity to be obtained. As a simple example, 16-bit sourceblocks would require $2^{16}$, or 65536, unique reference codes to represent all possible patterns of bits. If all possible 65536 blocks patterns are utilized, then the reference code itself would also need to contain sixteen bits in order to refer to all possible 65,536 blocks patterns. In such case, there would be no storage savings. However, if only 16 of those block patterns are utilized, the reference code can be reduced to 4 bits in size, representing an effective compression of 4 times (16 bits/4 bits=4) versus conventional storage. Using a typical block size of 512 bytes, or 4,096 bits, the number of possible block patterns is $2^{4,096}$, which for all practical purposes is unlimited. A typical hard drive contains one terabyte (TB) of physical storage capacity, which represents 1,953,125,000, or roughly $2^{31}$, 512 byte blocks. Assuming that 1 TB of unique 512-byte sourceblocks were contained in the library, and that the reference code would thus need to be 31 bits long, the effective compression ratio for stored data would be on the order of 132 times (4,096/31≈132) that of conventional storage.

With respect to the second factor, in most cases it could be assumed that there would be sufficient repetition within a data set such that, when the data set is broken down into sourceblocks, its size within the library would be smaller than the original data. However, it is conceivable that the initial copy of a data set could require somewhat more storage space than the data stored in a conventional manner, if all or nearly all sourceblocks in that set were unique. For example, assuming that the reference codes are $1/10^{th}$ the size of a full-sized copy, the first copy stored as sourceblocks in the library would need to be 1.1 megabytes (MB), (1 MB for the complete set of full-sized sourceblocks in the library and 0.1 MB for the reference codes). However, since the sourceblocks stored in the library are universal, the more duplicate copies of something you save, the greater efficiency versus conventional storage methods. Conventionally, storing 10 copies of the same data requires 10 times the storage space of a single copy. For example, ten copies of a 1 MB file would take up 10 MB of storage space. However, using the method described herein, only a single full-sized copy is stored, and subsequent copies are stored as reference codes. Each additional copy takes up only a fraction of the space of the full-sized copy. For example, again assuming that the reference codes are $1/10^{th}$ the size of the full-size copy, ten copies of a 1 MB file would take up only 2 MB of space (1 MB for the full-sized copy, and 0.1 MB each for ten sets of reference codes). The larger the library, the more likely that part or all of incoming data will duplicate sourceblocks already existing in the library.

The size of the library could be reduced in a manner similar to storage of data. Where sourceblocks differ from each other only by a certain number of bits, instead of storing a new sourceblock that is very similar to one already existing in the library, the new sourceblock could be represented as a reference code to the existing sourceblock, plus information about which bits in the new block differ from the existing block. For example, in the case where 512 byte sourceblocks are being used, if the system receives a new sourceblock that differs by only one bit from a sourceblock already existing in the library, instead of storing a new 512 byte sourceblock, the new sourceblock could be stored as a reference code to the existing sourceblock, plus a reference to the bit that differs. Storing the new sourceblock as a reference code plus changes would require only a few bytes of physical storage space versus the 512 bytes that a full sourceblock would require. The algorithm could be optimized to store new sourceblocks in this reference code plus changes form unless the changes portion is large enough that it is more efficient to store a new, full sourceblock.

It will be understood by one skilled in the art that transfer and synchronization of data would be increased to the same extent as for storage. By transferring or synchronizing reference codes instead of full-sized data, the bandwidth requirements for both types of operations are dramatically reduced.

In addition, the method described herein is inherently a form of encryption. When the data is converted from its full form to reference codes, none of the original data is contained in the reference codes. Without access to the library of sourceblocks, it would be impossible to reconstruct any portion of the data from the reference codes. This inherent property of the method described herein could obviate the need for traditional encryption algorithms, thereby offsetting most or all of the computational cost of conversion of data back and forth to reference codes. In theory, the method described herein should not utilize any additional computing power beyond traditional storage using encryption algorithms. Alternatively, the method described herein could be in addition to other encryption algorithms to increase data security even further.

In other embodiments, additional security features could be added, such as: creating a proprietary library of sourceblocks for proprietary networks, physical separation of the reference codes from the library of sourceblocks, storage of the library of sourceblocks on a removable device to enable easy physical separation of the library and reference codes from any network, and incorporation of proprietary sequences of how sourceblocks are read and the data reassembled.

Figure 7:
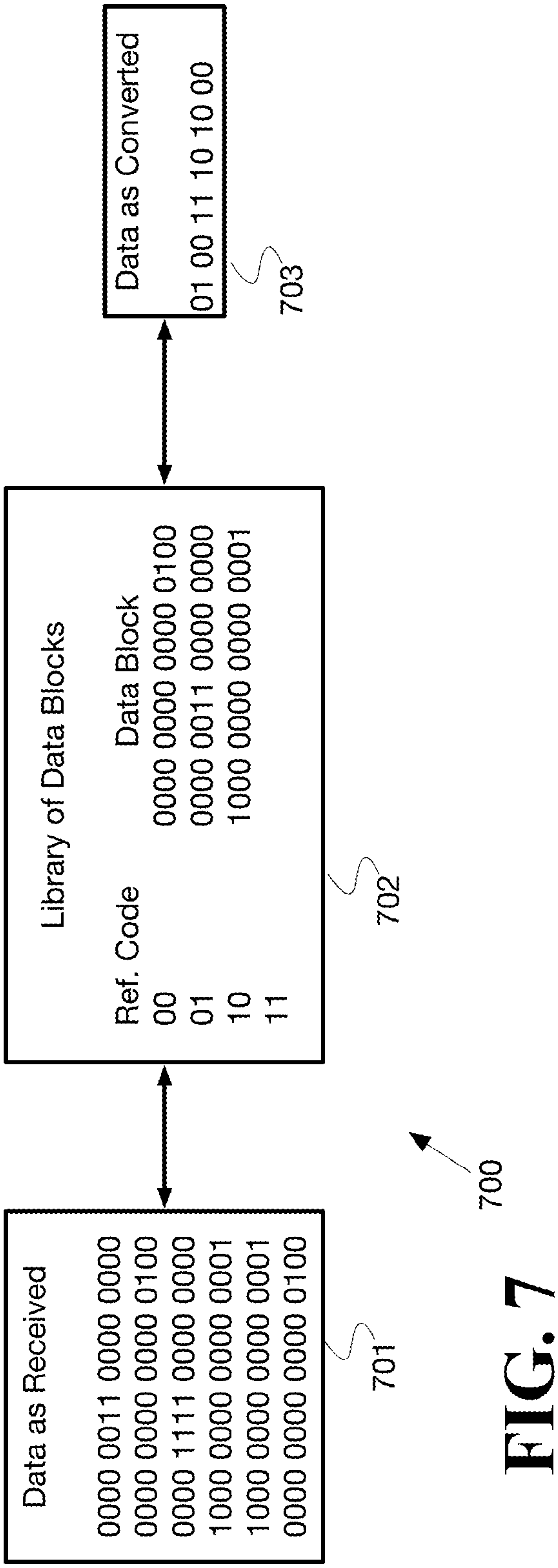
FIG. 7 is a diagram showing an example of how data might be converted into reference codes using an aspect of an embodiment.

FIG. 7 is a diagram showing an example of how data might be converted into reference codes using an aspect of an embodiment 700. As data is received 701, it is read by the processor in sourceblocks of a size dynamically determined by the previously disclosed sourceblock size optimizer 410. In this example, each sourceblock is 16 bits in length, and the library 702 initially contains three sourceblocks with reference codes 00, 01, and 10. The entry for reference code 11 is initially empty. As each 16 bit sourceblock is received, it is compared with the library. If that sourceblock is already contained in the library, it is assigned the corresponding reference code. So, for example, as the first line of data (0000 0011 0000 0000) is received, it is assigned the reference code (01) associated with that sourceblock in the library. If that sourceblock is not already contained in the library, as is the case with the third line of data (0000 1111 0000 0000) received in the example, that sourceblock is added to the library and assigned a reference code, in this case 11. The data is thus converted 703 to a series of reference codes to sourceblocks in the library. The data is stored as a collection of codewords, each of which contains the reference code to a sourceblock and information about the location of the sourceblocks in the data set. Reconstructing the data is performed by reversing the process. Each stored reference code in a data collection is compared with the reference codes in the library, the corresponding sourceblock is read from the library, and the data is reconstructed into its original form.

Figure 8:
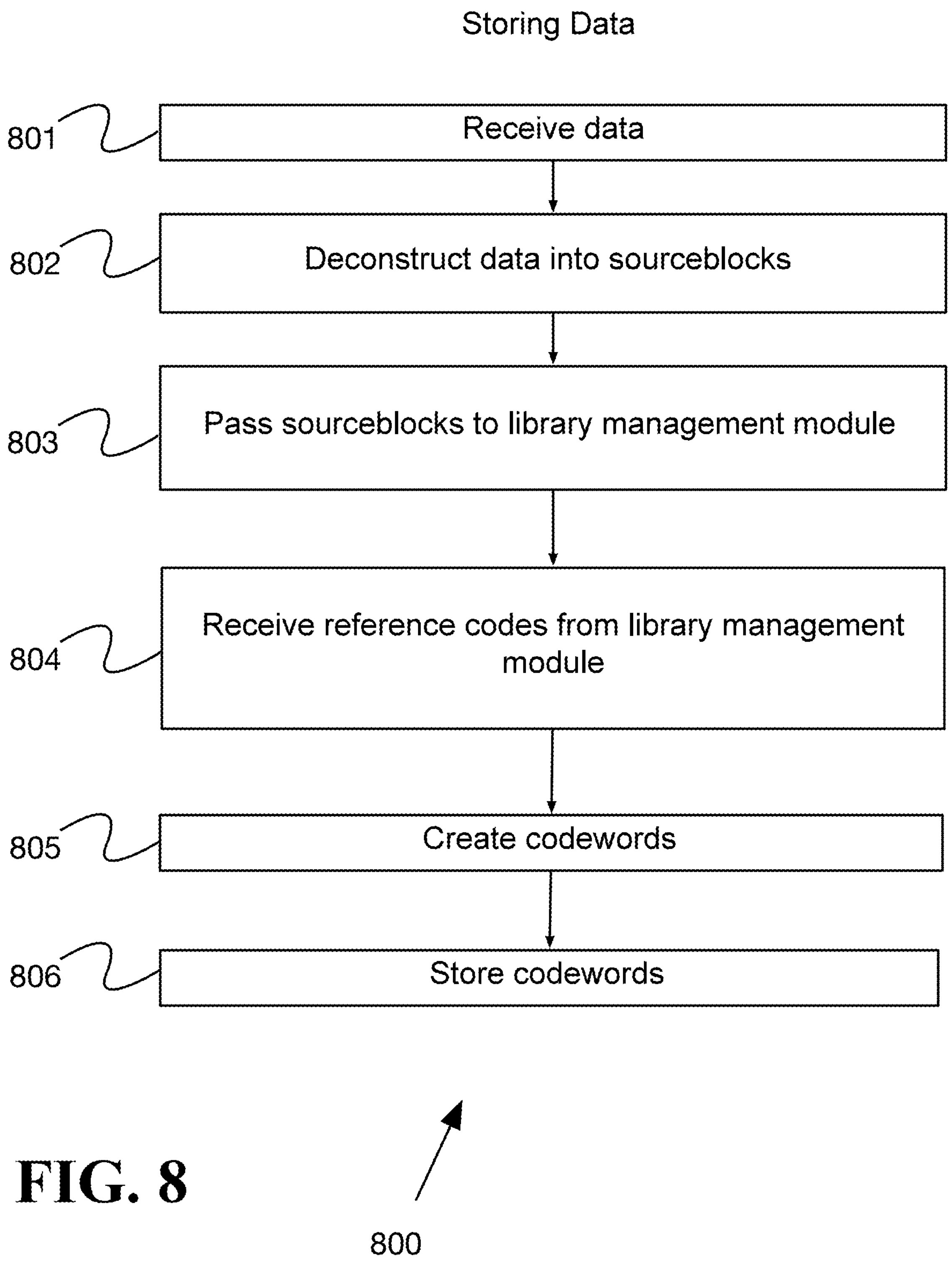
FIG. 8 is a method diagram showing the steps involved in using an embodiment to store data.

FIG. 8 is a method diagram showing the steps involved in using an embodiment 800 to store data. As data is received 801, it would be deconstructed into sourceblocks 802, and passed 803 to the library management module for processing. Reference codes would be received back 804 from the library management module, and could be combined with location information to create codewords 805, which would then be stored 806 as representations of the original data.

Figure 9:
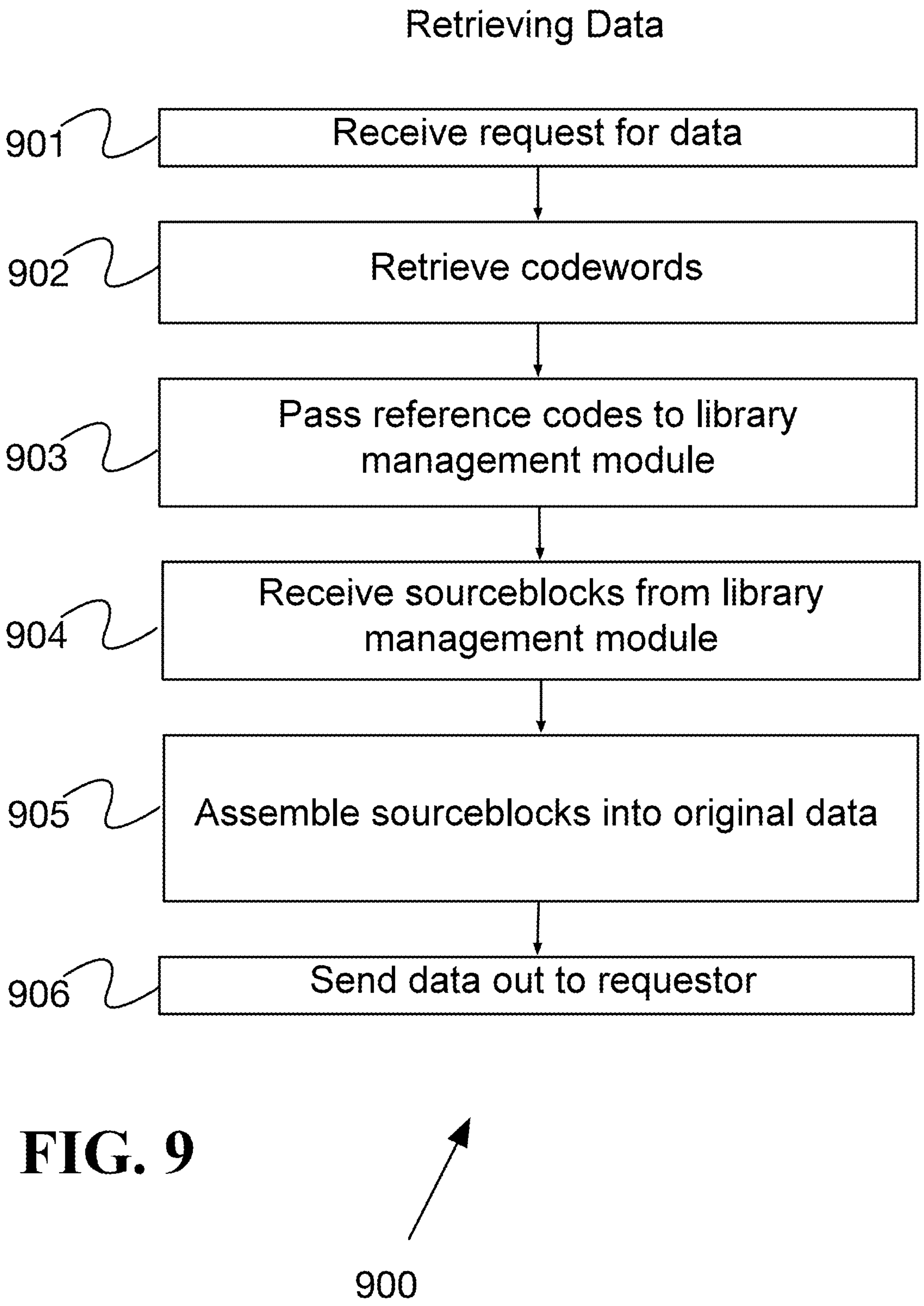
FIG. 9 is a method diagram showing the steps involved in using an embodiment to retrieve data.

FIG. 9 is a method diagram showing the steps involved in using an embodiment 900 to retrieve data. When a request for data is received 901, the associated codewords would be retrieved 902 from the library. The codewords would be passed 903 to the library management module, and the associated sourceblocks would be received back 904. Upon receipt, the sourceblocks would be assembled 905 into the original data using the location data contained in the codewords, and the reconstructed data would be sent out 906 to the requestor.

Figure 10:
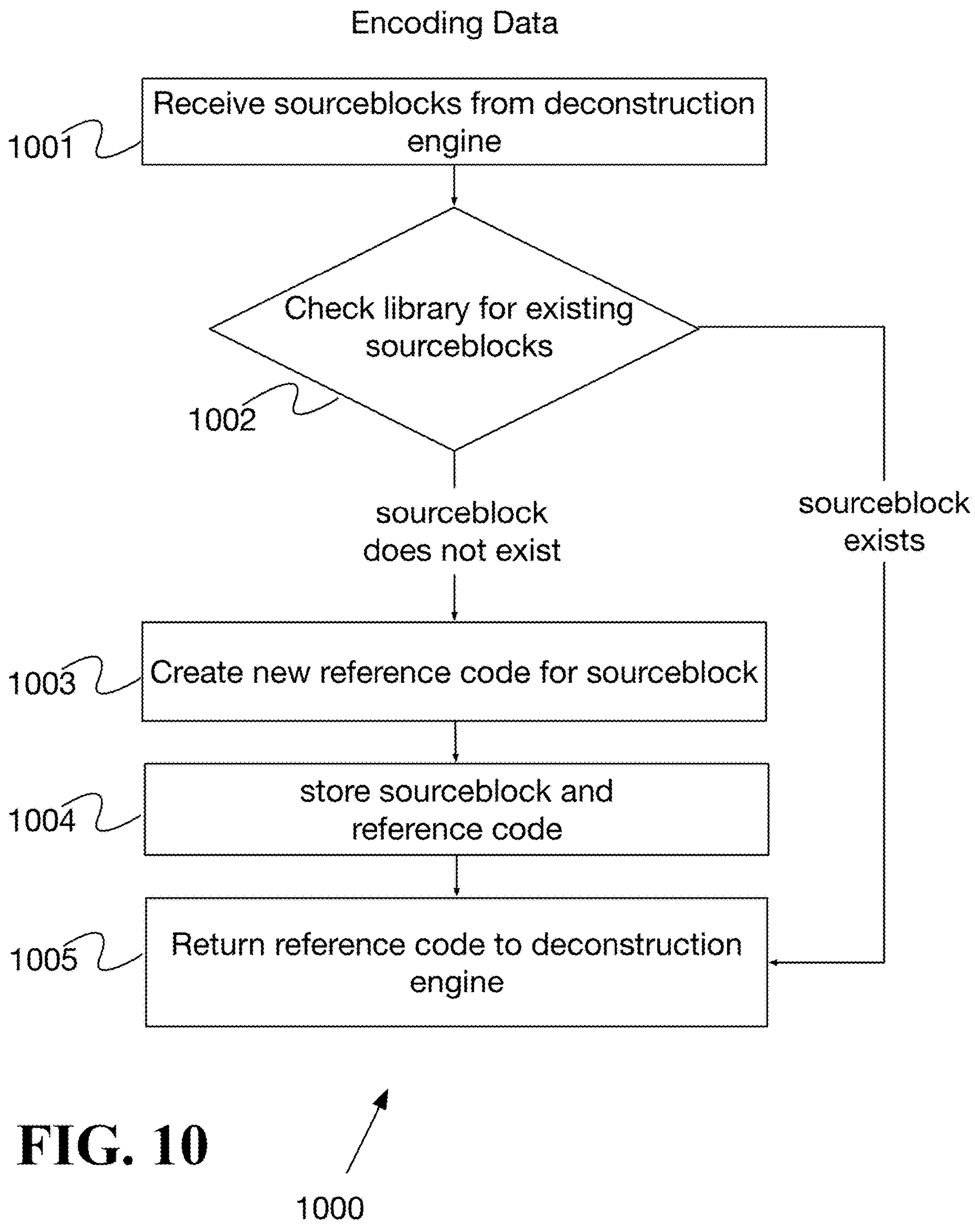
FIG. 10 is a method diagram showing the steps involved in using an embodiment to encode data.

FIG. 10 is a method diagram showing the steps involved in using an embodiment 1000 to encode data. As sourceblocks are received 1001 from the deconstruction engine, they would be compared 1002 with the sourceblocks already contained in the library. If that sourceblock already exists in the library, the associated reference code would be returned 1005 to the deconstruction engine. If the sourceblock does not already exist in the library, a new reference code would be created 1003 for the sourceblock. The new reference code and its associated sourceblock would be stored 1004 in the library, and the reference code would be returned to the deconstruction engine.

Figure 11:
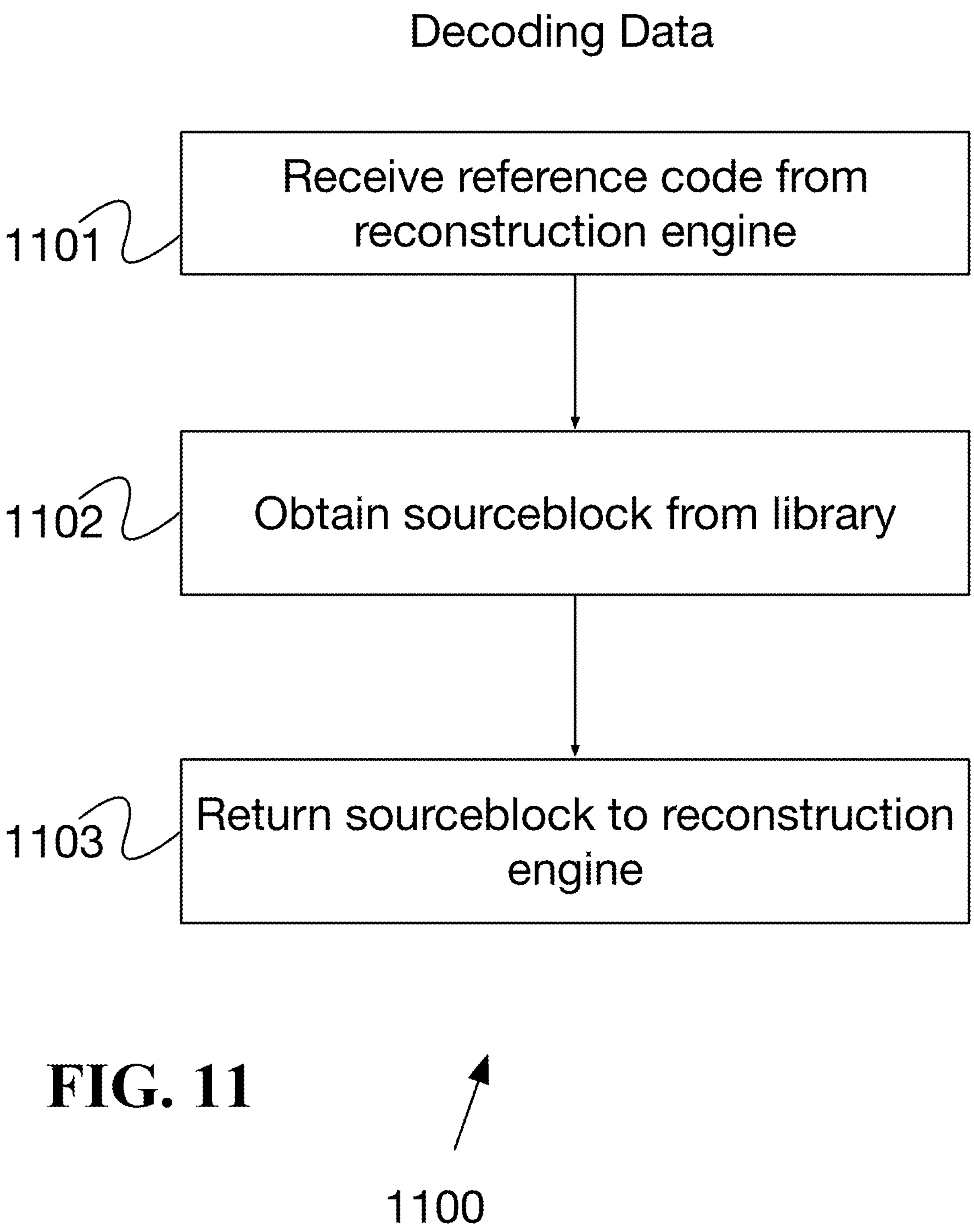
FIG. 11 is a method diagram showing the steps involved in using an embodiment to decode data.

FIG. 11 is a method diagram showing the steps involved in using an embodiment 1100 to decode data. As reference codes are received 1101 from the reconstruction engine, the associated sourceblocks are retrieved 1102 from the library, and returned 1103 to the reconstruction engine.

Figure 16:
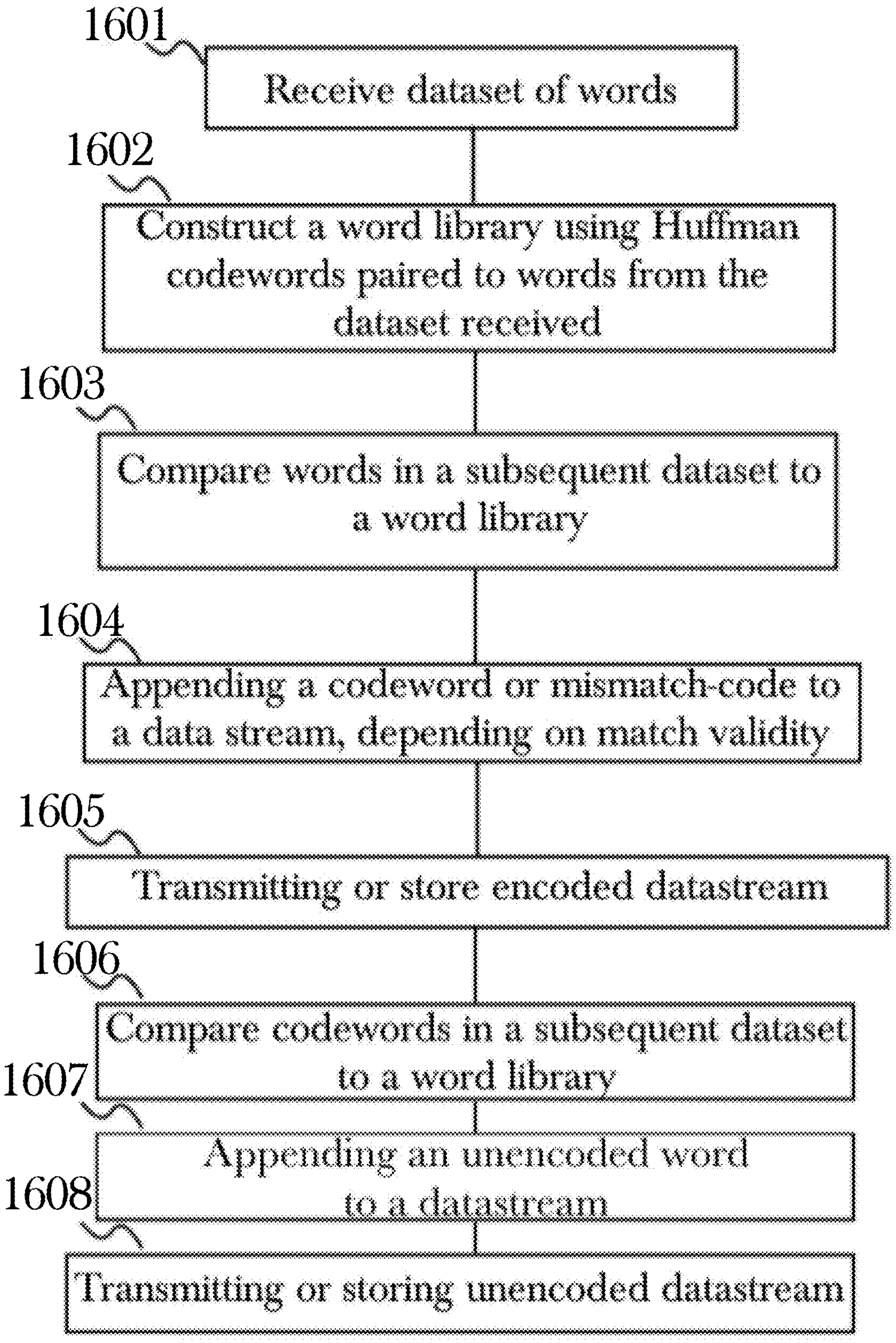
FIG. 16 is a method diagram illustrating key system functionality utilizing an encoder and decoder pair.

FIG. 16 is a method diagram illustrating key system functionality utilizing an encoder and decoder pair, according to a preferred embodiment. In a first step 1601, at least one incoming data set may be received at a customized library generator 1300 that then 1602 processes data to produce a customized word library 1201 comprising key-value pairs of data words (each comprising a string of bits) and their corresponding calculated binary Huffman codewords. A subsequent dataset may be received, and compared to the word library 1603 to determine the proper codewords to use in order to encode the dataset. Words in the dataset are checked against the word library and appropriate encodings are appended to a data stream 1604. If a word is mismatched within the word library and the dataset, meaning that it is present in the dataset but not the word library, then a mismatched code is appended, followed by the unencoded original word. If a word has a match within the word library, then the appropriate codeword in the word library is appended to the data stream. Such a data stream may then be stored or transmitted 1605 to a destination as desired. For the purposes of decoding, an already-encoded data stream may be received and compared 1606, and un-encoded words may be appended to a new data stream 1607 depending on word matches found between the encoded data stream and the word library that is present. A matching codeword that is found in a word library is replaced with the matching word and appended to a data stream, and a mismatch code found in a data stream is deleted and the following unencoded word is re-appended to a new data stream, the inverse of the process of encoding described earlier. Such a data stream may then be stored or transmitted 1608 as desired.

Figure 17:
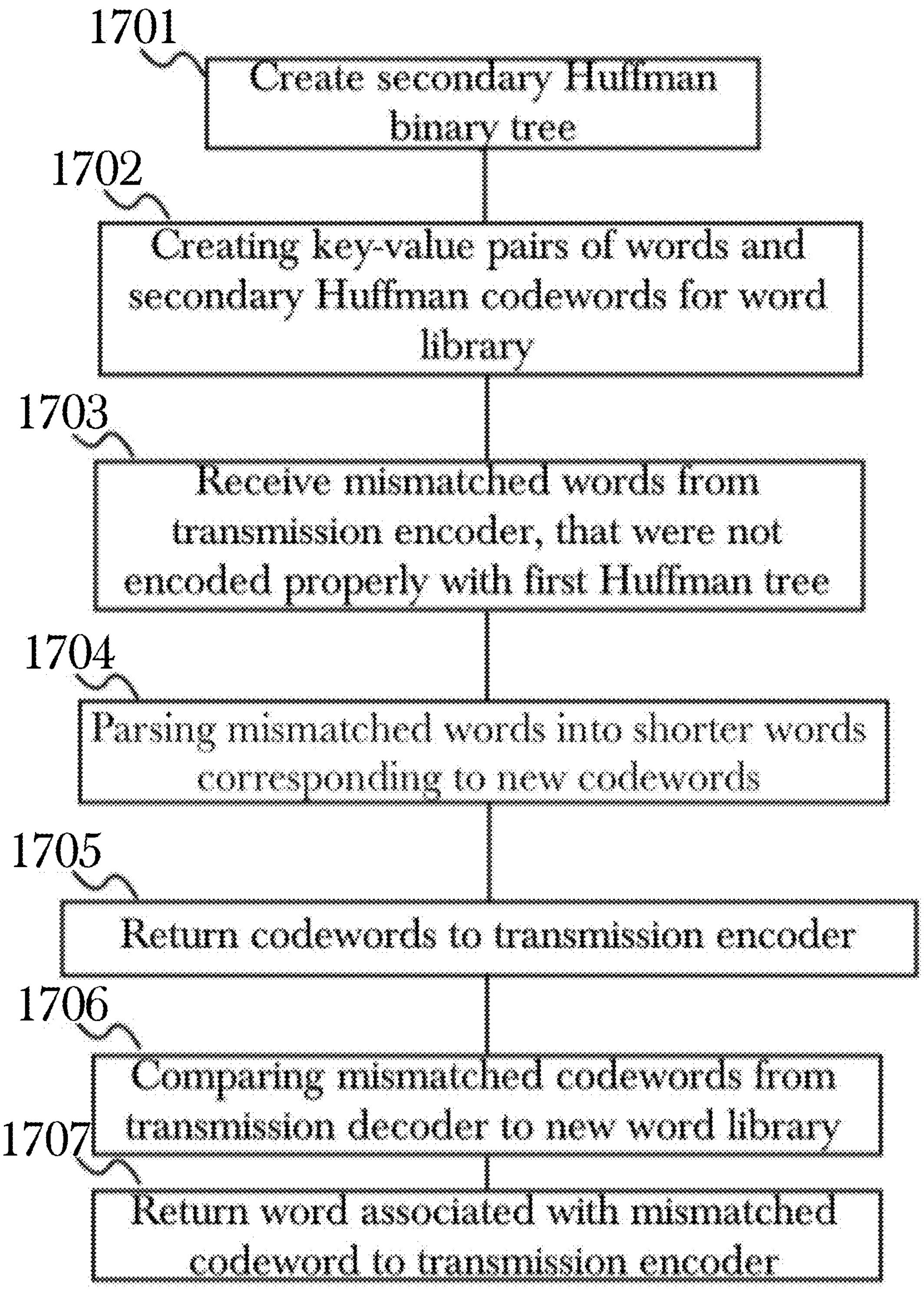
FIG. 17 is a method diagram illustrating possible use of a hybrid encoder/decoder to improve the compression ratio.

FIG. 17 is a method diagram illustrating possible use of a hybrid encoder/decoder to improve the compression ratio, according to a preferred aspect. A second Huffman binary tree may be created 1701, having a shorter maximum length of codewords than a first Huffman binary tree 1602, allowing a word library to be filled with every combination of codeword possible in this shorter Huffman binary tree 1702. A word library may be filled with these Huffman codewords and words from a dataset 1702, such that a hybrid encoder/decoder 1304, 1503 may receive any mismatched words from a dataset for which encoding has been attempted with a first Huffman binary tree 1703, 1604 and parse previously mismatched words into new partial codewords (that is, codewords that are each a substring of an original mismatched codeword) using the second Huffman binary tree 1704. In this way, an incomplete word library may be supplemented by a second word library. New codewords attained in this way may then be returned to a transmission encoder 1705, 1500. In the event that an encoded dataset is received for decoding, and there is a mismatch code indicating that additional coding is needed, a mismatch code may be removed and the unencoded word used to generate a new codeword as before 1706, so that a transmission encoder 1500 may have the word and newly generated codeword added to its word library 1707, to prevent further mismatching and errors in encoding and decoding.

It will be recognized by a person skilled in the art that the methods described herein can be applied to data in any form.

For example, the method described herein could be used to store genetic data, which has four data units: C, G, A, and T. Those four data units can be represented as 2 bit sequences: 00, 01, 10, and 11, which can be processed and stored using the method described herein.

It will be recognized by a person skilled in the art that certain embodiments of the methods described herein may have uses other than data storage. For example, because the data is stored in reference code form, it cannot be reconstructed without the availability of the library of source-blocks. This is effectively a form of encryption, which could be used for cyber security purposes. As another example, an embodiment of the method described herein could be used to store backup copies of data, provide for redundancy in the event of server failure, or provide additional security against cyberattacks by distributing multiple partial copies of the library among computers are various locations, ensuring that at least two copies of each sourceblock exist in different locations within the network.

Figure 18:
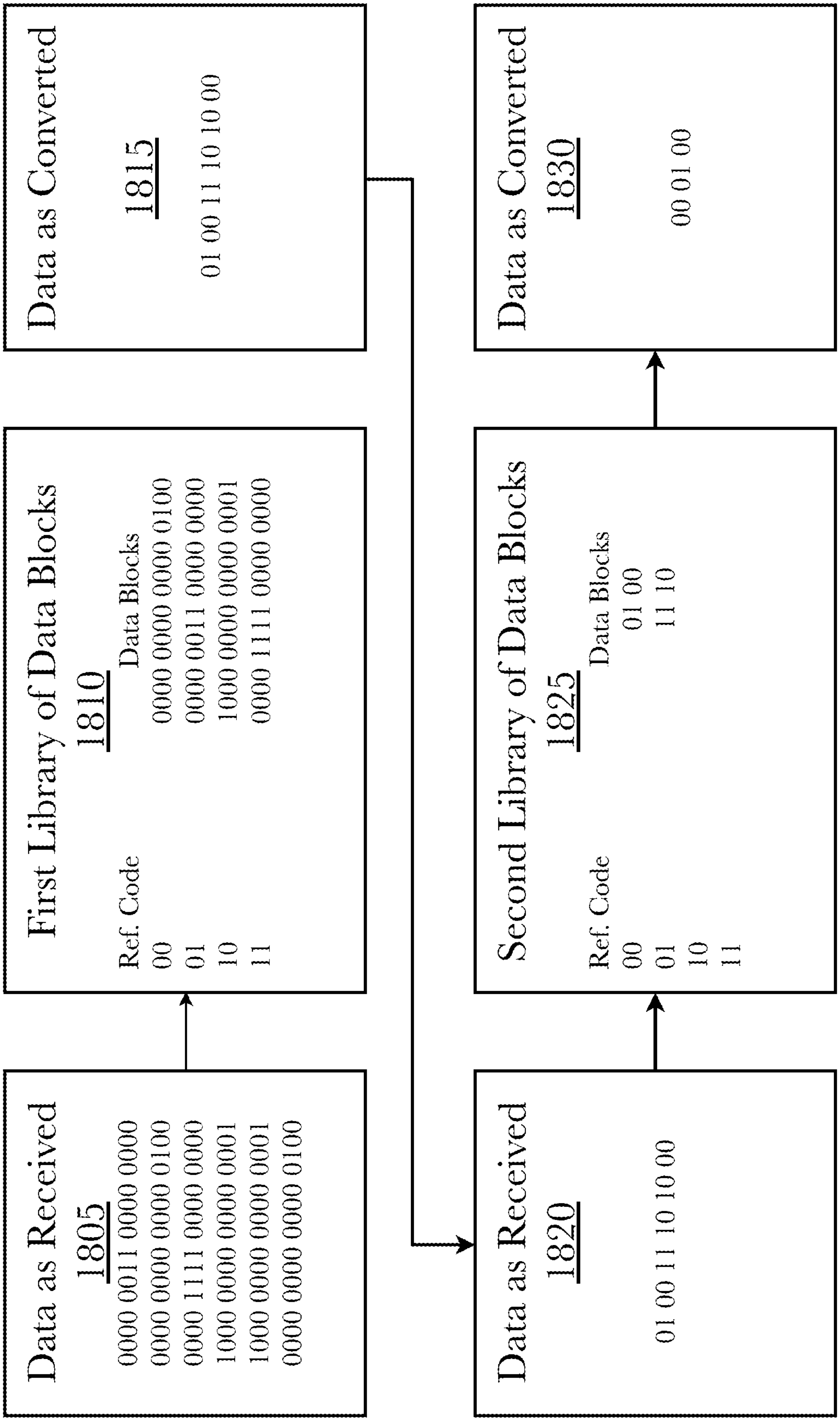
FIG. 18 is a flow diagram illustrating the use of a data encoding system used to recursively encode data to further reduce data size.

FIG. 18 is a flow diagram illustrating the use of a data encoding system used to recursively encode data to further reduce data size. Data may be input 1805 into a data deconstruction engine 102 to be deconstructed into code references, using a library of code references based on the input 1810. Such example data is shown in a converted, encoded format 1815, highly compressed, reducing the example data from 96 bits of data, to 12 bits of data, before sending this newly encoded data through the process again 1820, to be encoded by a second library 1825, reducing it even further. The newly converted data 1830 is shown as only 6 bits in this example, thus a size of 6.25% of the original data packet. With recursive encoding, then, it is possible and implemented in the system to achieve increasing compression ratios, using multi-layered encoding, through recursively encoding data. Both initial encoding libraries 1810 and subsequent libraries 1825 may be achieved through machine learning techniques to find optimal encoding patterns to reduce size, with the libraries being distributed to recipients prior to transfer of the actual encoded data, such that only the compressed data 1830 must be transferred or stored, allowing for smaller data footprints and bandwidth requirements. This process can be reversed to reconstruct the data. While this example shows only two levels of encoding, recursive encoding may be repeated any number of times. The number of levels of recursive encoding will depend on many factors, a non-exhaustive list of which includes the type of data being encoded, the size of the original data, the intended usage of the data, the number of instances of data being stored, and available storage space for codebooks and libraries. Additionally, recursive encoding can be applied not only to data to be stored or transmitted, but also to the codebooks and/or libraries, themselves. For example, many installations of different libraries could take up a substantial amount of storage space. Recursively encoding those different libraries to a single, universal library would dramatically reduce the amount of storage space required, and each different library could be reconstructed as necessary to reconstruct incoming streams of data.

Figure 20:
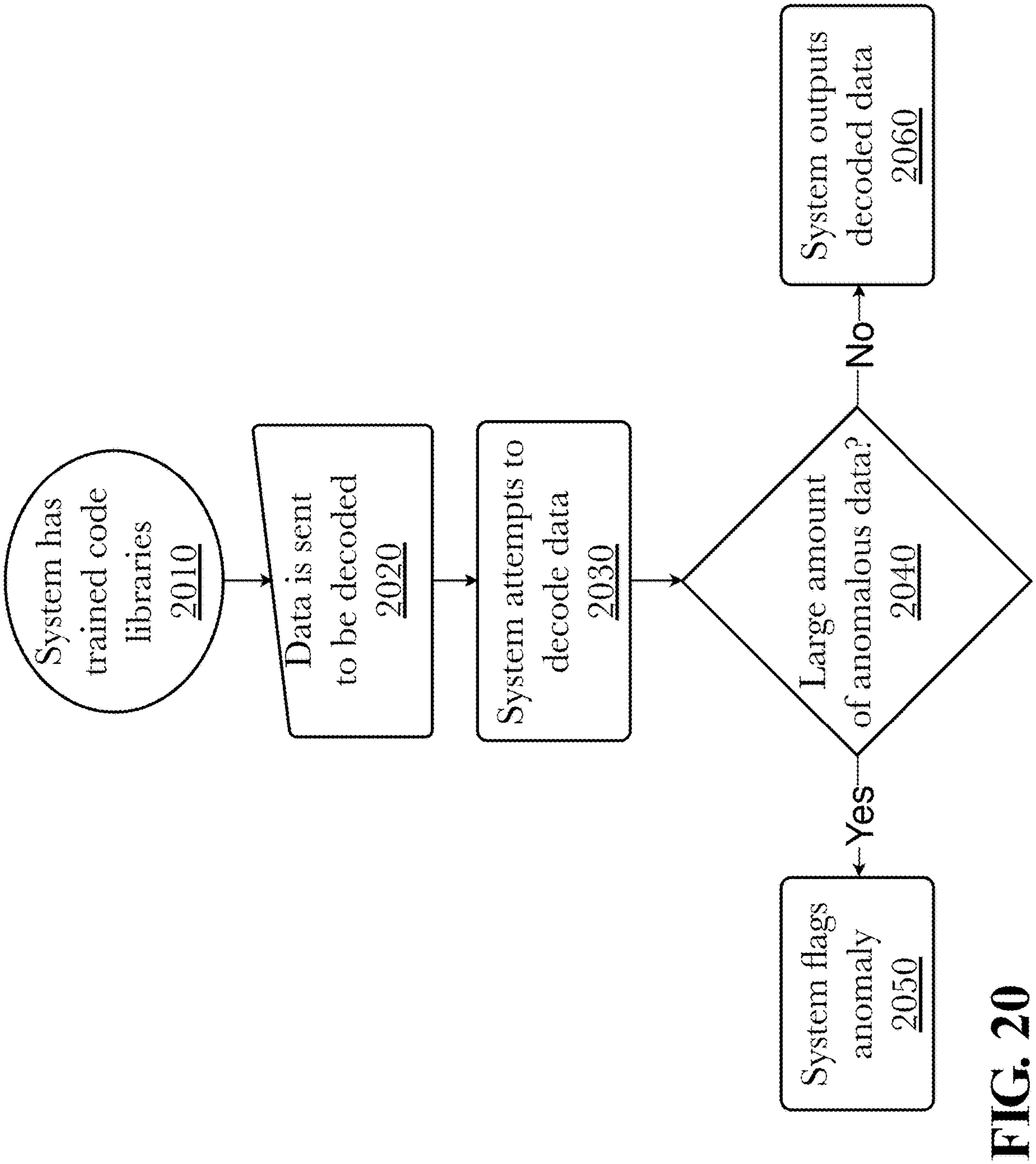
FIG. 20 is a flow diagram of an exemplary method used to detect anomalies in received encoded data and producing a warning.

FIG. 20 is a flow diagram of an exemplary method used to detect anomalies in received encoded data and producing a warning. A system may have trained encoding libraries 2010, before data is received from some source such as a network connected device or a locally connected device including USB connected devices, to be decoded 2020. Decoding in this context refers to the process of using the encoding libraries to take the received data and attempt to use encoded references to decode the data into its original source 2030, potentially more than once if recursive encoding was used, but not necessarily more than once. An anomaly detector 1910 may be configured to detect a large amount of un-encoded data 2040 in the midst of encoded data, by locating data or references that do not appear in the encoding libraries, indicating at least an anomaly, and potentially data tampering or faulty encoding libraries. A flag or warning is set by the system 2050, allowing a user to be warned at least of the presence of the anomaly and the characteristics of the anomaly. However, if a large amount of invalid references or unencoded data are not present in the encoded data that is attempting to be decoded, the data may be decoded and output as normal 2060, indicating no anomaly has been detected.

Figure 21:
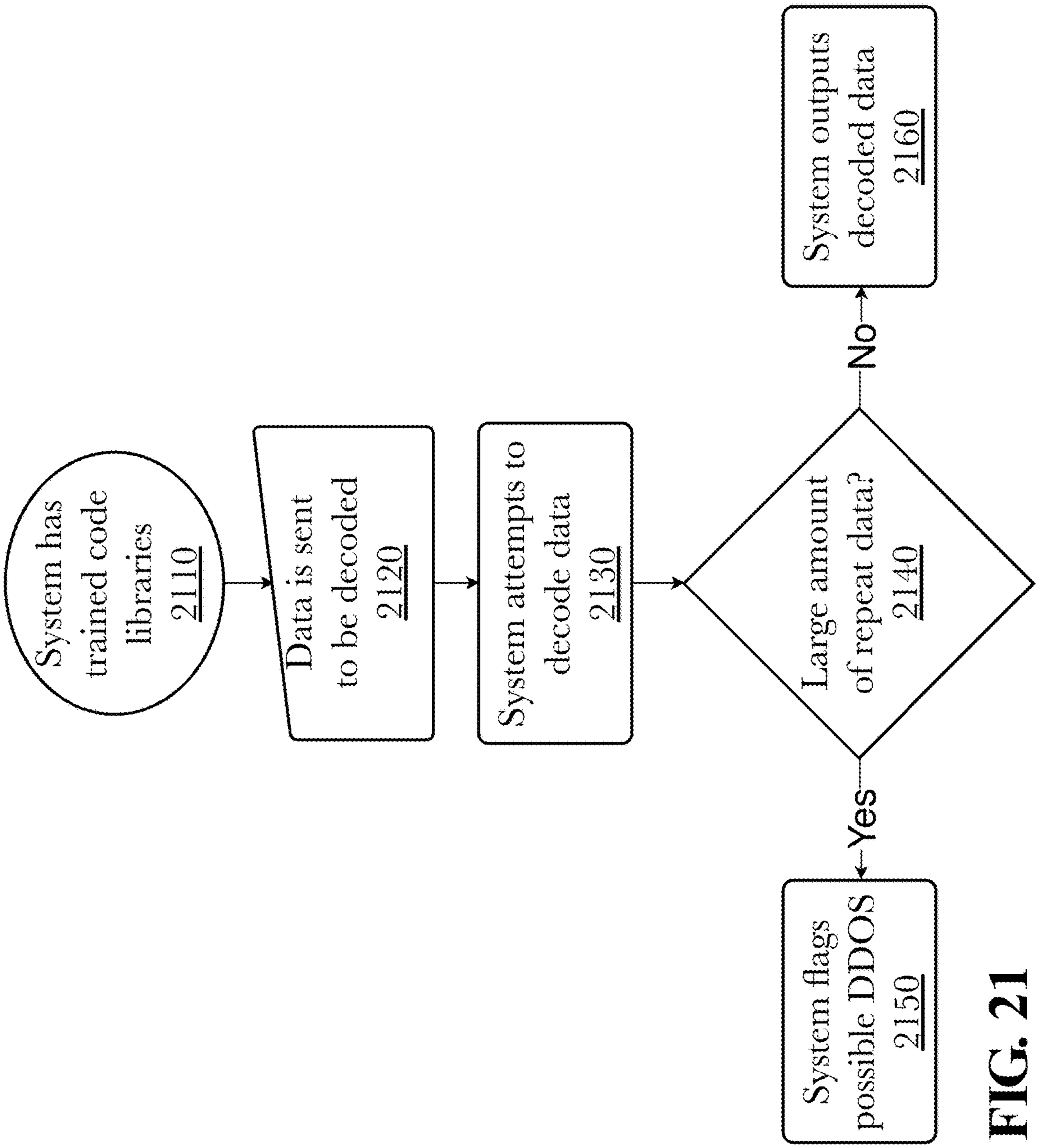
FIG. 21 is a flow diagram of a data encoding system used for Distributed Denial of Service (DDoS) attack denial.

FIG. 21 is a flow diagram of a method used for Distributed Denial of Service (DDoS) attack denial. A system may have trained encoding libraries 2110, before data is received from some source such as a network connected device or a locally connected device including USB connected devices, to be decoded 2120. Decoding in this context refers to the process of using the encoding libraries to take the received data and attempt to use encoded references to decode the data into its original source 2130, potentially more than once if recursive encoding was used, but not necessarily more than once. A DDoS detector 1920 may be configured to detect a large amount of repeating data 2140 in the encoded data, by locating data or references that repeat many times over (the number of which can be configured by a user or administrator as need be), indicating a possible DDoS attack. A flag or warning is set by the system 2150, allowing a user to be warned at least of the presence of a possible DDoS attack, including characteristics about the data and source that initiated the flag, allowing a user to then block incoming data from that source. However, if a large amount of repeat data in a short span of time is not detected, the data may be decoded and output as normal 2160, indicating no DDoS attack has been detected.

Figure 23:
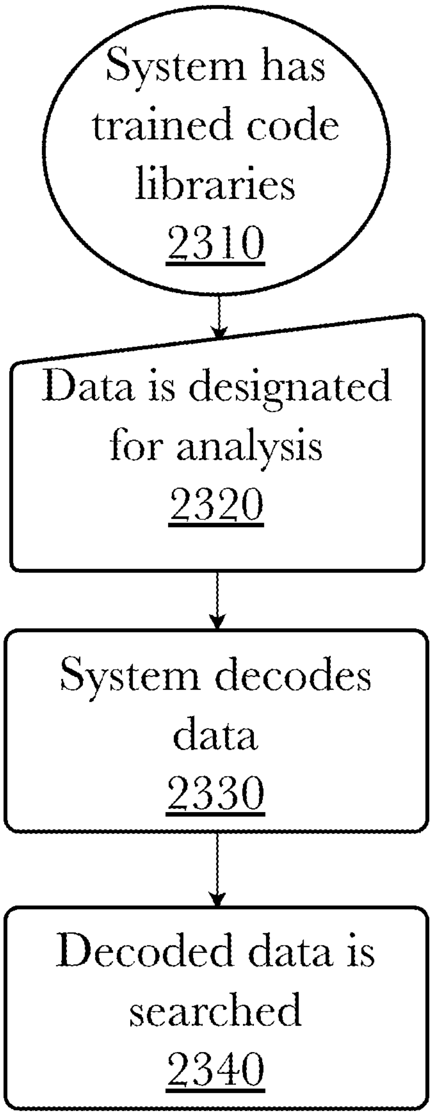
FIG. 23 is a flow diagram of an exemplary method used to enable high-speed data mining of repetitive data.

FIG. 23 is a flow diagram of an exemplary method used to enable high-speed data mining of repetitive data. A system may have trained encoding libraries 2310, before data is received from some source such as a network connected device or a locally connected device including USB connected devices, to be analyzed 2320 and decoded 2330. When determining data for analysis, users may select specific data to designate for decoding 2330, before running any data mining or analytics functions or software on the decoded data 2340. Rather than having traditional decryption and decompression operate over distributed drives, data can be regenerated immediately using the encoding libraries disclosed herein, as it is being searched. Using methods described in FIG. 9 and FIG. 11, data can be stored, retrieved, and decoded swiftly for searching, even across multiple devices, because the encoding library may be on each device. For example, if a group of servers host codewords relevant for data mining purposes, a single computer can request these codewords, and the codewords can be sent to the recipient swiftly over the bandwidth of their connection, allowing the recipient to locally decode the data for immediate evaluation and searching, rather than running slow, traditional decompression algorithms on data stored across multiple devices or transfer larger sums of data across limited bandwidth.

Figure 25:
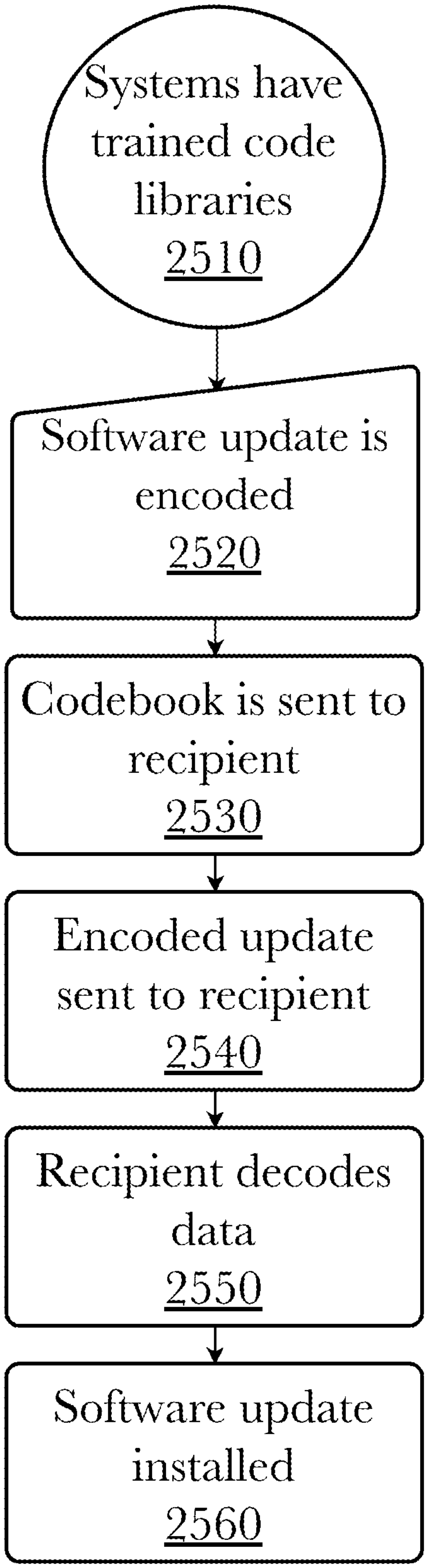
FIG. 25 is a flow diagram of an exemplary method used to encode and transfer software and firmware updates to a device for installation, for the purposes of reduced bandwidth consumption.

FIG. 25 is a flow diagram of an exemplary method used to encode and transfer software and firmware updates to a device for installation, for the purposes of reduced bandwidth consumption. A first system may have trained code libraries or "codebooks" present 2510, allowing for a software update of some manner to be encoded 2520. Such a software update may be a firmware update, operating system update, security patch, application patch or upgrade, or any other type of software update, patch, modification, or upgrade, affecting any computer system. A codebook for the patch must be distributed to a recipient 2530, which may be done beforehand and either over a network or through a local or physical connection, but must be accomplished at some point in the process before the update may be installed on the recipient device 2560. An update may then be distributed to a recipient device 2540, allowing a recipient with a codebook distributed to them 2530 to decode the update 2550 before installation 2560. In this way, an encoded and thus heavily compressed update may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 27:
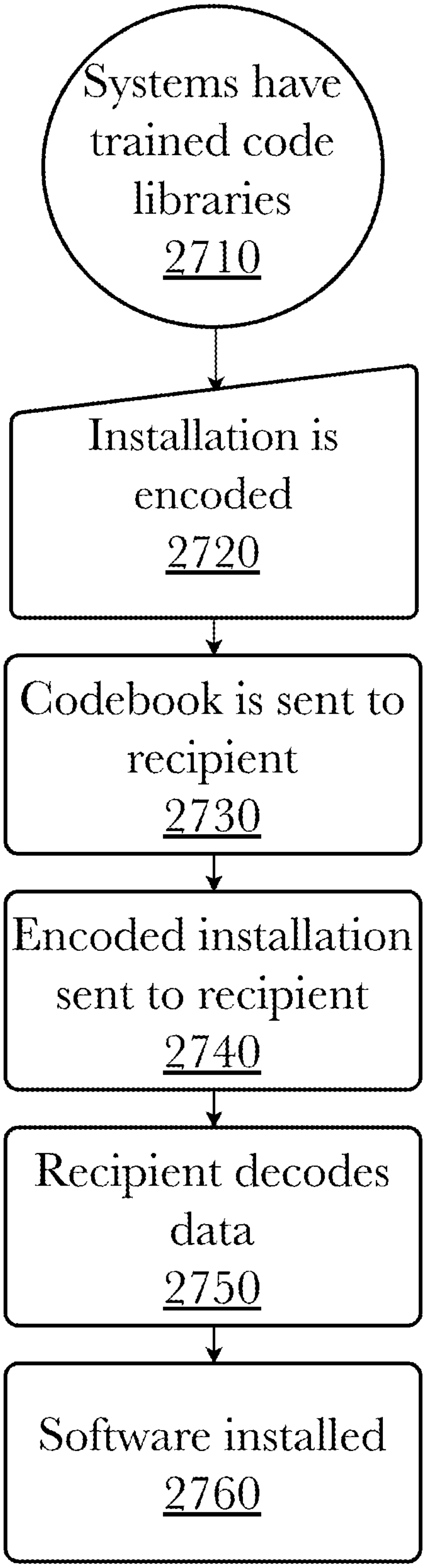
FIG. 27 is a flow diagram of an exemplary method used to encode new software and operating system installations for reduced bandwidth required for transference.

FIG. 27 is a flow diagram of an exemplary method used to encode new software and operating system installations for reduced bandwidth required for transference. A first system may have trained code libraries or "codebooks" present 2710, allowing for a software installation of some manner to be encoded 2720. Such a software installation may be a software update, operating system, security system, application, or any other type of software installation, execution, or acquisition, affecting a computer system. An encoding library or "codebook" for the installation must be distributed to a recipient 2730, which may be done beforehand and either over a network or through a local or physical connection, but must be accomplished at some point in the process before the installation can begin on the recipient device 2760. An installation may then be distributed to a recipient device 2740, allowing a recipient with a codebook distributed to them 2730 to decode the installation 2750 before executing the installation 2760. In this way, an encoded and thus heavily compressed software installation may be sent to a recipient far quicker and with less bandwidth usage than traditional lossless compression methods for data, or when sending data in uncompressed formats. This especially may benefit large distributions of software and software updates, as with enterprises updating large numbers of devices at once.

Figure 31:
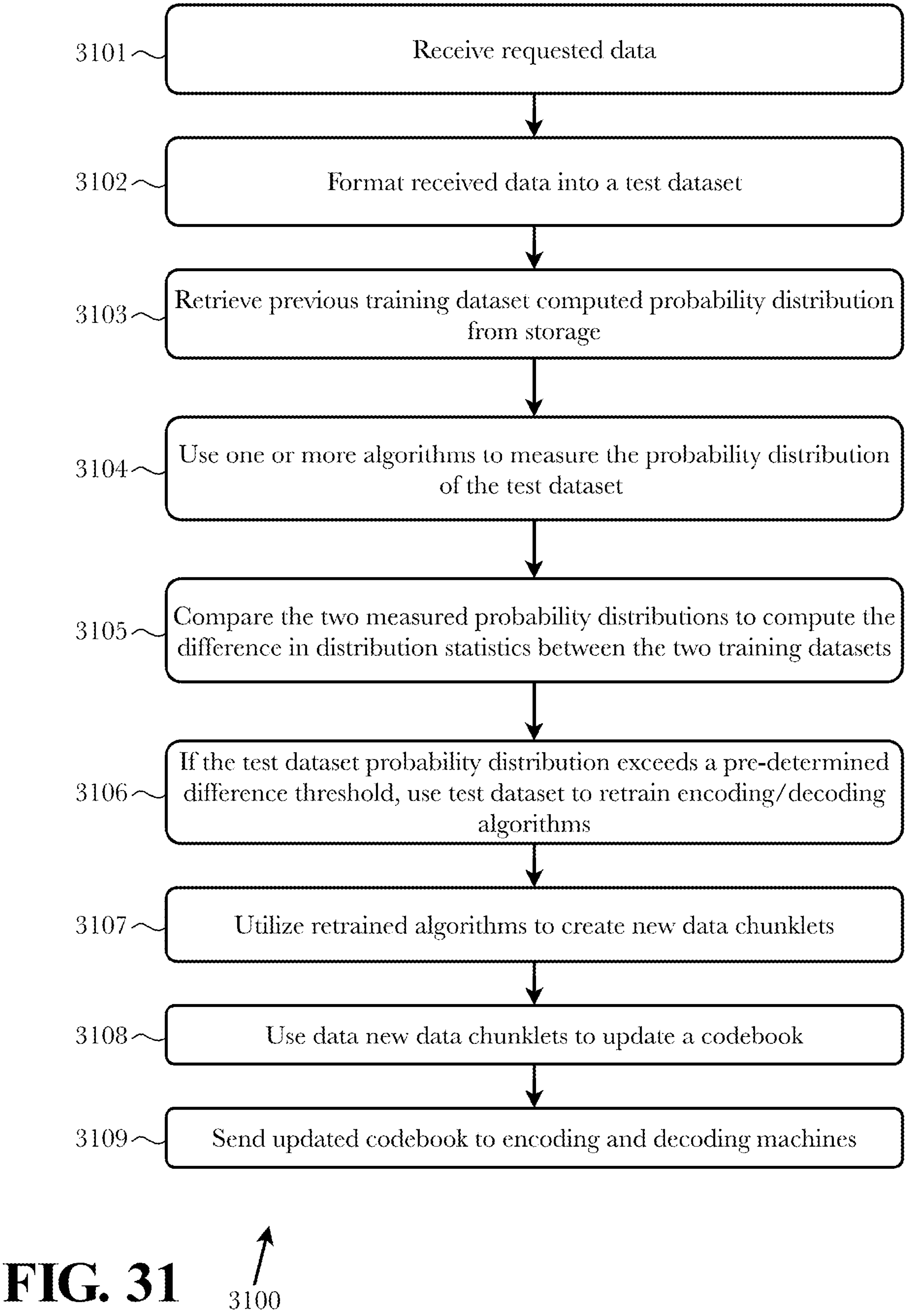
FIG. 31 is a method diagram illustrating the steps involved in using an embodiment of the codebook training system to update a codebook.

FIG. 31 is a method diagram illustrating the steps 3100 involved in using an embodiment of the codebook training system to update a codebook. The process begins when requested data is received 3101 by a codebook training module. The requested data may comprise a plurality of sourceblocks. Next, the received data may be stored in a cache and formatted into a test dataset 3102. The next step is to retrieve the previously computed probability distribution associated with the previous (most recent) training dataset from a storage device 3103. Using one or more algorithms, measure and/or estimate and record the probability distribution of the test dataset 3104. The step after that is to compare the measured/estimated probability distributions of the test dataset and the previous training dataset to compute the difference in distribution statistics between the two datasets 3105. If the test dataset probability distribution exceeds a predetermined difference threshold, then the test dataset will be used to retrain the encoding/decoding algorithms 3106 to reflect the new distribution of the incoming data to the encoder/decoder system. The retrained algorithms may then be used to create new data sourceblocks 3107 that better capture the nature of the data being received. These newly created data sourceblocks may then be used to create new codewords and update a codebook 3108 with each new data sourceblock and its associated new codeword. Last, the updated codebooks may be sent to encoding and decoding machines 3109 in order to ensure the encoding/decoding system function properly.

Figure 41:
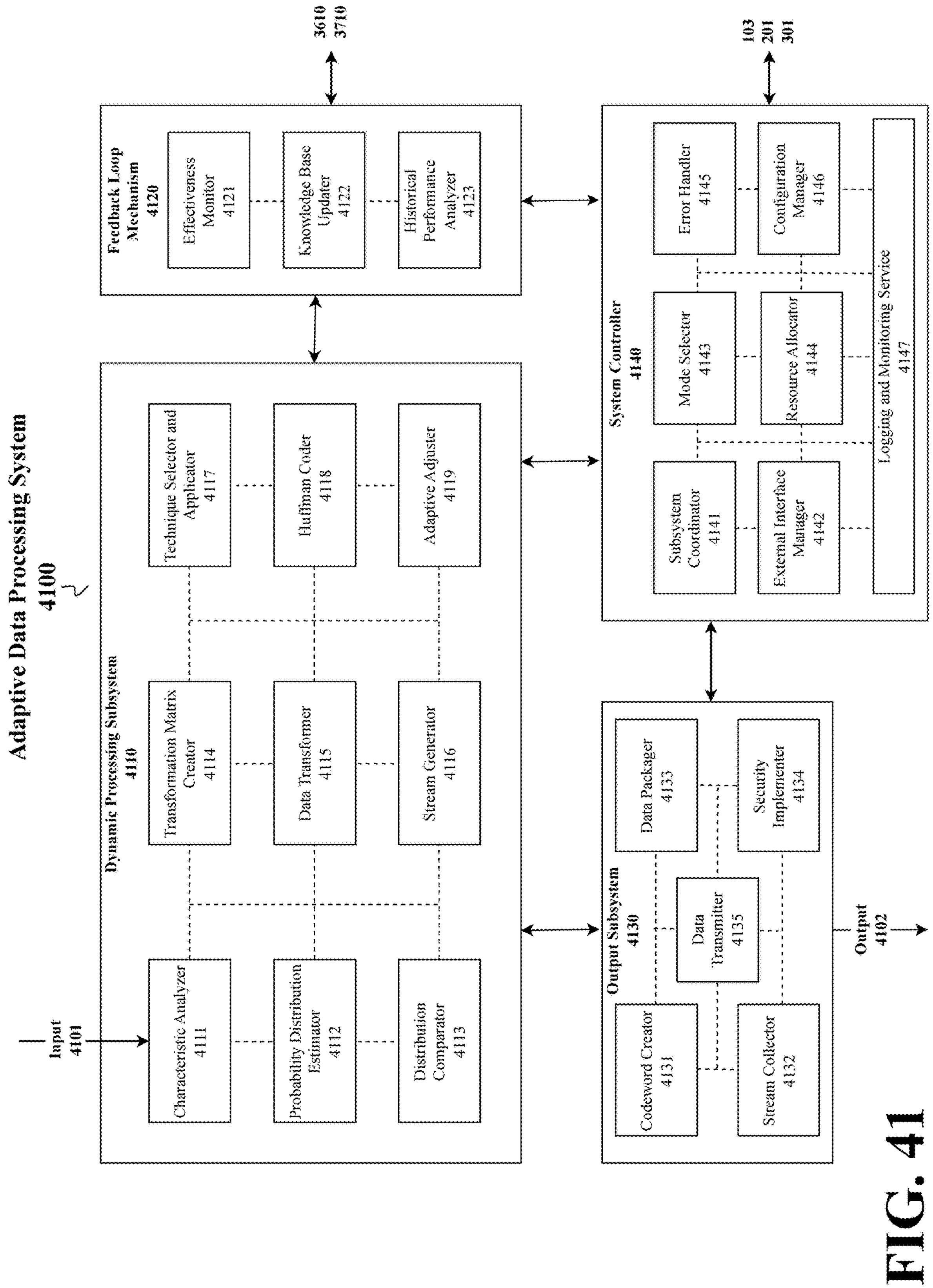
FIG. 41 is a block diagram illustrating exemplary architecture of adaptive data processing system.

Adaptive Data Processing System with Dynamic Technique Selection and Feedback-Driven Optimization FIG. 41 is a block diagram illustrating exemplary architecture of adaptive data processing system 4100. System 4100 comprises dynamic processing subsystem 4110, feedback loop mechanism 4120, output subsystem 4130, and system controller 4140. Input data 4101 enters system 4100 and is processed to produce output 4102.

Input data 4101 may come from various sources. These can include external data sources such as sensors, databases, or file systems. Network streams transmitting data over a network can also serve as input. Users may directly input data into system 4100. Additionally, data deconstruction engine 201 may pass data to system 4100 for enhanced processing. The versatility of input sources allows system 4100 to adapt to diverse data processing scenarios.

Output 4102 from system 4100 has multiple potential uses. It may be transmitted over a network to a recipient system, leveraging the efficient compression and encryption applied by system 4100. The processed data can be stored in its compressed and encrypted form for later use, optimizing storage resources. In some cases, output 4102 might be passed to other systems for additional processing or analysis. Data reconstruction engine 301 may receive output 4102 to reconstruct the original data when needed. The flexibility of output use cases demonstrates the adaptability of system 4100 to various data management and processing requirements.

Dynamic processing subsystem 4110 receives input data 4101 and performs initial analysis and processing. Characteristic analyzer 4111 examines input data 4101 to determine its type, structure, and other relevant properties. Characteristic analyzer 4111 may employ machine learning techniques such as, for example, convolutional neural networks for image data classification or recurrent neural networks for time-series data analysis. This information is passed to probability distribution estimator 4112, which calculates an estimated probability distribution of the input data. Probability distribution estimator 4112 might, in some implementations, use kernel density estimation or Bayesian inference techniques to estimate the distribution of input data. Distribution comparator 4113 then compares this estimated distribution with a previous training dataset distribution retrieved from monitoring database. One approach in an embodiment for the distribution comparator 4113 is to use statistical distance measures such as Kullback-Leibler divergence or Wasserstein distance to quantify the difference between distributions. Based on this comparison, transformation matrix creator 4114 generates a matrix to transform the input data. The transformation matrix creator 4114 may, in some cases, employ singular value decomposition or principal component analysis to generate efficient transformation matrices. Data transformer 4115 applies this matrix to convert the input data into a dyadic distribution. Stream generator 4116 then produces a main data stream of transformed data and a secondary stream containing transformation information. Technique selector and applicator 4117 chooses and implements appropriate processing algorithms based on the data characteristics and current system performance. In certain implementations, the technique selector and applicator 4117 may use a decision tree algorithm or a reinforcement learning model to dynamically select optimal processing techniques. Huffman coder 4118 compresses the main data stream using Huffman coding. While Huffman coding is used in this example, other entropy encoding techniques such as arithmetic coding or range coding could also be employed by the system. Adaptive adjuster 4119 fine-tunes the selection and application of processing techniques based on real-time performance metrics. In an embodiment, characteristic analyzer 4111 receives data from data deconstruction engine 201, analyzing it before source-block creation. Technique selector and applicator 4117 interfaces with compression engine 3610, determining optimal compression strategies.

Feedback loop mechanism 4120 monitors and optimizes system performance over time. Effectiveness monitor 4121 tracks the performance of applied processing techniques, collecting metrics such as compression ratio and processing time. The effectiveness monitor 4121 might utilize statistical process control techniques or anomaly detection algorithms to identify significant changes in system performance in various embodiments. This data is passed to knowledge base updater 4122, which stores and organizes the performance information. Historical performance analyzer 4123 examines this accumulated data to identify trends and patterns, generating insights to improve future processing decisions. In some implementations, the historical performance analyzer 4123 could use time series forecasting methods like ARIMA or machine learning techniques such as long short-term memory (LSTM) networks to predict future performance trends. Effectiveness monitor 4121 collects performance data from compression engine 3610 and decompression engine 3710, incorporating this information into its analysis.

Output subsystem 4130 prepares the processed data for transmission or storage. Codeword creator 4131 generates new codewords for the processed data segments. Stream combiner 4132 merges the compressed main data stream with the secondary stream containing transformation information. Data packager 4133 adds metadata describing the applied processing techniques to the combined data stream. Security implementer 4134 applies encryption and other protective measures to the packaged data. The security implementer 4134 may employ a variety of encryption algorithms, such as AES for symmetric encryption or RSA for asymmetric encryption, depending on the security requirements of the data. Data transmitter 4135 then sends the secured, packaged data to its intended destination. In an embodiment, data packager 4133 prepares processed data and metadata for data reconstruction engine 301, ensuring compatibility with existing reconstruction processes.

System controller 4140 oversees and coordinates the operations of all other subsystems. Subsystem coordinator 4141 manages interactions between dynamic processing subsystem 4110, feedback loop mechanism 4120, and output subsystem 4130, ensuring proper sequencing of operations. Subsystem coordinator 4141 may comprise a state machine implementation and a task scheduler to manage the workflow between subsystems. It may include inter-process communication protocols and synchronization mechanisms to prevent conflicts.

External interface manager 4142 handles communication with existing systems such as data deconstruction engine 201, compression engine 3610, and library manager 103. External interface manager 4142 may include a set of API adapters for various external systems, data format converters, and a message queue system for managing data input and output flows. Mode selector 4143 determines the operating mode (lossless, lossy, or modified lossless) based on current conditions and requirements. Mode selector 4143 may incorporate a decision engine with predefined rules and thresholds, as well as a configuration interface for updating these rules based on system requirements.

Resource allocator 4144 optimizes the use of computational resources across subsystems. Resource allocator 4144 may include a resource monitoring subsystem, a predictive modeling component for anticipating resource needs, and/or a dynamic allocation algorithm for distributing resources based on current demands and priorities. Error handler 4145 detects and manages error conditions, implementing recovery procedures as needed. Error handler 4145 may comprise an error logging system, a pattern recognition module for identifying recurring errors, and a set of predefined recovery procedures for different error types, depending on the embodiment.

Configuration manager 4146 maintains system-wide settings and applies updates based on performance data. Configuration Manager 4146 may include a centralized configuration database, a version control system for tracking changes, and a validation subsystem to ensure the consistency and correctness of configurations across all subsystems, based on the embodiment employed. Logging and monitoring service 4147 maintains system logs and provides real-time performance monitoring. Logging and monitoring service 4147 may incorporate a distributed logging architecture, log rotation and archiving mechanisms, real-time analytics engines for processing log data, and interfaces for integration with external monitoring and alerting systems. External interface manager 4142 facilitates communication between system 4100 and other components such as data deconstruction engine 201, library manager 103, and data reconstruction engine 301.

In operation, input data 4101 flows through dynamic processing subsystem 4110, where it is analyzed, transformed, and compressed. Feedback loop mechanism 4120 continuously monitors this process, providing insights to improve performance over time. Output subsystem 4130 then packages and secures the processed data before transmission. System controller 4140 coordinates these operations, managing resources and interactions with external systems throughout the process. The resulting output 4102 is a compressed, secure data stream optimized for efficient storage or transmission.

Figure 42:
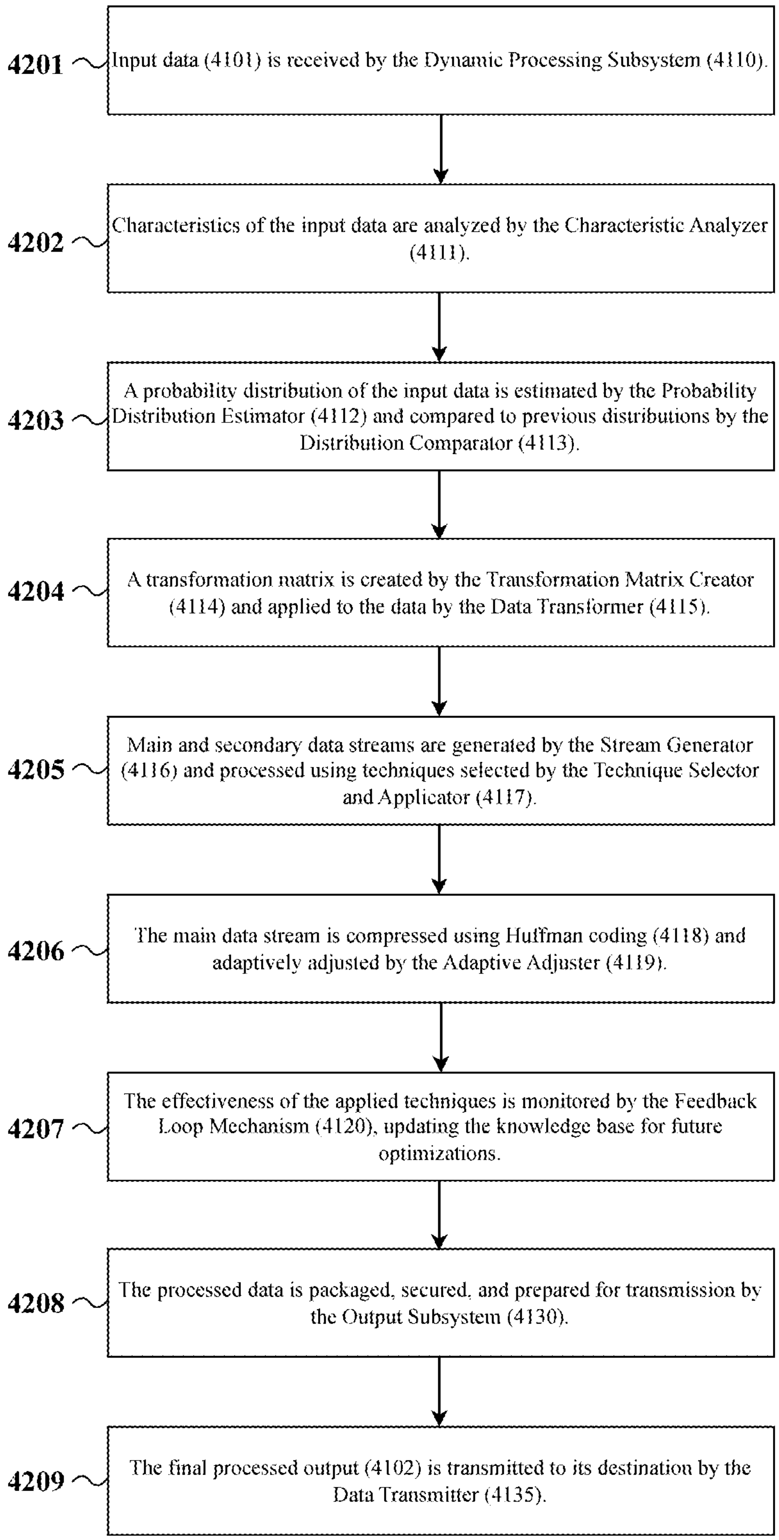
FIG. 42 is a method diagram illustrating the use of adaptive data processing system.

FIG. 42 is a method diagram illustrating the use of adaptive data processing system 4100. Input data 4101 is received by the dynamic processing subsystem 4110, where it undergoes initial processing and analysis 4201. The characteristic analyzer 4111 examines the input data to determine its type, structure, and other relevant properties 4202. A probability distribution of the input data is then estimated by the probability distribution estimator 4112 and compared to previous distributions stored in the monitoring database by the distribution comparator 4113, allowing the system to detect any significant changes in data characteristics 4203. Based on this analysis, a transformation matrix is created by the transformation matrix creator 4114 and applied to the data by the data transformer 4115, converting it into a dyadic distribution for more efficient processing 4204. The stream generator 4116 then produces main and secondary data streams, which are processed using techniques dynamically selected by the technique selector and applicator 4117 based on the analyzed characteristics and current system performance 4205. During this process, the external interface manager 4142 facilitates communication between the adaptive data processing system 4100 and other components such as the data deconstruction engine 201, library manager 103, and data reconstruction engine 301, ensuring seamless integration with the existing data processing infrastructure. The main data stream undergoes compression using Huffman coding 4118, with the adaptive adjuster 4119 fine-tuning the process based on real-time performance metrics 4206. Throughout this process, the feedback loop mechanism 4120 monitors the effectiveness of the applied techniques, updating the knowledge base with performance data to influence and optimize future processing decisions 4207. Once processing is complete, the output subsystem 4130 takes over, packaging the processed data with metadata describing the applied techniques, implementing security measures, and preparing it for transmission 4208. Finally, the data transmitter 4135 sends the fully processed and secured output 4102 to its intended destination, completing the adaptive data processing cycle 4209.

Figure 43:
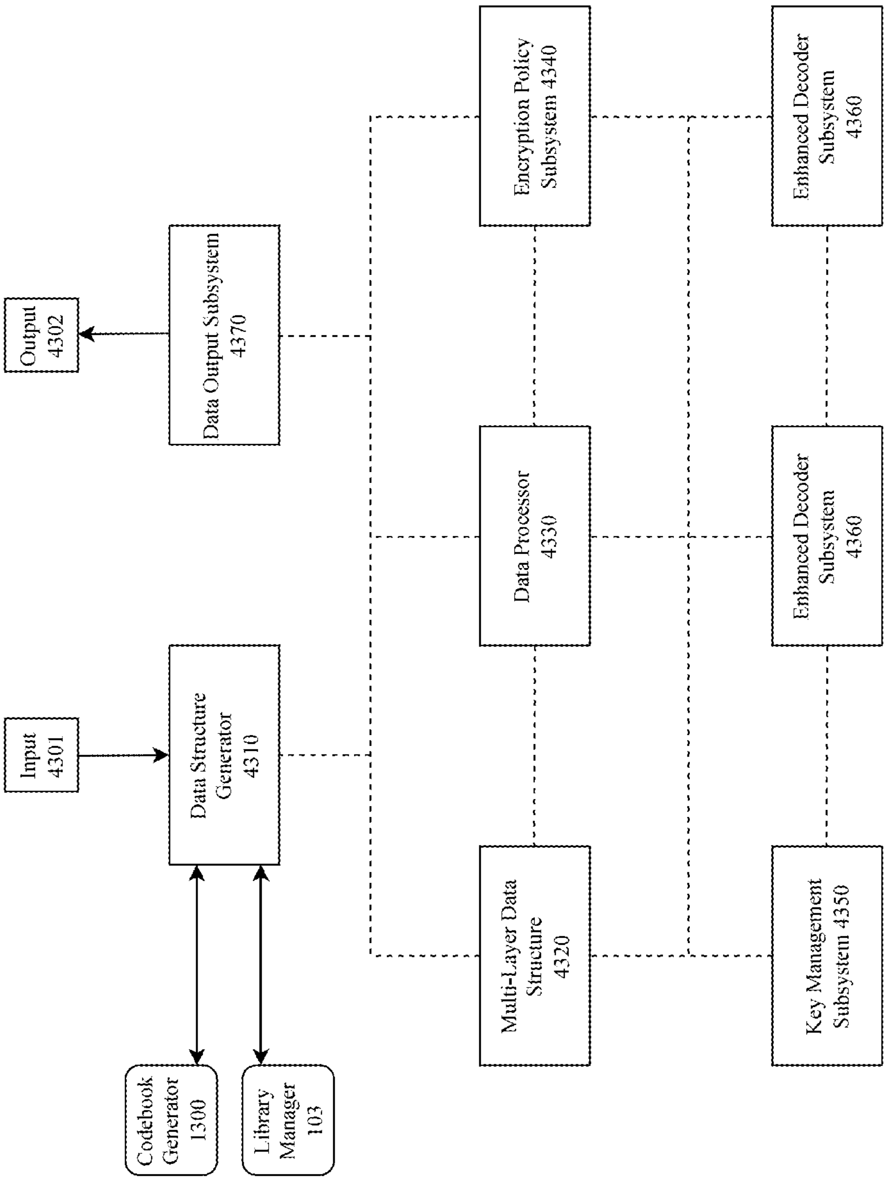
FIG. 43 is a method diagram illustrating the use of dynamic processing subsystem.

FIG. 43 is a method diagram illustrating the use of dynamic processing subsystem 4110. The process begins as input data is thoroughly analyzed by the characteristic analyzer 4111 to determine its type, structure, and other relevant properties, which may include data format, entropy levels, and potential patterns 4301. In this phase, the characteristic analyzer 4111 may receive data directly from the data deconstruction engine 201, analyzing it before source-block creation, while the technique selector and applicator 4117 interfaces with the compression engine 3610 to determine optimal compression strategies. Based on this analysis, a probability distribution of the input data is estimated by the probability distribution estimator 4112, using techniques such as histogram creation or kernel density estimation 4302. This estimated distribution is then compared to a previous training dataset distribution retrieved from the monitoring database by the distribution comparator 4113, allowing the system to detect any significant changes or drift in data characteristics 4303. Utilizing the results of this comparison and the properties of the input data, a transformation matrix is created by the transformation matrix creator 4114, designed to map the input distribution to a target dyadic distribution 4304. The data transformer 4115 then applies this matrix to transform the input data into a dyadic distribution, optimizing it for subsequent processing steps 4305. From this transformed data, the stream generator 4116 produces a main data stream of transformed data and a secondary stream containing transformation information 4306. The technique selector and applicator 4117 then dynamically chooses and implements appropriate processing techniques for these streams, based on the analyzed characteristics and current system performance 4307. The main data stream undergoes compression using Huffman coding, performed by the Huffman coder 4118, which assigns shorter codes to more frequent symbols for efficient representation 4308. Throughout this process, the adaptive adjuster 4119 continually fine-tunes the selection and application of processing techniques based on real-time performance metrics, ensuring optimal efficiency and effectiveness of the dynamic processing subsystem 4309.

Figure 44:
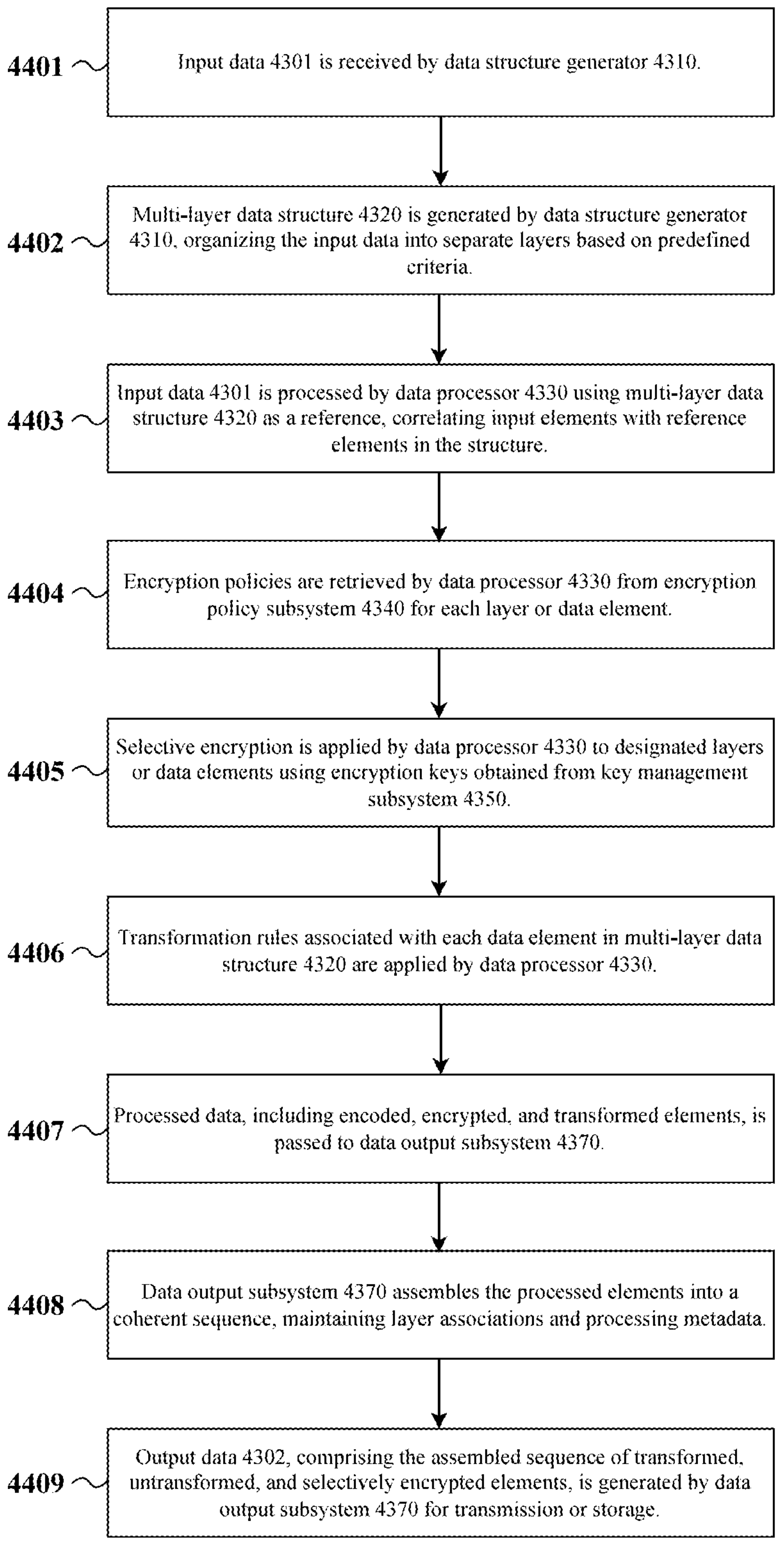
FIG. 44 is a method diagram illustrating the use of feedback loop mechanism.

FIG. 44 is a method diagram illustrating the use of feedback loop mechanism 4120. The process begins as real-time performance metrics, such as compression ratio, processing time, and error rates, are continuously collected by the effectiveness monitor 4121 from both the dynamic processing subsystem 4110 and output subsystem 4130 4401. Throughout this process, the effectiveness monitor 4121 may also collect performance data from external components such as the compression engine 3610 and decompression engine 3710, providing a comprehensive view of the entire data processing pipeline and enabling optimizations that span across multiple system components. This raw performance data is then organized and structured by the knowledge base updater 4122, transforming it into a format suitable for analysis and long-term storage 4402. The structured performance data is subsequently stored in the knowledge base, a persistent storage system managed by the knowledge base updater 4122, ensuring data integrity and consistency across updates 4403. To analyze system performance over time, historical performance data is retrieved from the knowledge base by the historical performance analyzer 4123 4404. This analyzer applies sophisticated time series analysis techniques to the retrieved data, identifying trends, patterns, and potential anomalies in system performance 4405. The historical performance analyzer 4123 then establishes correlations between performance metrics and specific processing techniques or data characteristics, providing deeper insights into the system's behavior 4406. Based on these analyses, the historical performance analyzer 4123 generates actionable insights and recommendations for optimizing processing techniques, potentially using machine learning algorithms to predict future performance 4407. These valuable insights are then fed back to the dynamic processing subsystem 4110, particularly to the adaptive adjuster 4119, enabling real-time optimization of system behavior 4408. Finally, the technique selector and applicator 4117 adjusts its selection criteria based on the received insights, effectively influencing future processing decisions and completing the feedback loop 4409. This continuous cycle of monitoring, analysis, and adjustment allows the system to learn from its own performance and constantly improve its efficiency and effectiveness.

Figure 45:
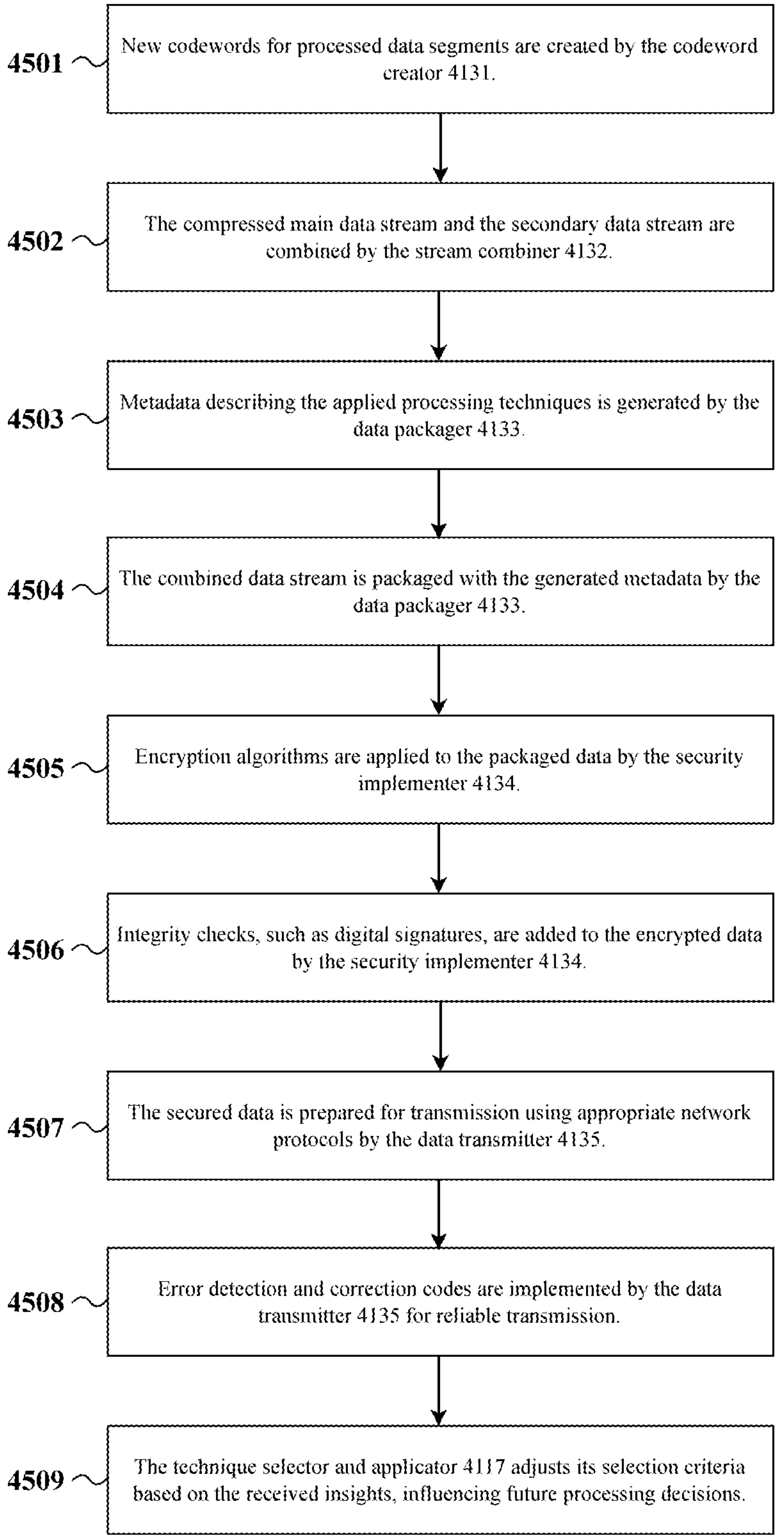
FIG. 45 is a method diagram illustrating the use of output subsystem.

FIG. 45 is a method diagram illustrating the use of output subsystem 4130. The process begins as new codewords for processed data segments are created by the codeword creator 4131, using techniques such as hash functions to generate unique identifiers for each data pattern 4501. The stream combiner 4132 then merges the compressed main data stream and the secondary data stream containing transformation information, interleaving them according to a predefined protocol 4502. Concurrently, metadata describing the applied processing techniques is generated by the data packager 4133, which may include information about compression methods and transformation parameters 4503. This metadata is then combined with the merged data stream by the data packager 4133, ensuring that all necessary information for data reconstruction is included 4504. To protect the processed data, the security implementer 4134 applies robust encryption algorithms, such as AES or RSA, to the packaged data 4505. Additional security measures, including integrity checks and digital signatures, are added by the security implementer 4134 to prevent unauthorized alterations 4506. The data transmitter 4135 then prepares the secured data for transmission, adapting it to the appropriate network protocols such as TCP/IP or HTTP 4507. To ensure reliable transmission, error detection and correction codes are implemented by the data transmitter 4135, allowing for data recovery in case of transmission errors 4508. Finally, the fully processed, secured, and packaged data is transmitted to the recipient system by the data transmitter 4135, completing the output process 4509. Throughout this process, the output subsystem 4130 may interact with the data reconstruction engine 301, ensuring that the packaged data and metadata are formatted in a way that facilitates efficient and accurate data reconstruction at the receiving end.

Figure 46:
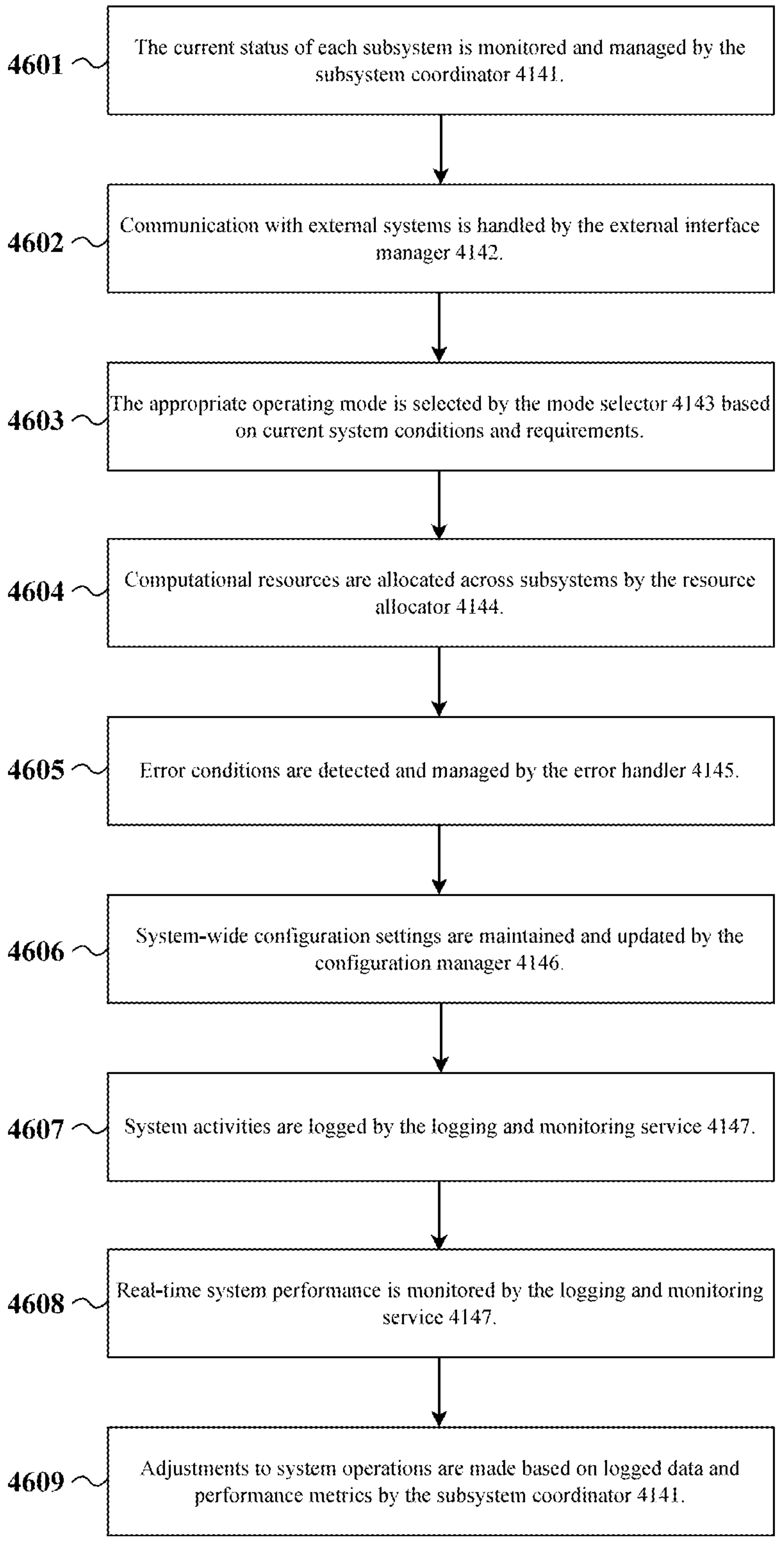
FIG. 46 is a method diagram illustrating the use of system controller.

FIG. 46 is a method diagram illustrating the use of system controller 4140. The process begins as the subsystem coordinator 4141 continuously monitors and manages the current status of each subsystem, maintaining a state machine to ensure proper sequencing of operations 4601. Concurrently, the external interface manager 4142 handles communication with external systems, such as the data deconstruction engine 201, compression engine 3610, and library manager 103, managing data input and output flows 4602. Based on the current system conditions, user preferences, and input data characteristics, the mode selector 4143 determines the appropriate operating mode (lossless, lossy, or modified lossless) and adjusts system behavior accordingly 4603. To optimize performance, the resource allocator 4144 dynamically distributes computational resources across subsystems, implementing load balancing algorithms to ensure efficient processing 4604. Throughout the operation, the error handler 4145 vigilantly detects and manages error conditions, implementing appropriate error recovery procedures and providing error summaries to system administrators 4605. The configuration manager 4146 maintains and updates system-wide configuration settings, ensuring consistency across all subsystems and managing configuration backups and rollbacks as needed 4606. All system activities are meticulously logged by the logging and monitoring service 4147, which implements log rotation and archiving to manage log file sizes effectively 4607. This service also provides real-time monitoring of system performance, generating periodic system health reports and integrating with external monitoring systems 4608. Finally, based on the logged data and performance metrics, the subsystem coordinator 4141 makes necessary adjustments to system operations, optimizing the overall performance of the adaptive data processing system 4609. This continuous cycle of monitoring, analysis, and adjustment ensures that the system controller 4140 effectively orchestrates all components of the adaptive data processing system, maintaining optimal performance and adaptability.

In a non-limiting use case example of adaptive data processing system 4100, a large-scale genomic research facility processes vast amounts of DNA sequencing data. The facility receives terabytes of raw sequencing data daily from various high-throughput sequencing machines. This data needs to be efficiently compressed for storage and securely transmitted to collaborating institutions worldwide.

As the raw sequencing data enters the system, the dynamic processing subsystem 4110 analyzes its characteristics. The characteristic analyzer 4111 identifies the data as DNA sequencing information and detects patterns specific to the sequencing platform used. The probability distribution estimator 4112 calculates the frequency distribution of nucleotide sequences, which is then compared to previous distributions by the distribution comparator 4113.

Based on this analysis, the transformation matrix creator 4114 generates a custom matrix optimized for DNA data, which the data transformer 4115 uses to convert the input into a dyadic distribution. The stream generator 4116 then creates a main data stream of transformed sequencing data and a secondary stream containing transformation parameters.

The technique selector and applicator 4117 chooses a combination of specialized genomic compression algorithms and encryption methods suitable for sensitive genetic data. The Huffman coder 4118 further compresses the main data stream, achieving high compression ratios by exploiting the repetitive nature of genomic data.

Throughout this process, the feedback loop mechanism 4120 monitors the system's performance. It notices that the compression efficiency for a particular type of sequencing data has decreased over time. The historical performance analyzer 4123 identifies this trend and suggests adjustments to the transformation matrix and compression algorithms.

The output subsystem 4130 then packages the compressed genomic data with metadata describing the processing techniques used. The security implementer 4134 applies strong encryption to protect the sensitive genetic information before transmission.

The system controller 4140 oversees this entire process, dynamically allocating more computational resources to handle peak data influxes from sequencing runs. It also manages the secure interfaces with the facility's data storage systems and external research networks.

This adaptive approach allows the genomic research facility to efficiently process, store, and share massive amounts of sequencing data, automatically adjusting to changes in data characteristics or processing requirements over time. The system's ability to learn and optimize its performance ensures that it remains effective even as sequencing technologies and data formats evolve.

In another non-limiting use case example of adaptive data processing system 4100, a global financial institution processes and analyzes vast amounts of market data, transaction records, and customer information across multiple time zones. This data needs to be efficiently compressed, securely stored, and quickly accessible for real-time analysis and reporting.

As market data streams into the system, it first passes through the data deconstruction engine 201, which breaks it down into manageable sourceblocks. These sourceblocks are then fed into the adaptive data processing system 4100 for further processing.

The dynamic processing subsystem 4110 analyzes the characteristics of the incoming data. The characteristic analyzer 4111 identifies various data types, including numerical time series data, textual transaction records, and structured customer information. It works in conjunction with the data deconstruction engine 201 to optimize the analysis process.

Based on this analysis, the technique selector and applicator 4117 interfaces with the compression engine 3610 to determine the most effective compression strategies for each data type. For time series data, it might select a specialized financial data compression algorithm, while for textual data, it could choose a more general-purpose compression method.

Library manager 103 is utilized throughout this process, providing optimized reference codes for common patterns in financial data. The dynamic processing subsystem 4110 continually updates the library manager 103 with new patterns it discovers, improving the system's efficiency over time.

As the data is processed, the feedback loop mechanism 4120 monitors the performance of the applied techniques. It collects data not only from internal components but also from the external compression engine 3610 and decompression engine 3710, ensuring a comprehensive view of the system's performance.

The output subsystem 4130 packages the processed data, including metadata that describes the applied techniques. This packaged data is then stored in a distributed storage system, with the data reconstruction engine 301 able to quickly retrieve and reconstruct the data as needed for real-time analysis.

The system controller 4140 orchestrates this entire process, managing the interfaces between the adaptive data processing system 4100 and other components like the data deconstruction engine 201 and library manager 103. It dynamically adjusts the operating mode based on current market conditions and analysis needs, switching between lossless mode for critical financial records and lossy mode for less sensitive market data streams.

This adaptive and integrated approach allows the financial institution to efficiently process, store, and analyze massive amounts of diverse financial data. The system's ability to work seamlessly with existing data processing infrastructure while continuously optimizing its performance ensures that the institution can respond quickly to market changes and regulatory requirements, maintaining its competitive edge in the fast-paced financial world.

In another non-limiting use case example of adaptive data processing system 4100, a multinational aerospace company uses the system to manage and process complex engineering data from various stages of aircraft design, manufacturing, and maintenance.

The company receives diverse data types including 3D CAD models, simulation results, sensor data from aircraft testing, and maintenance logs from operational aircraft. This data needs to be efficiently processed, stored, and made accessible across multiple global design centers and manufacturing facilities.

As engineering data enters the system, the dynamic processing subsystem 4110 analyzes its characteristics. The characteristic analyzer 4111 identifies different data types, such as large 3D model files, numerical simulation data, and textual maintenance logs. For 3D models, it detects specific CAD file formats and typical structural patterns.

The probability distribution estimator 4112 calculates distribution patterns for each data type, which the distribution comparator 4113 then compares with historical data. This comparison might reveal, for instance, that recent aircraft designs have more complex geometries, affecting the data distribution of 3D models.

Based on this analysis, the transformation matrix creator 4114 generates customized matrices for each data type. The data transformer 4115 then converts the input into optimal dyadic distributions, separately handling the 3D model data, simulation results, and textual information.

The technique selector and applicator 4117 chooses specialized compression algorithms for each data type. For 3D models, it might select advanced geometry compression techniques, while for sensor data, it could choose algorithms optimized for time-series data.

Throughout the process, the feedback loop mechanism 4120 monitors performance. The effectiveness monitor 4121 might notice that compression efficiency for certain simulation data has improved, prompting the historical performance analyzer 4123 to investigate and potentially recommend this technique for similar data types.

The output subsystem 4130 packages the processed data, with the data packager 4133 including detailed metadata about the applied techniques. This is crucial for ensuring that design teams in different locations can correctly interpret and use the data.

The security implementer 4134 applies stringent encryption to protect sensitive design information before it's transmitted between global locations or stored in the company's distributed data centers.

The system controller 4140 oversees the entire operation, with the mode selector 4143 dynamically switching between lossless mode for critical design data and lossy mode for less sensitive information like preliminary simulation results. The resource allocator 4144 ensures that sufficient computational power is available during peak times, such as during major design reviews or aircraft testing phases.

This adaptive approach allows the aerospace company to efficiently manage its complex, varied, and sensitive engineering data across its global operations. The system's ability to recognize and optimally process different data types, combined with its continuous self-improvement, ensures that the company can handle growing data volumes and complexities as aircraft designs become more sophisticated. This efficiency in data management translates to faster design iterations, improved collaboration between global teams, and ultimately, more innovative and reliable aircraft designs.

It should be understood by one skilled in the art that the applications of system 4100 are not limited to the use case examples. For example, the adaptive data processing system could be employed in smart city infrastructures to efficiently manage and process data from numerous IoT sensors, traffic cameras, and public transportation systems. In the field of climate science, it could handle vast datasets from satellites, weather stations, and ocean buoys, optimizing storage and enabling faster analysis of climate patterns. The system could revolutionize telemedicine by facilitating the secure transmission and storage of high-resolution medical imaging data and real-time patient monitoring information. In the entertainment industry, it could streamline the production and distribution of high-definition video content, efficiently managing the enormous data volumes involved in modern CGI-heavy film production. For autonomous vehicle development, the system could process and compress the massive amounts of sensor and camera data generated during test drives, enabling more efficient data sharing among development teams. In each of these applications, the system's ability to adapt to different data types, optimize processing techniques, and continuously improve its performance would provide significant advantages in data management, storage efficiency, and processing speed.

Figure 47:
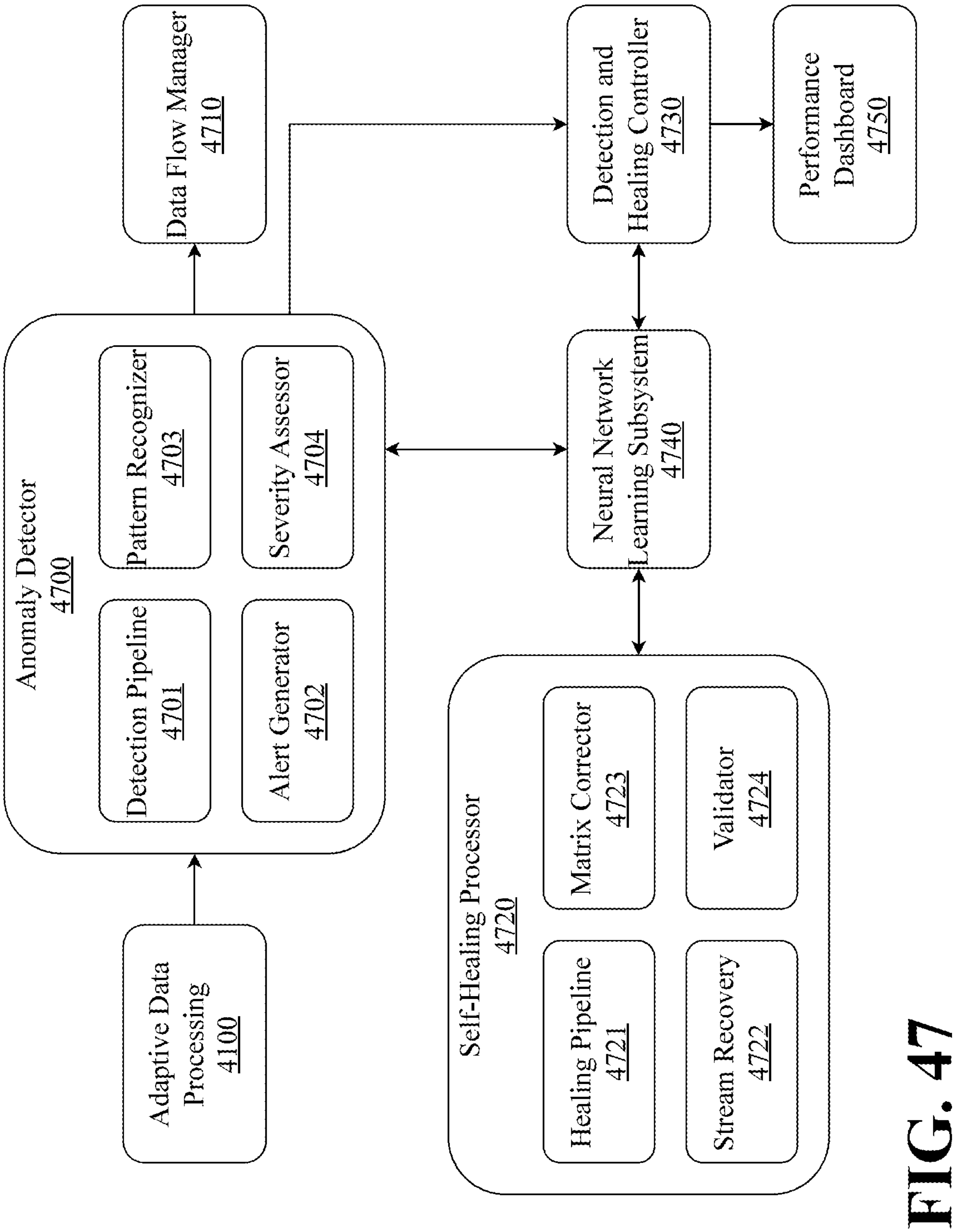
FIG. 47 is a block diagram illustrating an exemplary system architecture for real-time anomaly detection and self-healing system as an integrated extension of an adaptive data processing system.

FIG. 47 is a block diagram illustrating an exemplary system architecture for real-time anomaly detection and self-healing system as an integrated extension of an adaptive data processing system. The system architecture demonstrates how anomaly detection and self-healing capabilities enhance the existing adaptive processing framework by providing continuous monitoring, automatic correction, and learning-based optimization. An anomaly detector 4700 serves as the primary monitoring and detection subsystem that interfaces directly with an adaptive data processing system 4100 by tapping into the output streams generated by a dynamic processing subsystem 4110 and receiving performance metrics from a feedback loop mechanism 4120. This integration allows anomaly detector 4700 to monitor both the transformed data streams and the system's operational characteristics in real-time, creating a comprehensive view of system health and data integrity.

Within anomaly detector 4700, a detection pipeline 4701 performs multi-stage analysis of incoming data streams through a series of specialized processing modules. The pipeline begins by receiving the main data stream and secondary transformation stream from a stream generator 4116 of the existing system, along with performance metrics from an effectiveness monitor 4121. It first applies data normalization techniques to ensure consistent analysis across different data types and formats, then performs stream alignment to synchronize the main and secondary streams for correlated analysis. The pipeline employs statistical analyzers that calculate measures such as mean, variance, entropy, and higher-order statistics to establish baseline patterns and detect deviations. For example, when processing financial transaction data, detection pipeline 4701 might identify unusual patterns in transaction amounts, frequencies, or geographic distributions that could indicate fraud or system compromise. Detection pipeline 4701 also implements temporal correlation analysis to identify time-dependent anomalies, such as gradual performance degradation or periodic disturbances that might not be apparent in single-point analyses.

A pattern recognizer 4703 represents a neural network-based component that extends beyond traditional statistical analysis to identify complex, non-linear anomaly patterns. It employs a hybrid architecture combining long short-term memory (LSTM) networks for capturing temporal dependencies, convolutional neural networks (CNNs) for identifying spatial patterns in multi-dimensional data, and attention mechanisms that allow the system to focus on the most relevant features for anomaly detection. Pattern recognizer 4703 maintains a learned representation of normal system behavior acquired through training on historical data from monitoring database 2930 and continuously updates these representations based on new observations. For instance, in a smart city infrastructure deployment, pattern recognizer 4703 might learn the normal patterns of traffic flow, energy consumption, and sensor readings, then identify anomalies such as unusual traffic congestion patterns that could indicate accidents or infrastructure failures. The component interfaces with probability distribution estimator 4112 from the existing system to compare current data distributions with expected patterns, enabling sophisticated drift detection capabilities.

An alert generator 4702 operates in parallel with pattern recognizer 4703, creating a dual-path analysis system that ensures both rapid response to critical anomalies and thorough investigation of complex patterns. It implements a multi-tier alerting system with different priority levels based on anomaly severity, confidence scores, and potential system impact. Alert generator 4702 maintains configurable thresholds that can be dynamically adjusted based on system conditions and historical performance data. It generates structured anomaly reports that include classification information, confidence scores, affected system components, and recommended remediation actions. These reports are formatted to be compatible with both human operators through the performance dashboard 4750 and automated systems through the detection and healing controller 4730. The alert generator 4702 also implements alert suppression and correlation mechanisms to prevent alert storms and identify root causes when multiple related anomalies occur simultaneously.

A severity assessor 4704 provides critical context for detected anomalies by evaluating their potential impact on system performance, data integrity, and security. It employs a multi-dimensional assessment framework that considers factors such as the scope of affected data, the criticality of affected system components, the potential for cascading failures, and the resources required for remediation. Severity assessor 4704 interfaces with system controller 4140 from the existing system to understand current system state and resource availability, enabling context-aware severity ratings. For example, an anomaly that might be considered low-severity during normal operations could be escalated to high-severity if it occurs during a critical processing window or when system resources are constrained. The component maintains a knowledge base of historical anomaly impacts and remediation outcomes, using machine learning techniques to improve severity predictions over time.

A self-healing processor 4720 represents an automated remediation system that receives detailed anomaly reports from anomaly detector 4700 and implements corrective measures without human intervention. A healing pipeline 4721 serves as the orchestration layer within self-healing processor 4720, implementing a systematic approach to anomaly remediation. It begins by parsing incoming anomaly reports to extract relevant information about the anomaly type, affected components, and recommended actions. The pipeline then performs dependency analysis to identify all system components that might be affected by the anomaly or the proposed remediation actions. It implements a strategy selection algorithm that considers multiple factors including anomaly type, available resources, historical success rates, and potential side effects to choose the most appropriate healing approach. Healing pipeline 4721 maintains communication with adaptive adjuster 4119 from the existing system to ensure that healing actions are coordinated with the system's dynamic optimization processes.

A matrix corrector 4723 specializes in addressing anomalies related to the transformation matrices used throughout adaptive data processing system 4100. It interfaces directly with transformation matrix creator 4114 to access current matrix configurations and apply corrections when anomalies indicate suboptimal transformations. Matrix corrector 4723 implements several correction strategies including gradient-based optimization to adjust matrix values, singular value decomposition (SVD) for matrix reconstruction, and regularization techniques to prevent overfitting. When data drift is detected, matrix corrector 4723 can incrementally adjust transformation matrices to maintain optimal performance without requiring complete retraining. For instance, in image processing applications, if the system detects that transformation matrices are producing artifacts or degraded compression ratios, matrix corrector 4723 can apply targeted adjustments to specific matrix elements to restore performance while preserving the overall transformation structure.

A stream recovery 4722 component handles a wide range of data stream anomalies including corruption, interruption, packet loss, and synchronization errors. It maintains a buffer of recent data streams and transformation information that can be used for recovery operations. The component implements multiple recovery strategies including forward error correction using redundant information from the secondary stream, interpolation based on surrounding data points, pattern-based reconstruction using learned data models, and checkpoint-based recovery for critical data. Stream recovery 4722 interfaces with the checkpoint manager within its subsystem to maintain consistent recovery points and with stream combiner 4132 from the existing output subsystem to ensure that recovered streams are properly formatted for downstream processing. In scenarios such as satellite data transmission where signal interruptions are common, stream recovery 4722 can reconstruct missing data segments by analyzing patterns in the received data and applying learned models of expected data characteristics.

A validator 4724 performs comprehensive verification of all healing actions to ensure that corrections have successfully resolved anomalies without introducing new problems. It implements multi-level validation including syntax checking to ensure data format compliance, semantic validation to verify data meaningfulness, statistical validation to confirm that corrected data matches expected distributions, and functional validation to ensure that corrected data produces expected results in downstream processing. Validator 4724 maintains bidirectional communication with validation engine 4224 from the self-healing subsystem and interfaces with knowledge base updater 4122 to record validation outcomes for future reference. It can trigger rollback operations if validation fails, ensuring that the system maintains data integrity even when healing attempts are unsuccessful.

A neural network learning subsystem 4740 provides the intelligence layer that enables continuous improvement of both anomaly detection and self-healing capabilities. It implements a comprehensive learning architecture that includes supervised learning using labeled anomaly data, unsupervised learning for discovering new anomaly patterns, reinforcement learning for optimizing healing strategies, and federated learning for sharing knowledge across distributed deployments while preserving data privacy. The subsystem maintains multiple specialized models for different anomaly types and system components, implementing ensemble techniques to combine predictions and improve overall accuracy. It interfaces with historical performance analyzer 4123 from the existing feedback loop mechanism to access long-term performance trends and with codebook training module 2900 to ensure that anomaly detection remains synchronized with evolving data patterns. Neural network learning subsystem 4740 also implements model versioning and A/B testing capabilities, allowing new models to be evaluated in parallel with existing models before full deployment.

Detection and healing controller 4730 serves as the intelligent orchestration layer that coordinates all anomaly detection and self-healing activities while maintaining seamless integration with adaptive data processing system 4100. It implements a decision engine that considers multiple factors when determining how to respond to detected anomalies, including current system load, available resources, business priorities, and service level agreements. The controller maintains a state machine that tracks the status of all detection and healing operations, ensuring that conflicts are avoided and resources are efficiently utilized. It interfaces with subsystem coordinator 4141 from the existing system controller to ensure that anomaly response actions are coordinated with overall system operations. Detection and healing controller 4730 also implements predictive capabilities, using machine learning models to anticipate potential anomalies based on system trends and proactively adjust detection sensitivity or pre-position healing resources.

A data flow manager 4710 handles all data routing and buffering operations between the anomaly detection system and adaptive data processing system 4100. It implements sophisticated buffer management to handle varying data rates and processing delays, ensuring that anomaly detection does not impact main system performance. The component maintains separate channels for different data types including main data streams, transformation information, performance metrics, and control signals. It interfaces with external interface manager 4142 to ensure compatibility with existing data formats and protocols. Data flow manager 4710 also implements quality of service (QoS) mechanisms to prioritize critical data flows and manage congestion during high-load periods. For example, during a distributed denial-of-service (DDoS) attack, data flow manager 4710 can implement rate limiting and filtering to protect the anomaly detection system while maintaining visibility into the attack patterns.

A performance dashboard 4750 provides comprehensive visualization and analysis capabilities for system operators and administrators. It implements real-time displays of key performance indicators including detection rates, false positive/negative ratios, healing success rates, system resource utilization, and trend analyses. The dashboard integrates data from all system components to provide holistic views of system health and performance. It interfaces with logging and monitoring service 4147 from the existing system to access historical data and generate long-term trend reports. Performance dashboard 4750 implements customizable alerting and reporting features, allowing different stakeholders to receive relevant information in appropriate formats. It also provides interactive capabilities for drilling down into specific anomalies, analyzing root causes, and evaluating the effectiveness of different detection and healing strategies. The dashboard can generate automated reports for compliance purposes and maintain audit trails of all system actions for regulatory requirements.

Figure 48:
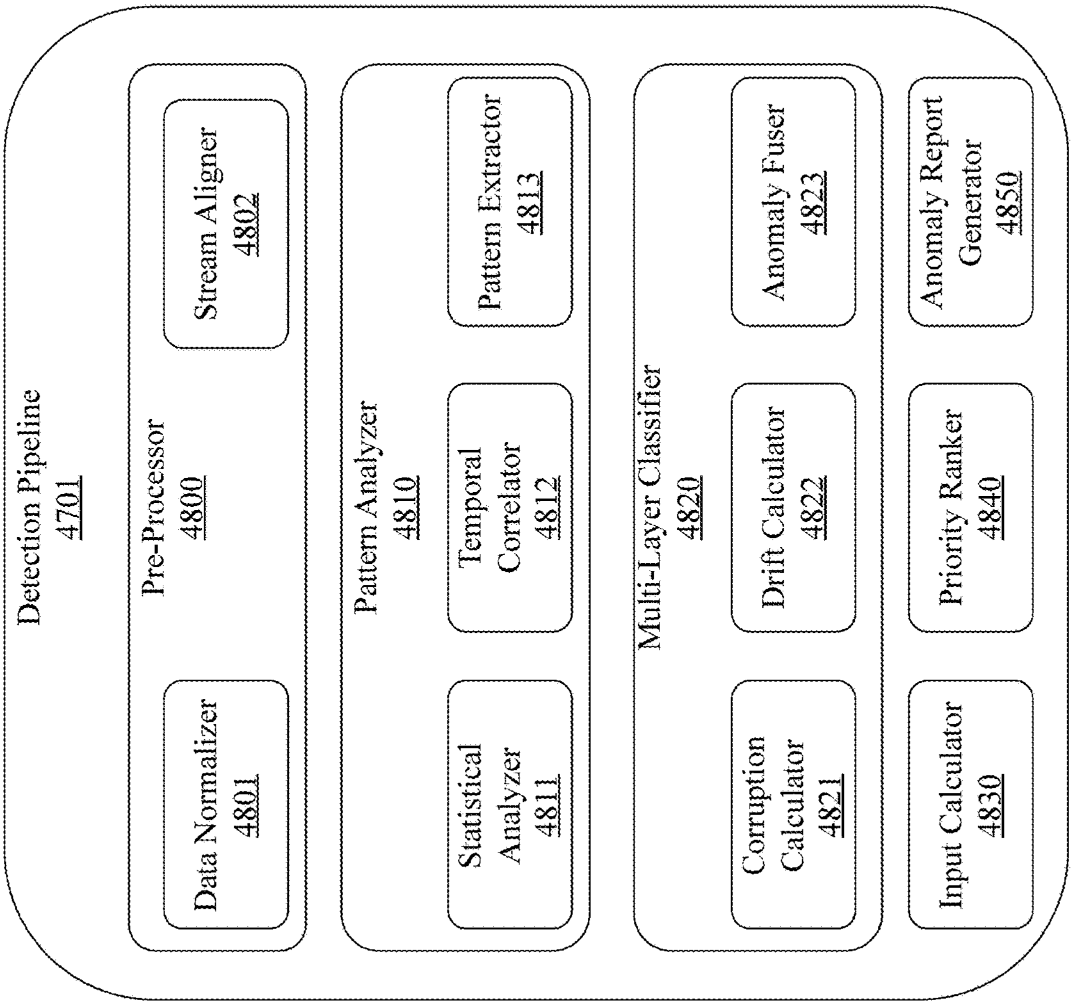
FIG. 48 is a block diagram illustrating an exemplary system architecture for a detection pipeline for comprehensive anomaly detection within a real-time anomaly detection and self-healing system.

FIG. 48 is a block diagram illustrating an exemplary system architecture for a detection pipeline for comprehensive anomaly detection within a real-time anomaly detection and self-healing system. Detection pipeline 4701 implements a hierarchical processing architecture that systematically analyzes incoming data streams through specialized components organized into functional groups, each designed to extract and analyze specific aspects of potential anomalies.

A pre-processor 4800 serves as the initial data conditioning stage within detection pipeline 4701, preparing incoming data streams for detailed analysis by subsequent components. A data normalizer 4801 within pre-processor 4800 applies normalization techniques to ensure consistent data representation across different data types, formats, and value ranges. Data normalizer 4801 implements multiple normalization strategies including z-score normalization for statistical standardization, min-max scaling for bounded value ranges, and logarithmic transformation for handling exponential distributions. For instance, when processing sensor data from an industrial IoT deployment where different sensors may report values in different units and scales, data normalizer 4801 transforms all measurements to a common scale while preserving their relative relationships. Data normalizer 4801 maintains adaptive normalization parameters that are continuously updated based on observed data distributions, ensuring that the normalization process remains effective even as data characteristics evolve over time. Data normalizer 4801 also implements outlier-resistant normalization techniques such as robust scaling using median and interquartile range, preventing extreme values from distorting the normalization process.

A stream aligner 4802 operates in parallel with data normalizer 4801 within pre-processor 4800, focusing on temporal and structural alignment of multiple data streams. Stream aligner 4802 addresses challenges such as varying sampling rates, transmission delays, and clock synchronization issues that can affect multi-stream analysis. Stream aligner 4802 implements buffering and interpolation algorithms to create synchronized data windows for analysis. Stream aligner 4802 uses techniques such as dynamic time warping to align streams that may have non-linear temporal relationships, cross-correlation to identify optimal alignment points, and phase-locked loops for maintaining synchronization during continuous processing. For example, in a video surveillance system with multiple cameras, stream aligner 4802 ensures that frames from different cameras are properly synchronized despite varying network latencies and processing delays. Stream aligner 4802 also handles missing data by implementing intelligent interpolation strategies that consider both temporal patterns and cross-stream correlations.

A pattern analyzer 4810 represents the analytical engine within detection pipeline 4701, implementing multiple specialized analysis techniques to identify potential anomalies. A statistical analyzer 4811 within pattern analyzer 4810 performs comprehensive statistical analysis of the normalized and aligned data streams. Statistical analyzer 4811 calculates a wide range of statistical measures including central tendency metrics (mean, median, mode), dispersion measures (variance, standard deviation, interquartile range), shape parameters (skewness, kurtosis), and higher-order statistics that capture complex data relationships. Statistical analyzer 4811 maintains sliding window calculations for real-time analysis and implements change point detection algorithms to identify sudden shifts in statistical properties. Statistical analyzer 4811 also performs multivariate statistical analysis when processing multiple correlated data streams, using techniques such as principal component analysis (PCA) to identify anomalies in reduced dimensional spaces and Mahalanobis distance to detect outliers in multivariate distributions.

A temporal correlator 4812 specializes in identifying time-dependent patterns and anomalies that may not be apparent in instantaneous analysis. Temporal correlator 4812 implements various time series analysis techniques including autocorrelation analysis to identify periodic patterns, cross-correlation to detect lead-lag relationships between different data streams, and spectral analysis using Fast Fourier Transform (FFT) to identify frequency-domain anomalies. Temporal correlator 4812 maintains multiple time scales for analysis, from microsecond-level correlations for high-frequency trading systems to daily or seasonal patterns for environmental monitoring applications. Temporal correlator 4812 implements adaptive windowing techniques that automatically adjust analysis windows based on detected pattern frequencies and uses wavelet analysis for multi-resolution temporal decomposition. For instance, in power grid monitoring, temporal correlator 4812 can identify subtle phase shifts or frequency variations that might indicate equipment degradation or impending failures.

A pattern extractor 4813 synthesizes insights from both statistical analyzer 4811 and temporal correlator 4812 to identify complex patterns that serve as signatures for different types of anomalies. Pattern extractor 4813 implements advanced pattern recognition techniques including motif discovery to identify recurring patterns, shapelet extraction for time series classification, and symbolic aggregate approximation (SAX) for pattern matching in high-dimensional data. Pattern extractor 4813 maintains a dynamic pattern library that is continuously updated with newly discovered patterns and their associated anomaly types. Pattern extractor 4813 uses machine learning techniques such as clustering algorithms to group similar patterns and association rule mining to identify pattern combinations that indicate specific anomaly conditions. Pattern extractor 4813 also implements pattern abstraction mechanisms that allow it to recognize variations of known patterns, providing robustness against minor changes in data characteristics.

A multi-layer classifier 4820 implements a classification architecture that categorizes detected patterns into specific anomaly types. A corruption calculator 4821 within multi-layer classifier 4820 focuses on identifying data corruption anomalies such as bit errors, truncated values, or format violations. Corruption calculator 4821 implements multiple corruption detection algorithms including checksum verification for detecting transmission errors, range checking for identifying out-of-bounds values, and format validation using regular expressions or schema definitions. Corruption calculator 4821 also performs deep packet inspection when analyzing network data streams, identifying corrupted headers, payload anomalies, or protocol violations. Corruption calculator 4821 maintains corruption signatures for different types of data corruption and uses probabilistic models to distinguish between random corruption and systematic issues.

A drift calculator 4822 specializes in detecting gradual changes in data distributions that indicate concept drift or system degradation. Drift calculator 4822 implements drift detection algorithms including the Kolmogorov-Smirnov test for comparing probability distributions, the Page-Hinkley test for detecting changes in average values, and the ADWIN (Adaptive Windowing) algorithm for identifying optimal window sizes for drift detection. Drift calculator 4822 maintains multiple baseline models representing normal system behavior and continuously compares current data against these baselines. Drift calculator 4822 can detect various types of drift including sudden drift caused by system reconfigurations, gradual drift from wear and degradation, recurring drift from seasonal variations, and incremental drift from accumulating changes. For example, in a machine learning model deployment, drift calculator 4822 can identify when input data distributions begin to differ from training data, indicating potential model performance degradation.

An anomaly fuser 4823 integrates outputs from corruption calculator 4821 and drift calculator 4822, along with other specialized detectors, to create comprehensive anomaly assessments. Anomaly fuser 4823 implements evidence fusion techniques including Dempster-Shafer theory for combining uncertain evidence, fuzzy logic for handling imprecise classifications, and ensemble methods for aggregating multiple classifier outputs. Anomaly fuser 4823 resolves conflicts between different classifiers using weighted voting schemes based on historical accuracy and implements correlation analysis to identify related anomalies that might share common root causes. Anomaly fuser 4823 produces unified anomaly scores that reflect both the confidence and severity of detected anomalies, enabling downstream components to make informed decisions about response actions.

An input calculator 4830 performs real-time computational analysis to support the anomaly detection process. Input calculator 4830 calculates derived metrics and features that enhance anomaly detection accuracy, including rate calculations for identifying unusual activity patterns, accumulative metrics for detecting resource exhaustion, and differential measurements for identifying sudden changes. Input calculator 4830 implements efficient streaming algorithms that can process high-velocity data streams with minimal latency and memory usage. Input calculator 4830 maintains running statistics using techniques such as exponential weighted moving averages and implements approximate algorithms for complex calculations when exact computation would be too resource-intensive.

A priority ranker 4840 assigns priority scores to detected anomalies based on multiple factors including severity, confidence, potential impact, and available remediation resources. Priority ranker 4840 implements a multi-criteria decision-making framework that considers business rules, service level agreements, and operational constraints when determining priorities. Priority ranker 4840 uses machine learning models trained on historical incident data to predict the likely impact of different anomaly types and implements dynamic priority adjustment based on current system state and resource availability. For instance, an anomaly that might normally be considered low-priority could be elevated if it occurs during a critical business operation or when similar anomalies have recently caused significant issues.

An anomaly report generator 4850 creates structured, actionable reports that encapsulate all relevant information about detected anomalies. Anomaly report generator 4850 implements a flexible reporting framework that can generate reports in multiple formats including human-readable summaries for operators, machine-readable formats for automated systems, and detailed technical reports for forensic analysis. Anomaly report generator 4850 includes contextual information such as the time of detection, affected system components, confidence scores, recommended actions, and relevant historical patterns. Anomaly report generator 4850 implements report compression and prioritization to manage high-volume anomaly scenarios and includes visualization components that can generate graphs and charts to illustrate anomaly patterns. The reports are designed to integrate seamlessly with self-healing processor 4720 for automated remediation and with performance dashboard 4750 for human oversight and intervention when necessary.

Figure 49:
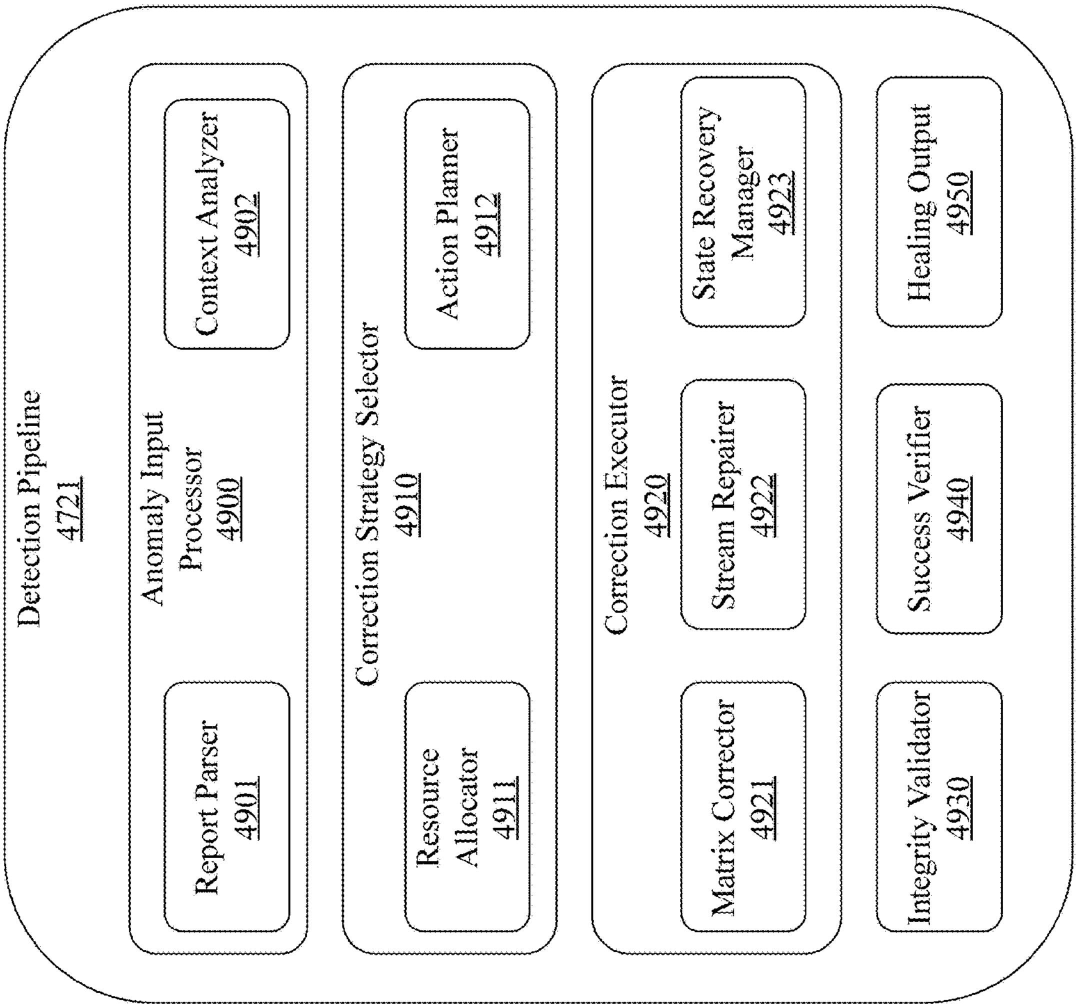
FIG. 49 is a block diagram illustrating an exemplary architecture of a healing pipeline for automated anomaly remediation within a self-healing processor.

FIG. 49 is a block diagram illustrating an exemplary architecture of a healing pipeline for automated anomaly remediation within a self-healing processor. Healing pipeline 4721 implements a systematic approach to analyzing, planning, and executing corrective actions for detected anomalies, ensuring that remediation efforts are appropriate, effective, and do not introduce additional system instabilities.

An anomaly input processor 4900 serves as the entry point for anomaly reports generated by detection pipeline 4701, implementing parsing and analysis capabilities to extract actionable information from complex anomaly reports. A report parser 4901 within anomaly input processor 4900 implements a multi-format parsing engine capable of processing structured anomaly reports from various sources including anomaly report generator 4850, external monitoring systems, and manual incident reports. Report parser 4901 employs natural language processing techniques to extract key information from unstructured text descriptions, schema validation to ensure report completeness and consistency, and semantic analysis to understand the relationships between different report elements. Report parser 4901 maintains a comprehensive taxonomy of anomaly types and their associated attributes, enabling it to categorize incoming reports and extract relevant parameters such as affected components, severity levels, confidence scores, and recommended actions. For instance, when processing a report indicating data corruption in a distributed database system, report parser 4901 extracts details about affected tables, corruption patterns, timestamp ranges, and potential root causes, organizing this information into a structured format suitable for automated processing.

A context analyzer 4902 operates in conjunction with report parser 4901 to provide deeper understanding of the anomaly's system-wide implications. Context analyzer 4902 implements a dependency mapping system that traces relationships between affected components and other system elements, identifying potential cascade effects and secondary impacts. Context analyzer 4902 queries system controller 4140 to obtain current system state information, including active processes, resource utilization, and operational constraints. Context analyzer 4902 maintains a historical context database that tracks previous anomalies, their remediation outcomes, and any recurring patterns, enabling it to identify chronic issues that may require different treatment approaches than isolated incidents. Context analyzer 4902 implements temporal context analysis to understand whether the anomaly occurred during critical business operations, maintenance windows, or other significant time periods that might influence remediation decisions. For example, if an anomaly is detected in a financial trading system, context analyzer 4902 determines whether markets are currently open, what types of trades are being processed, and what regulatory requirements might constrain remediation options.

A correction strategy selector 4910 represents the intelligent decision-making of healing pipeline 4721, evaluating multiple potential remediation strategies and selecting the most appropriate approach based on comprehensive analysis. A resource allocator 4911 within correction strategy selector 4910 performs real-time assessment of available system resources including CPU capacity, memory availability, network bandwidth, and specialized hardware accelerators. Resource allocator 4911 implements resource prediction models that estimate the resource requirements for different remediation strategies, considering factors such as data volume, processing complexity, and time constraints. Resource allocator 4911 interfaces with resource allocator 4144 from the system controller to ensure coordination with overall system resource management. Resource allocator 4911 implements priority-based allocation schemes that can preempt lower-priority operations when critical anomaly remediation requires immediate resources. Resource allocator 4911 also maintains resource reservation capabilities, allowing it to guarantee resource availability for multi-stage remediation processes that may span extended time periods.

An action planner 4912 develops detailed remediation plans based on the selected strategy and available resources. Action planner 4912 implements a hierarchical planning approach that decomposes high-level remediation goals into specific, executable actions with defined sequences and dependencies. Action planner 4912 uses techniques from automated planning and scheduling, including temporal planning for time-sensitive actions, contingency planning for handling potential failures, and parallel planning for identifying actions that can be executed simultaneously. Action planner 4912 maintains a comprehensive action library that includes atomic operations such as data restoration, parameter adjustments, and service restarts, as well as complex multi-step procedures for handling anomalies. Action planner 4912 performs risk assessment for each planned action, identifying potential side effects and developing mitigation strategies. For instance, when planning remediation for a memory leak anomaly, action planner 4912 might develop a multi-phase plan that includes gradual memory reclamation to avoid system disruption, temporary request rerouting to maintain service availability, and scheduled service restart during low-traffic periods.

A correction executor 4920 implements the actual remediation actions planned by correction strategy selector 4910, providing specialized execution engines for different types of corrections. A matrix corrector 4921 within correction executor 4920 specifically handles anomalies related to transformation matrices used throughout the adaptive data processing system. Matrix corrector 4921 interfaces directly with transformation matrix creator 4114 and implements matrix correction algorithms including gradient-based optimization for incremental adjustments, singular value decomposition for matrix reconstruction, and regularization techniques to prevent overfitting. Matrix corrector 4921 maintains a version control system for transformation matrices, enabling rollback capabilities if corrections prove unsuccessful. Matrix corrector 4921 implements adaptive learning algorithms that analyze the effectiveness of different correction strategies over time, improving its ability to select appropriate correction methods for specific types of matrix anomalies. For example, when addressing anomalies caused by data drift in image processing applications, matrix corrector 4921 can apply targeted adjustments to specific frequency components in transformation matrices while preserving overall image quality.

A stream repairer 4922 specializes in correcting anomalies within data streams, implementing techniques for detecting and repairing various types of stream corruption. Stream repairer 4922 maintains rolling buffers of recent stream data that can be used for reconstruction purposes and implements multiple repair strategies including interpolation for filling missing data segments, error correction using redundant information from secondary streams, and pattern-based reconstruction using learned models of expected stream behavior. Stream repairer 4922 interfaces with stream generator 4116 to access stream metadata and formatting information, ensuring that repaired streams maintain compatibility with downstream processing components. Stream repairer 4922 implements advanced signal processing techniques such as Kalman filtering for optimal state estimation and particle filtering for non-linear stream reconstruction. Stream repairer 4922 can handle various types of stream anomalies including packet loss, bit errors, synchronization problems, and format violations. For instance, in a video streaming application experiencing packet loss, stream repairer 4922 can reconstruct missing frames using motion estimation and compensation techniques while maintaining temporal consistency.

A state recovery manager 4923 handles anomalies that require restoration of system state to a known good configuration. State recovery manager 4923 implements comprehensive state management capabilities including checkpoint creation and management, incremental state tracking, and distributed state synchronization for multi-component systems. State recovery manager 4923 interfaces with checkpoint manager 4225 to access previously saved system states and implements intelligent selection algorithms to choose optimal recovery points based on factors such as state age, completeness, and potential data loss. State recovery manager 4923 maintains state dependency graphs that track relationships between different state components, enabling partial state recovery when full system rollback is not necessary. State recovery manager 4923 implements various recovery strategies including point-in-time recovery for returning to specific timestamps, consistent recovery for maintaining data integrity across distributed components, and progressive recovery for gradually transitioning from corrupted to healthy states. For example, when recovering from a database corruption incident, state recovery manager 4923 can perform table-level recovery while maintaining referential integrity and minimizing disruption to unaffected data.

An integrity validator 4930 performs comprehensive verification of correction actions to ensure that remediation efforts have successfully resolved anomalies without introducing new problems. Integrity validator 4930 implements multi-level validation strategies including structural validation to verify data format compliance, semantic validation to ensure data meaningfulness and consistency, and functional validation to confirm that corrected components operate as expected. Integrity validator 4930 maintains a comprehensive test suite that can be dynamically configured based on the type of correction performed and the criticality of affected components. Integrity validator 4930 implements differential testing techniques that compare system behavior before and after corrections, identifying any unexpected changes or side effects. Integrity validator 4930 interfaces with validation engine 4224 from the self-healing subsystem to leverage existing validation capabilities and maintain consistency across the system. For instance, after correcting transformation matrices, integrity validator 4930 processes test data through both original and corrected matrices, comparing outputs to ensure that corrections improve performance without introducing artifacts.

A success verifier 4940 provides final confirmation that healing actions have achieved their intended objectives, implementing success criteria evaluation and outcome assessment. Success verifier 4940 maintains a comprehensive metrics framework that defines success criteria for different types of anomalies and remediation actions, including performance thresholds, error rate targets, and quality measures. Success verifier 4940 implements continuous monitoring of corrected components to ensure that improvements are sustained over time and that anomalies do not recur. Success verifier 4940 uses statistical analysis techniques to distinguish between normal variation and genuine improvement, preventing false positive success declarations. Success verifier 4940 maintains detailed logs of all verification activities, creating an audit trail that can be used for compliance purposes and post-incident analysis. Success verifier 4940 interfaces with effectiveness monitor 4121 to report healing outcomes to the broader feedback loop mechanism, enabling system-wide learning from remediation experiences.

A healing output 4950 generates comprehensive reports and notifications about completed healing actions, providing information to various system components and stakeholders. Healing output 4950 implements a flexible output framework that can generate different report formats for different audiences, including technical details for system administrators, summary information for business stakeholders, and machine-readable formats for automated systems. Healing output 4950 includes information about the original anomaly, actions taken, resources consumed, success metrics, and any residual risks or follow-up actions required. Healing output 4950 interfaces with data flow manager 4710 to route corrected data back into the main processing pipeline and with performance dashboard 4750 to update system status displays. Healing output 4950 implements notification mechanisms that can alert relevant personnel about significant healing actions, especially those that may require human oversight or validation. For example, after successfully recovering from a security breach attempt, healing output 4950 generates detailed forensic reports for security teams, compliance reports for regulatory requirements, and operational summaries for management review.

Figure 50:
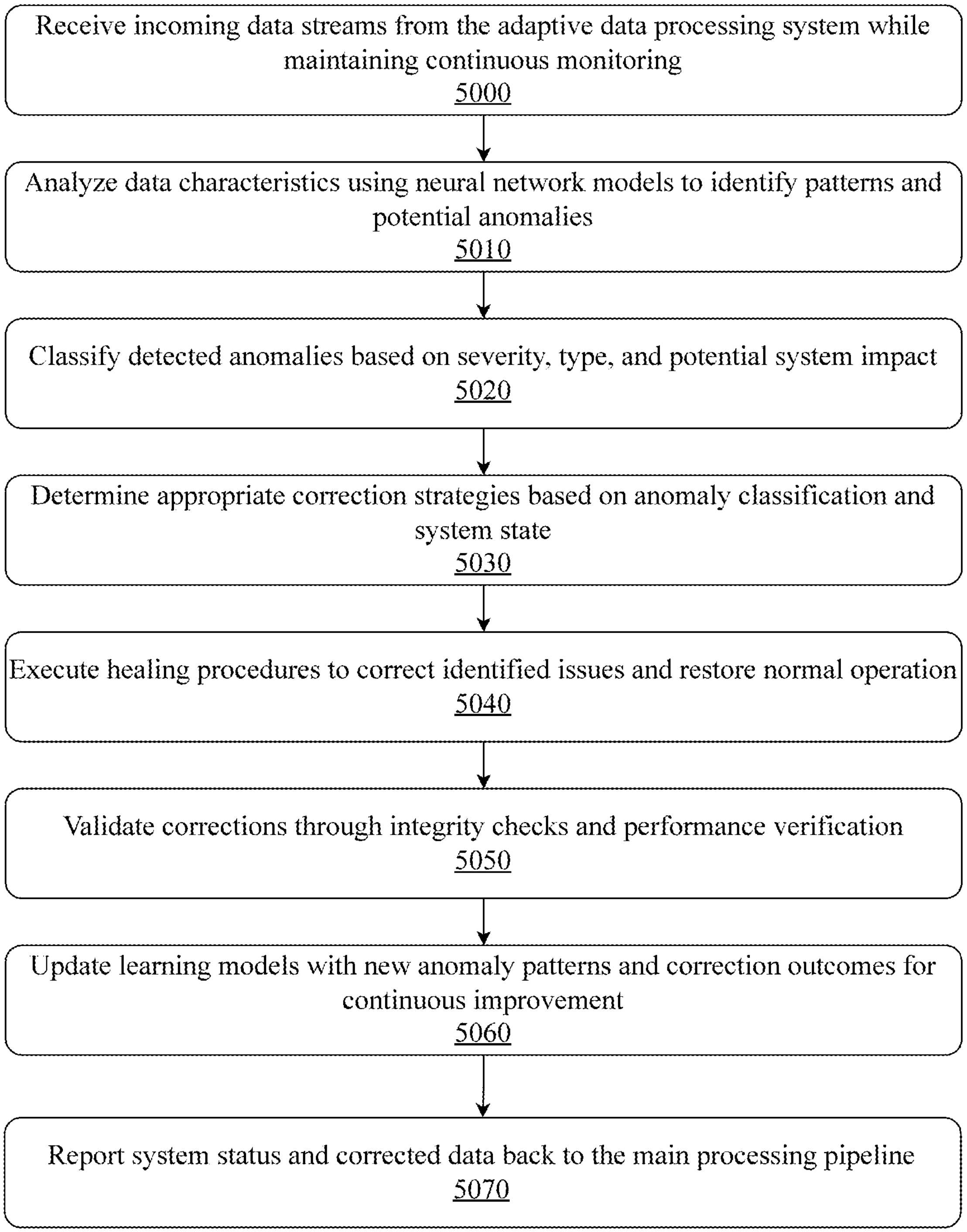
FIG. 50 is a flow diagram illustrating an exemplary method for a real-time anomaly detection and self-healing process for adaptive data processing.

FIG. 50 is a flow diagram illustrating an exemplary method for a real-time anomaly detection and self-healing process for adaptive data processing. In a first step 5000, incoming data streams are received from an adaptive data processing system while maintaining continuous monitoring. This establishes persistent connections to data sources and implements buffering mechanisms to handle varying data rates and ensure no data loss during processing. Multiple data streams may be received simultaneously, including primary data streams containing transformed information and secondary streams containing metadata or transformation parameters. Continuous monitoring involves maintaining real-time visibility into data flow characteristics such as arrival rates, data volumes, and stream health indicators.

Buffer management strategies are employed to handle burst traffic and ensure smooth data flow to subsequent processing stages.

In a step 5010, data characteristics are analyzed using neural network models to identify patterns and potential anomalies. This analysis employs multiple specialized neural network architectures including recurrent neural networks for temporal pattern recognition, convolutional neural networks for spatial pattern analysis, and attention mechanisms for focusing on relevant features. Statistical preprocessing is performed to extract features such as mean, variance, frequency distributions, and higher-order statistics that serve as inputs to the neural networks. Pattern recognition involves comparing current data characteristics against learned representations of normal behavior, with deviations beyond defined thresholds flagged as potential anomalies. The neural networks continuously adapt their internal representations based on observed data, improving detection accuracy over time.

In a step 5020, detected anomalies are classified based on severity, type, and potential system impact. Classification involves multi-dimensional assessment considering factors such as the magnitude of deviation from normal patterns, the criticality of affected data streams, and the potential for cascading effects. Anomaly types may include data corruption, distribution drift, security breaches, or system failures, each requiring different remediation approaches. Severity assessment employs scoring algorithms that weight various factors including business impact, data volume affected, and time sensitivity. Impact analysis considers both immediate effects and potential long-term consequences, enabling prioritization of remediation efforts based on overall system risk.

In a step 5030, appropriate correction strategies are determined based on anomaly classification and system state. Strategy selection involves evaluating multiple potential remediation approaches and choosing the most suitable based on factors including anomaly type, available resources, and current operational constraints. Decision-making algorithms consider historical success rates of different strategies for similar anomalies, resource requirements for each approach, and potential side effects or risks. System state assessment includes evaluation of current processing loads, resource availability, and any operational restrictions that might influence strategy selection. Contingency planning is incorporated to identify backup strategies if primary approaches fail or prove unsuitable.

In a step 5040, healing procedures are executed to correct identified issues and restore normal operation. Execution involves implementing the selected correction strategy through a series of coordinated actions that may include data reconstruction, parameter adjustments, or state restoration. Healing procedures are designed to be minimally disruptive, often employing techniques such as gradual correction, parallel processing, or hot-swapping to maintain service continuity. Progress monitoring during execution enables real-time adjustment of healing parameters if initial approaches prove ineffective. Rollback mechanisms are maintained throughout the execution process, allowing reversal of changes if healing procedures cause unexpected problems.

In a step 5050, corrections are validated through integrity checks and performance verification. Validation encompasses multiple levels of verification including structural validation to ensure data format compliance, semantic validation to verify logical consistency, and functional validation to confirm expected behavior. Performance metrics are collected before and after corrections to quantify improvement and ensure that remediation has not introduced new performance issues. Statistical testing methods are employed to distinguish between normal variations and genuine improvements, preventing false positive validations. Continuous monitoring following initial validation ensures that corrections remain effective over time and that anomalies do not recur.

In a step 5060, learning models are updated with new anomaly patterns and correction outcomes for continuous improvement. This updating process involves extracting features from newly detected anomalies and their successful remediation strategies, creating training examples for model refinement. Machine learning algorithms analyze the relationship between anomaly characteristics and effective correction strategies, identifying patterns that can improve future detection and remediation. Model updates are implemented incrementally to preserve existing knowledge while incorporating new insights, using techniques such as transfer learning or ensemble methods. Performance metrics from updated models are compared against baseline performance to ensure that updates improve overall system effectiveness.

In a step 5070, system status and corrected data are reported back to the main processing pipeline. Reporting includes comprehensive information about detected anomalies, applied corrections, and current system health status, formatted for both automated processing and human review. Corrected data is reintegrated into the processing pipeline with appropriate metadata indicating the nature and extent of corrections applied. Status reports include metrics such as anomaly detection rates, correction success rates, and resource utilization, enabling performance tracking and system optimization. Notification mechanisms ensure that relevant stakeholders are informed of significant events, particularly those requiring human oversight or intervention.

Figure 51:
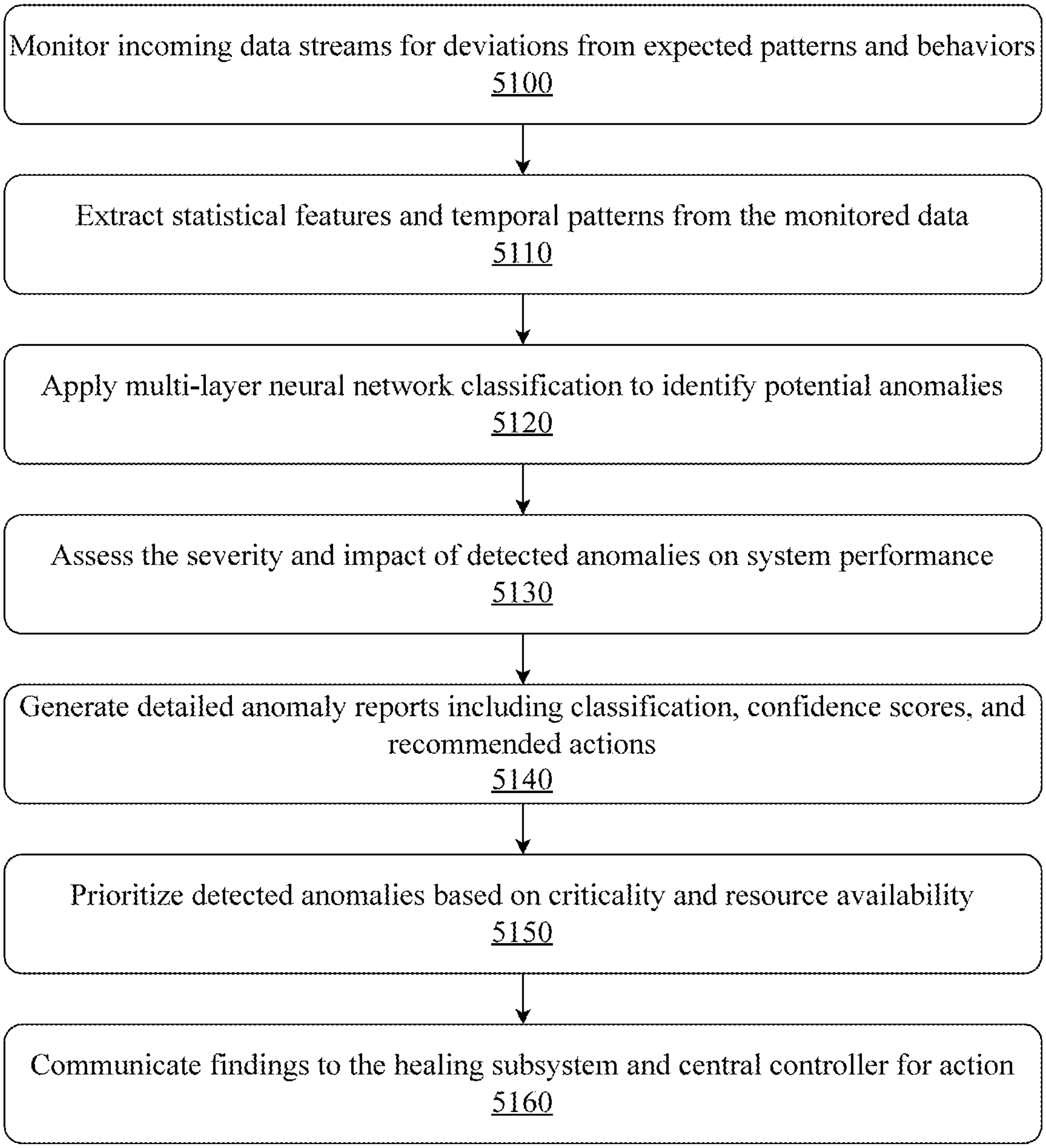
FIG. 51 is a flow diagram illustrating an exemplary method for anomaly detection within an adaptive data processing system.

FIG. 51 is a flow diagram illustrating an exemplary method for anomaly detection within an adaptive data processing system. In a first step 5100, incoming data streams are monitored for deviations from expected patterns and behaviors. This monitoring involves establishing baseline models of normal data characteristics through statistical analysis and machine learning techniques applied to historical data. Real-time comparison algorithms continuously evaluate incoming data against these baseline models, calculating deviation metrics that quantify how far current observations differ from expected values. Multiple monitoring techniques are employed simultaneously, including threshold-based detection for simple limit violations, statistical process control for identifying trends and shifts, and pattern matching for recognizing known anomaly signatures. The monitoring process maintains sliding windows of recent data to enable temporal analysis while managing memory efficiently through appropriate data structure selection and pruning strategies.

In a step 5110, statistical features and temporal patterns are extracted from the monitored data. Feature extraction encompasses calculation of descriptive statistics including measures of central tendency, dispersion, and distribution shape that characterize the data's statistical properties. Temporal pattern extraction involves analyzing time-series characteristics such as trends, seasonality, autocorrelation, and frequency-domain features obtained through techniques like Fourier analysis. Advanced feature engineering techniques are applied to create derived features that better capture anomaly-relevant information, such as rate-of-change indicators, cumulative sum statistics, and cross-correlation measures between related data streams. Dimensionality reduction techniques may be employed to identify the most informative features while reducing computational complexity for subsequent processing stages.

In a step 5120, multi-layer neural network classification is applied to identify potential anomalies. The neural network architecture typically comprises multiple hidden layers that progressively extract higher-level representations from the input features, enabling detection of complex, non-linear anomaly patterns. Different neural network types may be employed for different aspects of anomaly detection, including but not limited to feedforward networks for static pattern recognition, recurrent networks for temporal sequence analysis, and autoencoder architectures for unsupervised anomaly detection. Training of these networks may involve both supervised learning using labeled anomaly examples and unsupervised learning to discover novel anomaly patterns. The classification process produces probability scores indicating the likelihood that observed patterns represent different types of anomalies rather than normal variations.

In a step 5130, the severity and impact of detected anomalies are assessed on system performance. Severity assessment involves evaluating multiple factors including the magnitude of deviation from normal patterns, the persistence of the anomaly over time, and the criticality of the affected data or system components. Impact analysis considers both direct effects such as data corruption or service degradation and indirect effects such as cascading failures or resource exhaustion. Quantitative metrics are calculated to measure potential performance impacts, including estimated data loss, processing delays, accuracy degradation, and resource consumption increases. Risk scoring algorithms combine these various factors into unified severity scores that enable consistent comparison and prioritization across different anomaly types.

In a step 5140, detailed anomaly reports are generated including classification, confidence scores, and recommended actions. Report generation involves structuring detected anomaly information into comprehensive yet actionable formats that support both automated and manual response processes. Classification results indicate the specific type of anomaly detected, such as data corruption, drift, intrusion attempts, or system failures, along with supporting evidence for the classification. Confidence scores quantify the certainty of the detection, accounting for factors such as feature quality, classification model agreement, and historical accuracy for similar patterns. Recommended actions are determined through rule-based systems or learned associations between anomaly types and successful remediation strategies, providing specific guidance for addressing each detected issue.

In a step 5150, detected anomalies are prioritized based on criticality and resource availability. Prioritization algorithms consider multiple factors including severity scores, business impact assessments, time sensitivity of required responses, and dependencies between different anomalies. Resource availability assessment involves evaluating current system capacity, ongoing processing commitments, and the resource requirements of different remediation options. Dynamic priority adjustment mechanisms respond to changing conditions, such as escalating priorities for anomalies that worsen over time or de-escalating priorities when resources become constrained. Queue management strategies ensure that high-priority anomalies receive prompt attention while preventing starvation of lower-priority issues that may still require eventual resolution.

In a step 5160, findings are communicated to the healing subsystem and central controller for action. Communication protocols ensure reliable, timely delivery of anomaly information through mechanisms such as message queuing, event streaming, or direct API calls. Message formatting follows standardized schemas that enable consistent interpretation across different receiving components, including machine-readable formats for automated processing and human-readable summaries for operator awareness. Priority-based routing ensures that critical anomalies trigger immediate notifications while routine findings follow normal communication channels. Acknowledgment and tracking mechanisms confirm successful delivery and monitor response actions, enabling coordination between detection and remediation processes and ensuring that no anomalies are lost or ignored during hand-off between subsystems.

Figure 52:
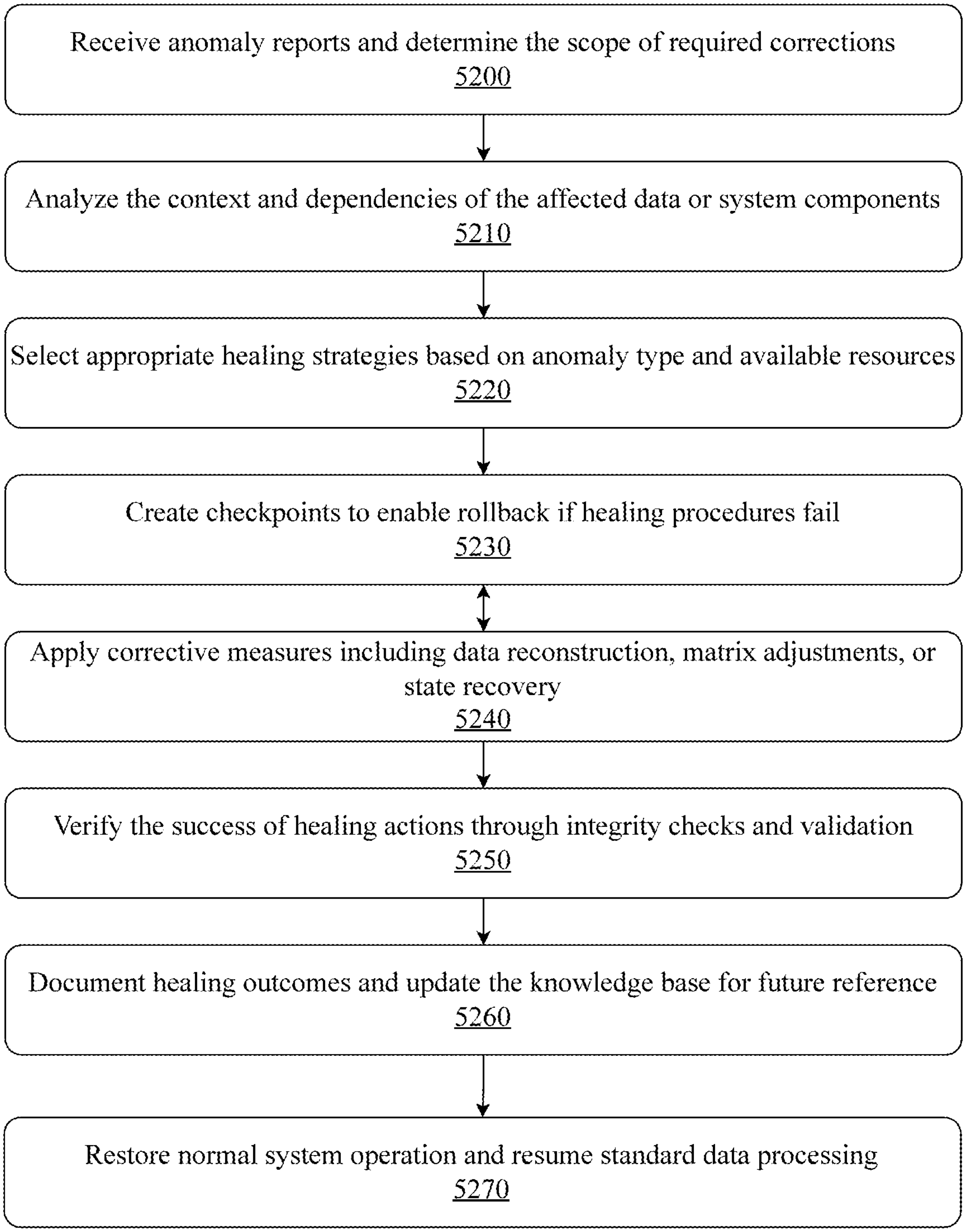
FIG. 52 is a flow diagram illustrating an exemplary method for a self-healing process for automated correction of detected anomalies in an adaptive data processing system.

FIG. 52 is a flow diagram illustrating an exemplary method for a self-healing process for automated correction of detected anomalies in an adaptive data processing system. In a first step 5200, anomaly reports are received and the scope of required corrections is determined. This initial assessment involves parsing structured anomaly reports to extract key information including anomaly type, affected components, severity ratings, and confidence scores. Scope determination encompasses identifying the boundaries of the anomaly's impact, including which data segments are affected, what time periods are involved, and which processing operations may be compromised. Correlation analysis is performed to identify related anomalies that may share common root causes or require coordinated remediation. Resource requirement estimation calculates the computational resources, time, and data access needed for potential correction strategies, enabling informed decision-making about remediation feasibility and approach.

In a step 5210, the context and dependencies of the affected data or system components are analyzed. Context analysis involves examining the operational environment in which the anomaly occurred, including current processing states, active workflows, and business criticality of affected operations. Dependency mapping traces relationships between affected components and other system elements, identifying potential cascade effects where corrections to one component may impact others. Temporal context assessment determines whether the anomaly occurred during critical processing windows, maintenance periods, or other significant operational phases that might influence remediation decisions. Historical context review examines previous occurrences of similar anomalies and their remediation outcomes to inform current correction strategies.

In a step 5220, appropriate healing strategies are selected based on anomaly type and available resources. Strategy selection employs decision algorithms that evaluate multiple potential remediation approaches against criteria including effectiveness probability, resource requirements, execution time, and potential side effects. Different anomaly types invoke different strategy sets, such as interpolation techniques for missing data, error correction algorithms for corrupted bits, or parameter recalibration for drift conditions. Resource availability assessment ensures that selected strategies can be executed within current system constraints, with alternative strategies identified for resource-constrained scenarios. Risk assessment evaluates potential negative impacts of each strategy, balancing correction benefits against possibilities of introducing new problems or disrupting ongoing operations.

In a step 5230, checkpoints are created to enable rollback if healing procedures fail. Checkpoint creation involves capturing current system state including data values, configuration parameters, and operational contexts that may be affected by healing procedures. Multiple checkpoint levels may be implemented, from lightweight markers that record minimal state information to comprehensive snapshots that preserve complete system configurations. Checkpoint storage employs efficient techniques such as incremental capture that records only changes from previous checkpoints, reducing storage overhead while maintaining recovery capabilities. Retention policies determine how long checkpoints are maintained, balancing storage costs against the need for recovery options across different time horizons.

In a step 5240, corrective measures are applied including data reconstruction, matrix adjustments, or state recovery. Data reconstruction techniques include interpolation for filling gaps, pattern-based synthesis for regenerating corrupted segments, and redundancy-based recovery using error correction codes or backup streams. Matrix adjustments involve recalculating transformation parameters to compensate for drift or optimization degradation, using techniques such as gradient descent, regularization, or complete retraining. State recovery procedures restore system components to known-good configurations, potentially involving partial rollbacks, configuration resets, or reinitialization of affected subsystems. Correction application follows carefully orchestrated sequences to minimize disruption, often employing parallel processing or hot-swapping techniques to maintain service availability during remediation.

In a step 5250, the success of healing actions is verified through integrity checks and validation. Integrity checking encompasses multiple validation levels including structural verification to ensure data format compliance, semantic validation to confirm logical consistency, and functional testing to verify expected operational behavior. Performance comparison measures system behavior before and after corrections, using statistical tests to confirm genuine improvement rather than random variation. Regression testing ensures that corrections haven't introduced new problems in previously functioning areas, employing automated test suites that exercise various system capabilities. Continuous monitoring following initial validation tracks system behavior over extended periods to ensure corrections remain effective and anomalies don't recur.

In a step 5260, healing outcomes are documented and the knowledge base is updated for future reference. Documentation captures comprehensive information about the anomaly, applied corrections, resource consumption, and effectiveness metrics in structured formats suitable for both human review and automated analysis. Knowledge base updates involve extracting patterns from successful remediations, creating or refining remediation templates, and updating strategy effectiveness statistics. Machine learning models are retrained with new examples of anomaly-correction pairs, improving future strategy selection and parameter tuning. Failure analysis for unsuccessful remediation attempts identifies improvement opportunities and updates strategy selection criteria to avoid similar failures.

In a step 5270, normal system operation is restored and standard data processing is resumed. Restoration procedures carefully transition from remediation mode to normal operations, ensuring smooth handoff without data loss or processing gaps. System state synchronization ensures all components have consistent views of corrected data and updated configurations before resuming normal processing. Performance baselines are recalibrated to reflect any permanent changes resulting from corrections, preventing false anomaly detections based on outdated expectations. Operational notifications inform relevant stakeholders that remediation is complete and normal operations have resumed, including summary information about the incident and its resolution for audit trails and operational awareness.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 32:
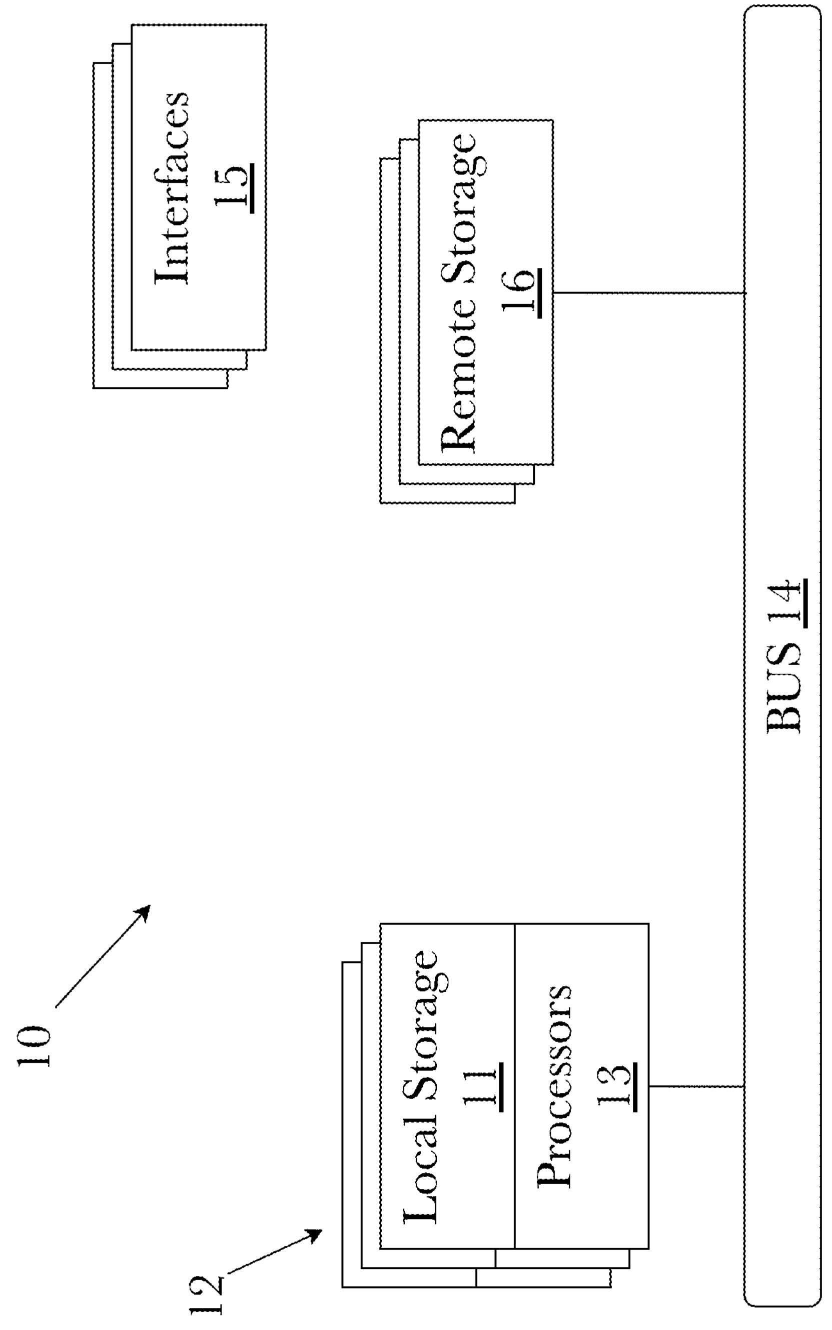
FIG. 32 is a block diagram illustrating an exemplary hardware architecture of a computing device.

Referring now to FIG. 32, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one aspect, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one aspect, a computing device 10 may be configured or designed to function as a server system utilizing CPU 12, local memory 11 and/or remote memory 16, and interface(s) 15. In at least one aspect, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some aspects, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a particular aspect, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term "processor" is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one aspect, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (Wi-Fi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 32 illustrates one specific architecture for a computing device 10 for implementing one or more of the aspects described herein, it is by no means the only device architecture on which at least a portion of the features and techniques described herein may be implemented. For example, architectures having one or any number of processors 13 may be used, and such processors 13 may be present in a single device or distributed among any number of devices. In one aspect, a single processor 13 handles communications as well as routing computations, while in other aspects a separate dedicated communications processor may be provided. In various aspects, different types of features or functionalities may be implemented in a system according to the aspect that includes a client device (such as a tablet device or smartphone running client software) and server systems (such as a server system described in more detail below).

Regardless of network device configuration, the system of an aspect may employ one or more memories or memory modules (such as, for example, remote memory block 16 and local memory 11) configured to store data, program instructions for the general-purpose network operations, or other information relating to the functionality of the aspects described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device aspects may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and "hybrid SSD" storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as "thumb drives" or other removable media designed for rapidly exchanging physical storage devices), "hot-swappable" hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 33:
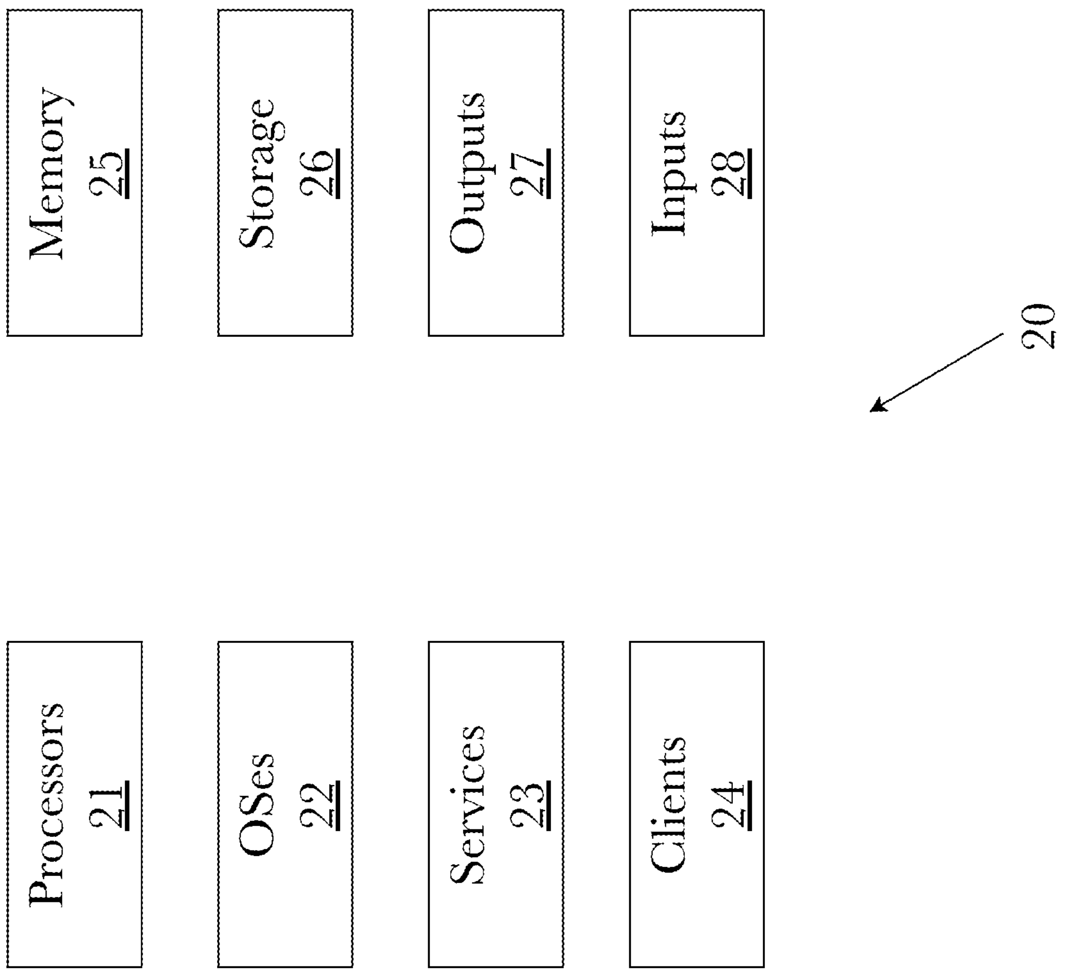
FIG. 33 is a block diagram illustrating an exemplary logical architecture for a client device.

In some aspects, systems may be implemented on a standalone computing system. Referring now to FIG. 33, there is shown a block diagram depicting a typical exemplary architecture of one or more aspects or components thereof on a standalone computing system. Computing device 20 includes processors 21 that may run software that carry out one or more functions or applications of aspects, such as for example a client application 24. Processors 21 may carry out computing instructions under control of an operating system 22 such as, for example, a version of MICROSOFT WINDOWS™ operating system, APPLE macOS™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touch-pad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 32). Examples of storage devices 26 include flash memory, magnetic hard drive, CD-ROM, and/or the like.

Figure 34:
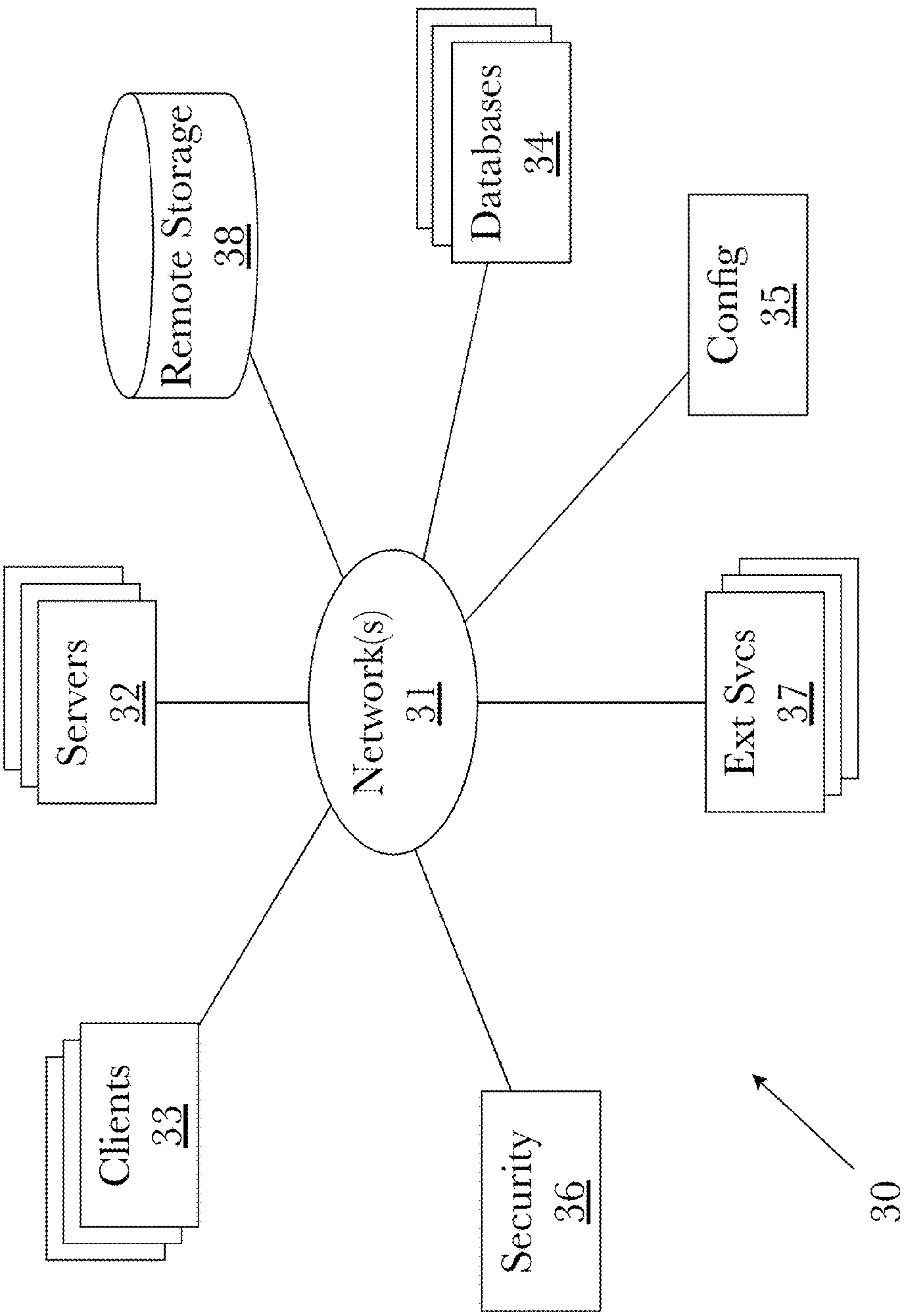
FIG. 34 is a block diagram showing an exemplary architectural arrangement of clients, servers, and external services.

In some aspects, systems may be implemented on a distributed computing network, such as one having any number of clients and/or servers. Referring now to FIG. 34, there is shown a block diagram depicting an exemplary architecture 30 for implementing at least a portion of a system according to one aspect on a distributed computing network. According to the aspect, any number of clients 33 may be provided. Each client 33 may run software for implementing client-side portions of a system; clients may comprise a system 20 such as that illustrated in FIG. 33. In addition, any number of servers 32 may be provided for handling requests received from one or more clients 33. Clients 33 and servers 32 may communicate with one another via one or more electronic networks 31, which may be in various aspects any of the Internet, a wide area network, a mobile telephony network (such as CDMA or GSM cellular networks), a wireless network (such as Wi-Fi, WiMAX, LTE, and so forth), or a local area network (or indeed any network topology known in the art; the aspect does not prefer any one network topology over any other). Networks 31 may be implemented using any known network protocols, including for example wired and/or wireless protocols.

In addition, in some aspects, servers 32 may call external services 37 when needed to obtain additional information, or to refer to additional data concerning a particular call. Communications with external services 37 may take place, for example, via one or more networks 31. In various aspects, external services 37 may comprise web-enabled services or functionality related to or installed on the hardware device itself. For example, in one aspect where client applications 24 are implemented on a smartphone or other electronic device, client applications 24 may obtain information stored in a server system 32 in the cloud or on an external service 37 deployed on one or more of a particular enterprise's or user's premises.

In some aspects, clients 33 or servers 32 (or both) may make use of one or more specialized services or appliances that may be deployed locally or remotely across one or more networks 31. For example, one or more databases 34 may be used or referred to by one or more aspects. It should be understood by one having ordinary skill in the art that databases 34 may be arranged in a wide variety of architectures and using a wide variety of data access and manipulation means. For example, in various aspects one or more databases 34 may comprise a relational database system using a structured query language (SQL), while others may comprise an alternative data storage technology such as those referred to in the art as "NoSQL" (for example, HADOOP CASSANDRA™, GOOGLE BIGTABLE™, and so forth). In some aspects, variant database architectures such as column-oriented databases, in-memory databases, clustered databases, distributed databases, or even flat file data repositories may be used according to the aspect. It will be appreciated by one having ordinary skill in the art that any combination of known or future database technologies may be used as appropriate, unless a specific database technology or a specific arrangement of components is specified for a particular aspect described herein. Moreover, it should be appreciated that the term "database" as used herein may refer to a physical database machine, a cluster of machines acting as a single database system, or a logical database within an overall database management system. Unless a specific meaning is specified for a given use of the term "database", it should be construed to mean any of these senses of the word, all of which are understood as a plain meaning of the term "database" by those having ordinary skill in the art.

Similarly, some aspects may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with aspects without limitation, unless a specific security 36 or configuration system 35 or approach is specifically required by the description of any specific aspect.

Figure 35:
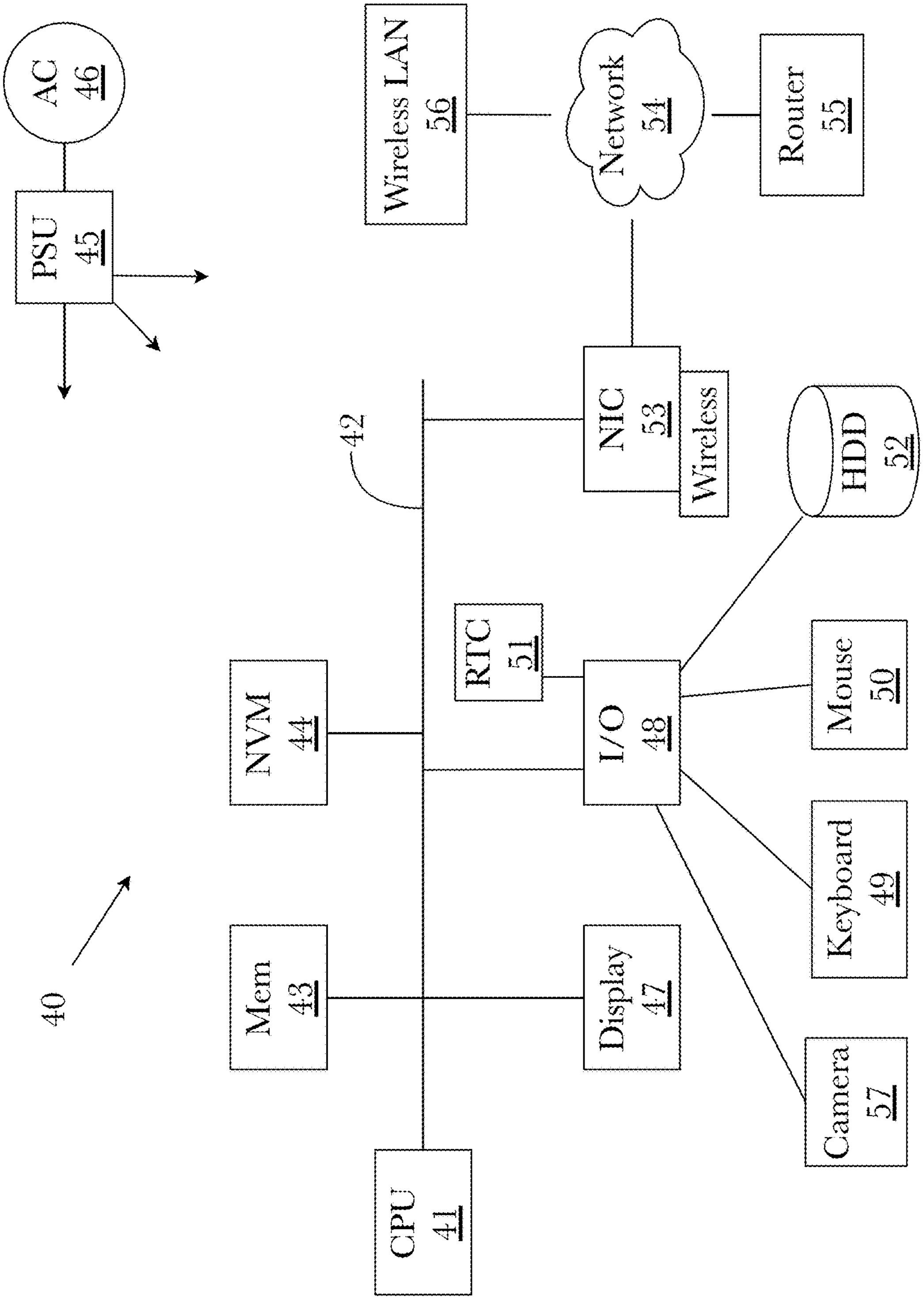
FIG. 35 is another block diagram illustrating an exemplary hardware architecture of a computing device.

FIG. 35 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various aspects, functionality for implementing systems or methods of various aspects may be distributed among any number of client and/or server components. For example, various software modules may be implemented for performing various functions in connection with the system of any particular aspect, and such modules may be variously implemented to run on server and/or client components.

The skilled person will be aware of a range of possible modifications of the various aspects described above. Accordingly, the present invention is defined by the claims and their equivalents.

What is claimed is:

1. A computer system comprising:

a hardware memory, wherein the computer system is configured to execute software instructions stored on nontransitory machine-readable storage media that:

receive input data from various sources including external data sources such as sensors, databases, or file systems;

transform the input data into a dyadic distribution using a transformation matrix;

dynamically select and apply processing techniques based on real-time performance metrics and detected anomalies;

compress transformed data using entropy encoding;

monitor the input data for anomalies using multi-layer neural network classification that identifies patterns indicative of data corruption, drift, or intrusion;

apply corrective measures when anomalies are detected using self-healing automated remediation system, including adjusting the transformation matrix, wherein the corrective measures include creating checkpoints before applying corrections to enable rollback if self-healing procedures fail;

monitor effectiveness of applied techniques through a feedback loop;

update a knowledge base with performance data and anomaly patterns;

enable continuous learning for improving anomaly detection;

create new codewords for processed data comprising a reference code to a sourceblock and a location of that sourceblock within the processed data;

package processed data with metadata describing the applied techniques;

implement security measures to protect the processed data, wherein the security measures include providing cryptographically secure random numbers for use in data transformation and implementing protections against side-channel attacks; and transmit the packaged data to a recipient system to host for decoding and interpretation of the data.

2. The computer system of claim 1, wherein the multi-layer neural network classification employs long short-term memory (LSTM) networks for temporal pattern recognition and convolutional neural networks (CNNs) for spatial pattern analysis.

3. The computer system of claim 1, wherein the system monitors the input data by calculating statistical measures including mean, variance, entropy, and higher-order statistics to establish baseline patterns and detect deviations.

4. The system of claim 1, wherein the system prioritizes detected anomalies based on severity scores, business impact, and available remediation resources before applying corrective measures.

5. A method for adaptive data processing, comprising the steps of:

receive input data from various sources including external data sources such as sensors, databases, or file systems;

transform the input data into a dyadic distribution using a transformation matrix; dynamically select and apply processing techniques based on real-time performance metrics and detected anomalies;

compress transformed data using entropy encoding;

monitor the input data for anomalies using multi-layer neural network classification that identifies patterns indicative of data corruption, drift, or intrusion;

apply corrective measures when anomalies are detected using self-healing automated remediation system, including adjusting the transformation matrix, wherein the corrective measures include creating checkpoints before applying corrections to enable rollback if self-healing procedures fail;

monitor effectiveness of applied techniques through a feedback loop;

update a knowledge base with performance data and anomaly patterns;

enable continuous learning for improving anomaly detection;

create new codewords for processed data comprising a reference code to a sourceblock and a location of that sourceblock within the processed data;

package processed data with metadata describing the applied techniques;

implement security measures to protect the processed data, wherein the security measures include providing cryptographically secure random numbers for use in data transformation and implementing protections against side-channel attacks; and transmit the packaged data to a recipient system to host for decoding and interpretation of the data.

6. The method of claim 5, wherein the multi-layer neural network classification employs long short-term memory (LSTM) networks for temporal pattern recognition and convolutional neural networks (CNNs) for spatial pattern analysis.

7. The method of claim 5, wherein the system monitors the input data by calculating statistical measures including mean, variance, entropy, and higher-order statistics to establish baseline patterns and detect deviations.

8. The method of claim 5, wherein the system prioritizes detected anomalies based on severity scores, business impact, and available remediation resources before applying corrective measures.

* * * * *